United States Patent
Banin et al.

(10) Patent No.: US 10,160,648 B2
(45) Date of Patent: Dec. 25, 2018

(54) COLLOIDAL SEMICONDUCTOR METAL CHALCOGENIDE NANOSTRUCTURES

(71) Applicants: YISSUM RESEARCH DEVELOPMENT COMPANY OF THE HEBREW UNIVERSITY OF JERUSALEM LTD., Jerusalem (IL); QLIGHT NANOTECH LTD, Jerusalem (IL)

(72) Inventors: Uri Banin, Mevasseret Zion (IL); Guohua Jia, Jerusalem (IL)

(73) Assignees: YISSUM RESEARCH DEVELOPMENT COMPANY OF THE HEBREW UNIVERSITY OF JERUSALEM LTD., Jerusalem (IL); QLIGHT NANOTECH LTD., Jerusalem (IL)

( * ) Notice: Subject to any disclaimer, the term of this patent is extended or adjusted under 35 U.S.C. 154(b) by 301 days.

(21) Appl. No.: 14/898,564

(22) PCT Filed: Jul. 1, 2014

(86) PCT No.: PCT/IL2014/050591
§ 371 (c)(1),
(2) Date: Dec. 15, 2015

(87) PCT Pub. No.: WO2015/001557
PCT Pub. Date: Jan. 8, 2015

(65) Prior Publication Data
US 2016/0115027 A1    Apr. 28, 2016

Related U.S. Application Data

(60) Provisional application No. 61/841,628, filed on Jul. 1, 2013, provisional application No. 61/921,663, filed on Dec. 30, 2013.

(51) Int. Cl.
*C01B 19/00* (2006.01)
*B82Y 10/00* (2011.01)
(Continued)

(52) U.S. Cl.
CPC ............ *C01B 19/007* (2013.01); *B82Y 10/00* (2013.01); *B82Y 30/00* (2013.01); *B82Y 40/00* (2013.01);
(Continued)

(58) Field of Classification Search
CPC ..... C01B 19/007; C01G 9/08; H01L 29/0669; H01L 29/22; H01L 33/18; B82Y 40/00;
(Continued)

(56) References Cited

FOREIGN PATENT DOCUMENTS

| JP | 2010-144032 A | 7/2010 |
|---|---|---|
| WO | 2013/052541 A2 | 4/2013 |

OTHER PUBLICATIONS

Carbone, et al. "Synthesis and micrometer-scale assembly of colloidal CdSe/CdS nanorods prepared by a seeded growth approach"., Nano Letters, vol. 7, No. 10, pp. 2942-2950 (2007).
(Continued)

*Primary Examiner* — Richard M Rump
(74) *Attorney, Agent, or Firm* — Oliff PLC

(57) ABSTRACT

This invention generally relates to metal chalcogenide nanostructures, methods for their preparation and methods of use. A method is disclosed that transforms zinc chalcogenide nanowires into nanorods or quadrilateral nanostructures in an anneal step. Particular embodiments comprise ZnO nanostructures.

15 Claims, 24 Drawing Sheets

(51) Int. Cl.
    *B82Y 30/00*    (2011.01)
    *B82Y 40/00*    (2011.01)
    *H01L 29/06*    (2006.01)
    *H01L 29/22*    (2006.01)
    *C01G 9/08*     (2006.01)
    *H01L 33/18*    (2010.01)

(52) U.S. Cl.
    CPC ............ *C01G 9/08* (2013.01); *H01L 29/0669* (2013.01); *H01L 29/22* (2013.01); *C01P 2004/16* (2013.01); *H01L 33/18* (2013.01); *Y10S 977/762* (2013.01)

(58) Field of Classification Search
    CPC ..... B82Y 30/00; B82Y 10/00; Y10S 977/762; C01P 2004/16
    See application file for complete search history.

(56) References Cited

OTHER PUBLICATIONS

Talapin, et al. "Seeded growth of highly luminescent CdSe/CdS nano-heterostructures with rod and tetrapod morphologies"., Nano Letters, vol. 7, pp. 2951-2959 (2007).

Sitt, et al. "Highly emissive nano rod-in-rod heterostructures with strong linear polarization"., Nano Letters, vol. 11, pp. 2054-2060 (2011).

Li, et al. "High quality ZnSe and ZnS nanocrystals formed by activating zinc carboxylate precursors"., Nano Letters, vol. 4, No. 11, pp. 2261-2264 (2004).

Li, et al. "Ligand-controlling synthesis and ordered assembly of ZnS nanorods and nanodots"., J. Phys. Chem. B, vol. 108, pp. 16002-16011 (2004).

Cozzoli, et al. "Shape and phase control of colloidal ZnSe nanocrystals"., Chem. Mater., vol. 17, pp. 1296-1306 (2005).

Yao, et al. "Chemical synthesis, structural characterization, optical properties, and photocatalytic activity of ultrathin ZnSe nanorods"., Chem. Eur. J., vol. 17, pp. 8663-8670 (2011).

Jiang, et al. "Ligand-tuned shape control, oriented assembly, and electrochemical characterization of colloidal ZnTe nanocrystals"., Chem. Mater., vol. 22, pp. 4632-4641 (2010).

Fanfair, D. D., Korgel, B. A. "ZnE (E=S, Se, Te) nanowires grown by the solution-liquid-solid mechanism: importance of reactant decomposition kinetics and the solvent"., Cryst. Growth Des., vol. 8, pp. 3246-3252 (2008).

Pradhan, N., & Efrima, S. "Supercrystals of uniform nanorods and nanowires, and the nanorod-to-nanowire oriented transition"., J. Phys. Chem. B., vol. 108, pp. 11964-11970 (2004).

Acharya, S., Efrima, S. "Two-dimensional pressure-driven nanorod-to-nanowire reactions in langmuir monolayers at room temperature"., J. Am. Chem. Soc., vol. 127, pp. 3486-3490 (2005).

Panda, A. B., Acharya, S., & Efrima, S. "Ultranarrow ZnSe nanorods and nanowires: structure, spectroscopy, and one-dimensional properties"., Adv. Mater., vol. 17, pp. 2471-2474 (2005).

Deng, et al. "High-quality manganese-doped zinc sulfide quantum rods with tunable dual-color and multiphoton emissions"., J. Am. Chem. Soc., vol. 133, pp. 5389-5396 (2011).

Zhang, J. Sun, K., Kumbhar, A., & Fang, J. Y. "Shape-control of ZnTe nanocrystal growth in organic solution"., J. Phys. Chem. C., vol. 112, pp. 5454-5458 (2008).

Zhang, Y. J., Xu, H. R., & Wang, Q. B. "Ultrathin single crystal ZnS nanowires"., Chem. Commu., vol. 46, pp. 8941-8943 (2010).

Chin, P. T. K.; Stouwdam, J. W.; & Janssen, R. A. J. "Highly luminescent ultranarrow Mn doped ZnSe nanowires, Nano Letters"., vol. 9, No. 2, pp. 745-750 (2009).

Deng, Z. Yan, H., & Liu, Y. "Controlled colloidal growth of ultrathin single-crystal ZnS nanowires with a magic-size diameter"., Angew. Chem. Int. Ed., vol. 49, pp. 8695-9698 (2010).

Zhu, G.; Zhang, S.; Xu, Z.; Ma, J.; & Shen, X. "Ultrathin ZnS single crystal nanowires: controlled synthesis and room-temperature ferromagnetism properties"., J. Am. Chem. Soc., vol. 133, pp. 15605-15612 (2011).

Hou et al. "ChemInform Abstract: Interfacial fabrication of single-crystalline ZnTe nanorods with high blue fluorescence"., J. Am. Chem. Soc., vol. 135, pp. 10618-10621 (2013).

Li et al. "Large-scale synthesis of nearly monodisperse CdSe/CdS core/shell nanocrystals using air-stable reagents via successive ion layer adsorption and reaction"., Am. Chem. Soc., vol. 125, pp. 12567-12575 (2003).

Acharya, S., Sarkar, S., & Pradhan, N. "Material diffusion and doping of Mn in wurtzite ZnSe nanorods"., J. Phys. Chem. C., vol. 117, pp. 6006-6012 (2013).

Huang et al. "Carbon-assisted fabrication of novel ATO structures"., Chemistry Letters., vol. 36, No. 3, pp. 448-449 (2007).

Peng, Z., & Peng, X. "Nearly monodisperse and shape-controlled CdSe nanocrystals via alternative routes: nuclear and growth"., J. Am. Chem. Soc., vol. 124, pp. 3343-3353 (2002).

Fang, X. et al. "ZnS nanostructures: synthesis to applications"., Progress in American Science, vol. 56, No. 2, pp. 175-287 (2011).

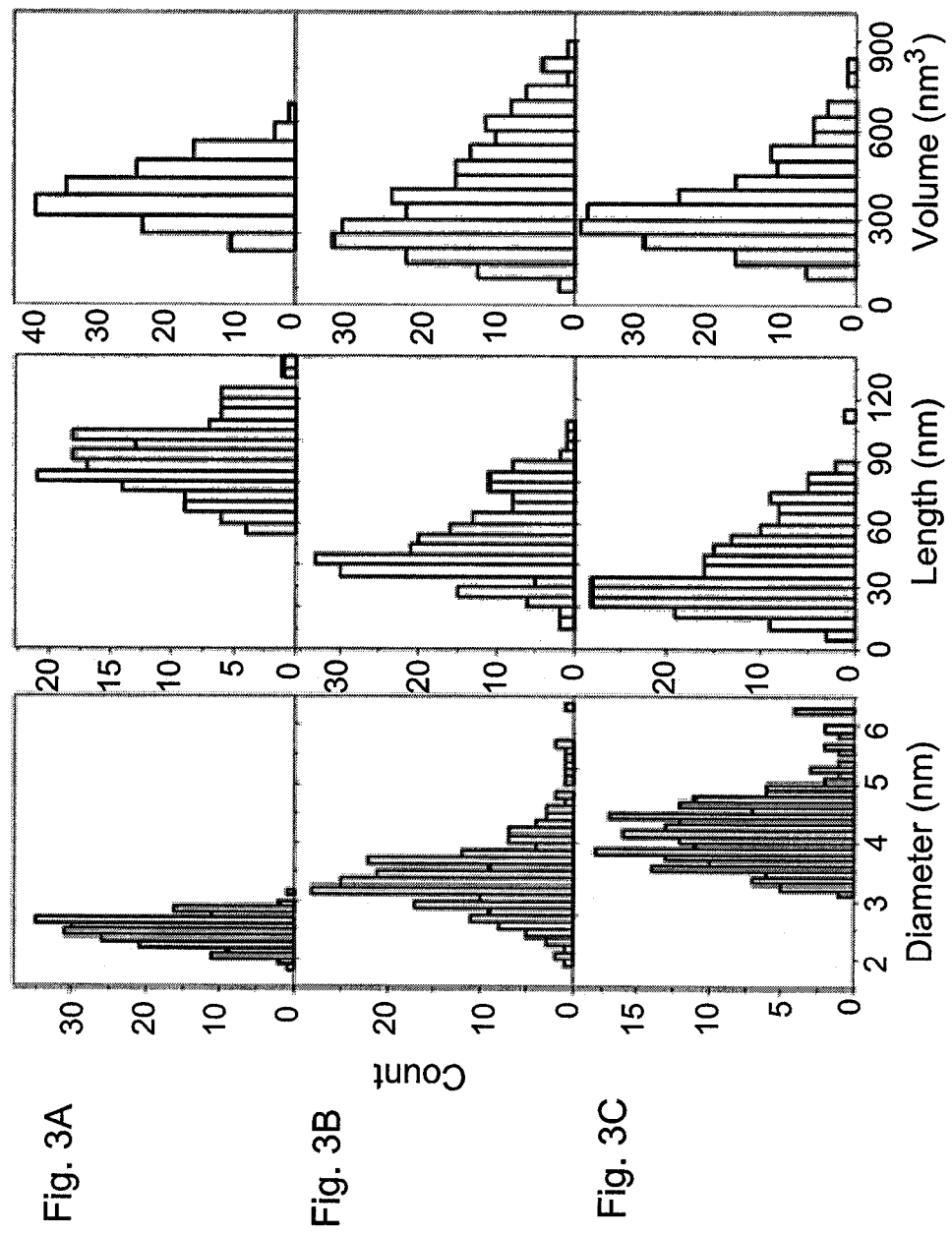

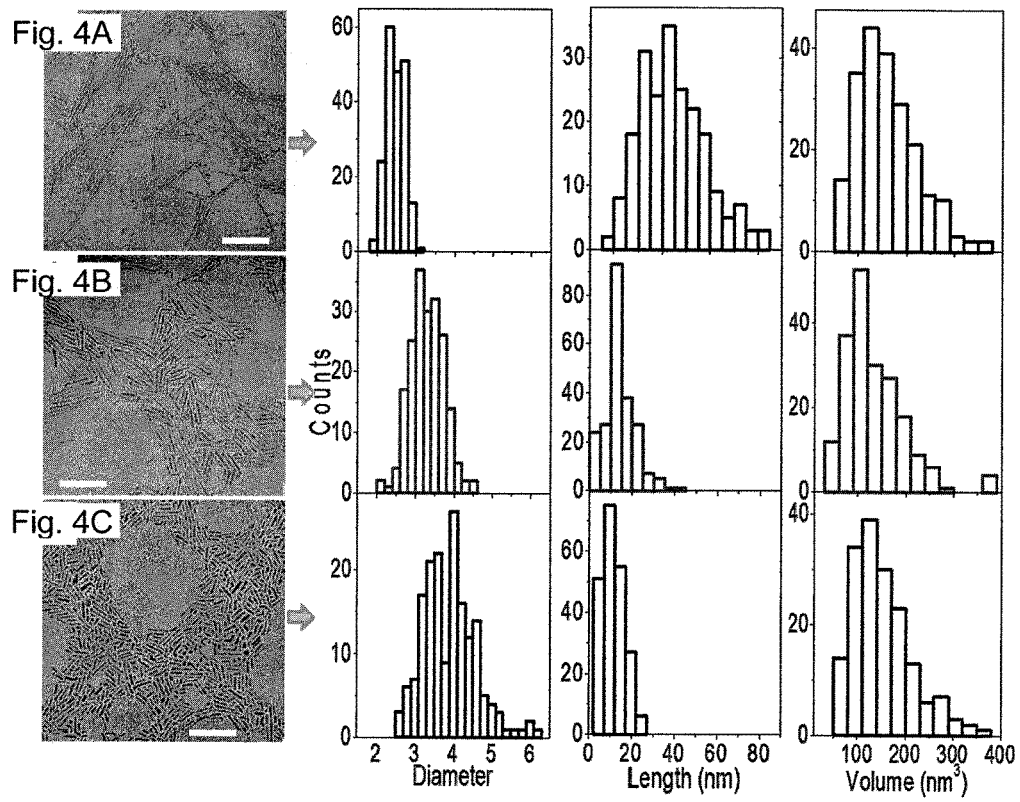
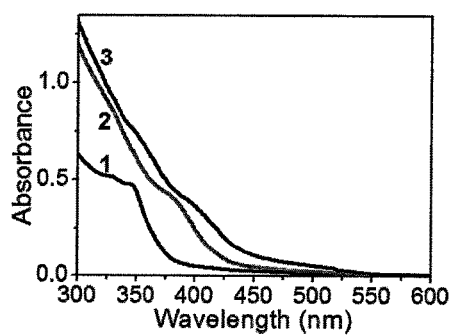
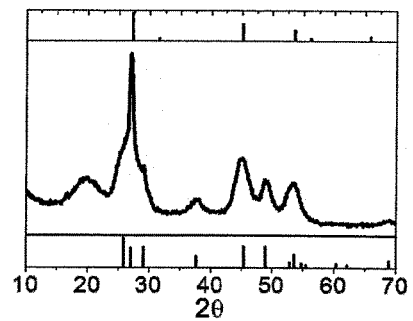
Fig. 4D
Fig. 4E

Fig. 7A
Fig. 7B
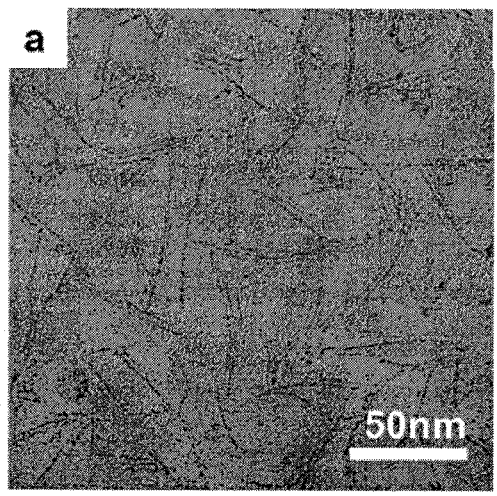
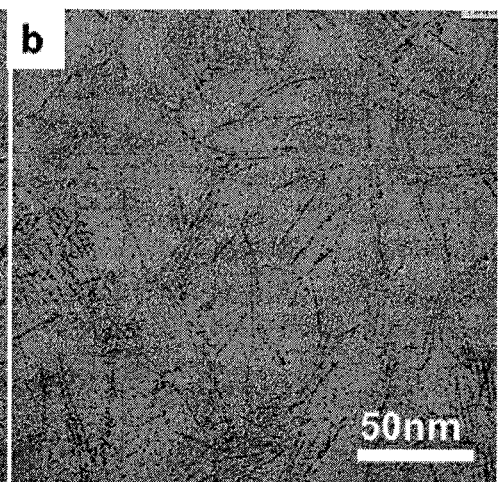
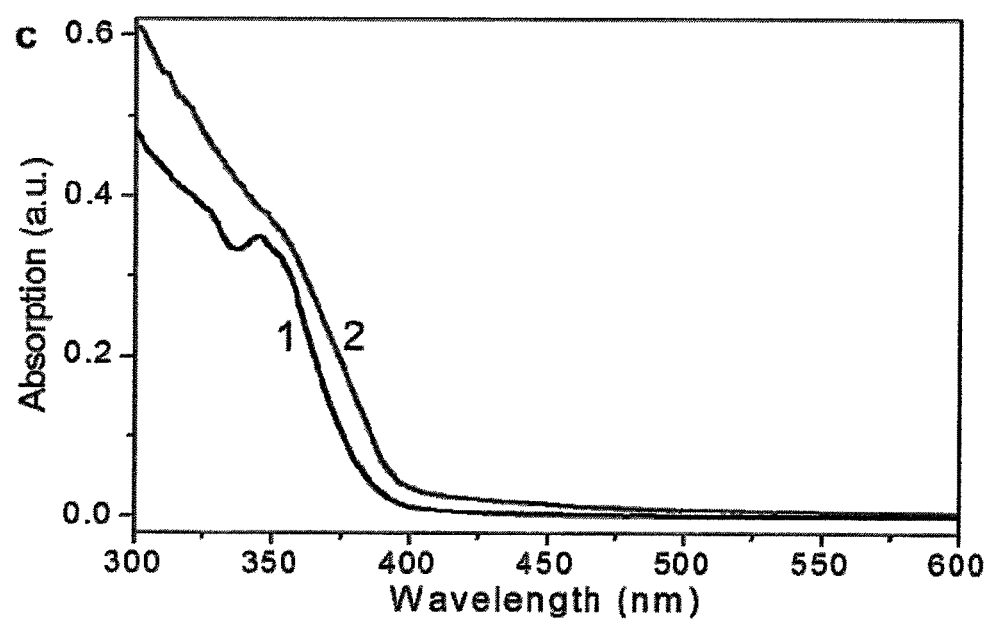
Fig. 7C

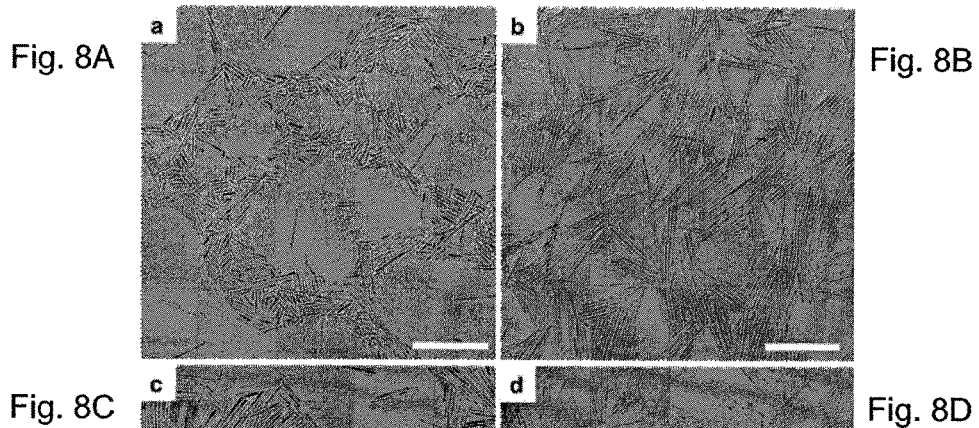
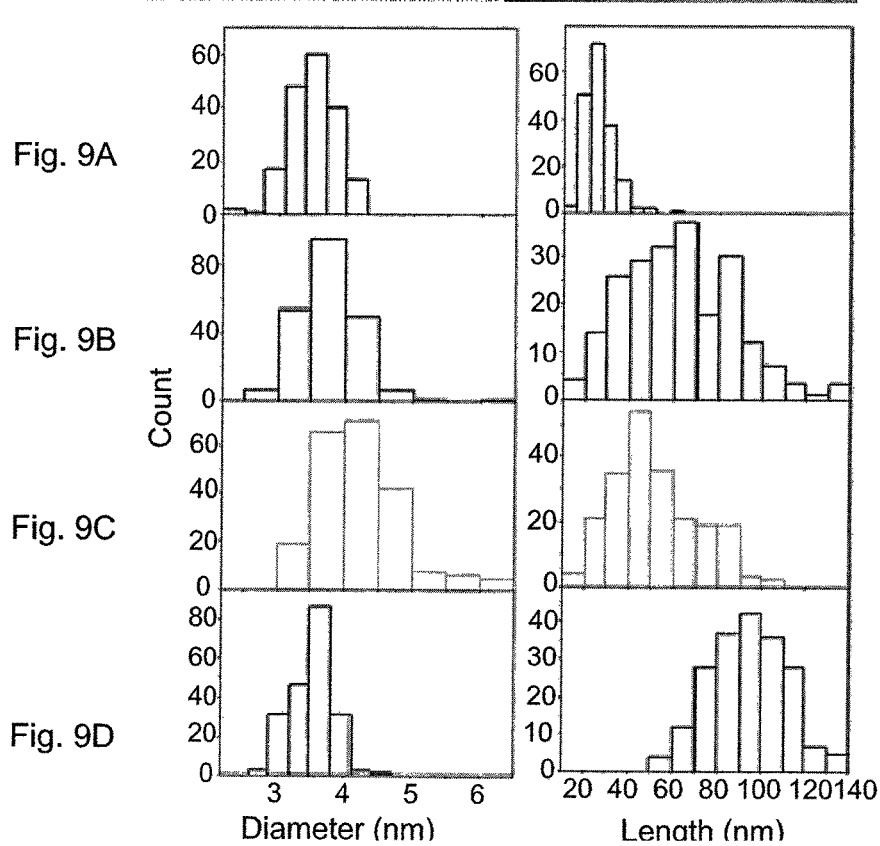

Fig. 10A
Fig. 10B
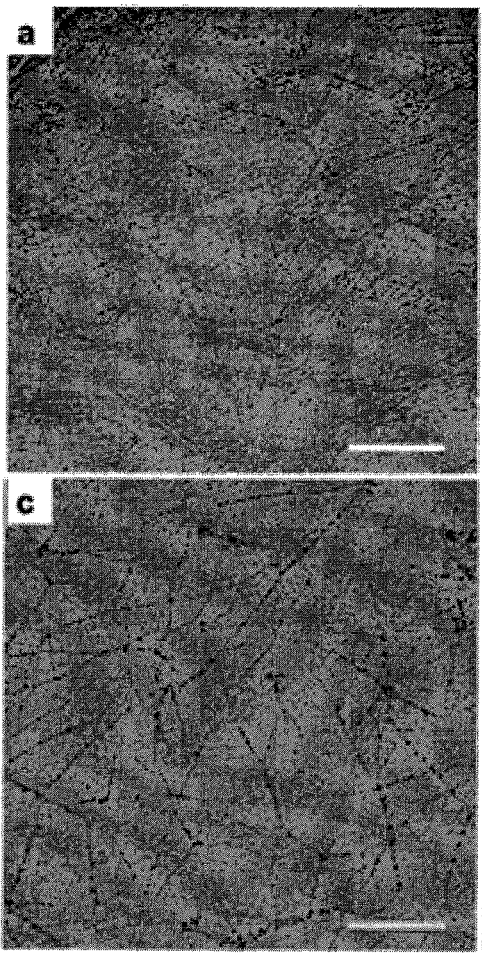
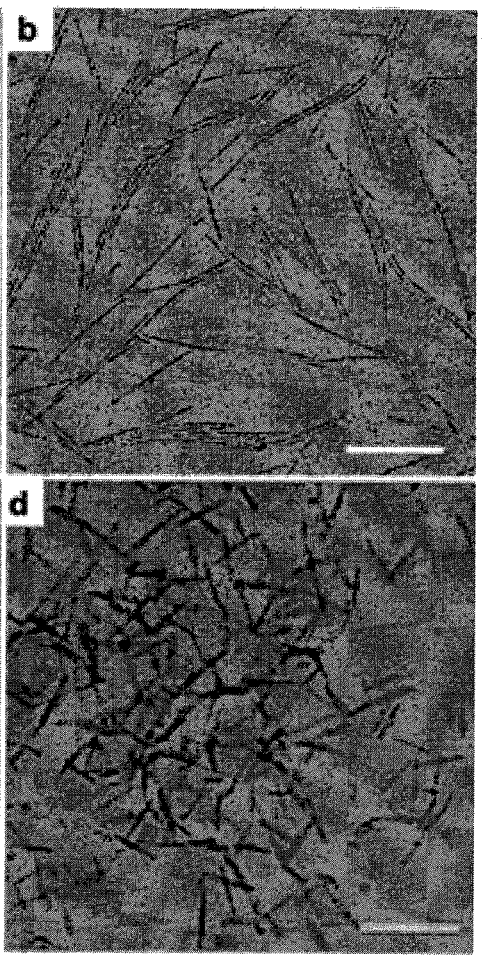
Fig. 10C
Fig. 10D
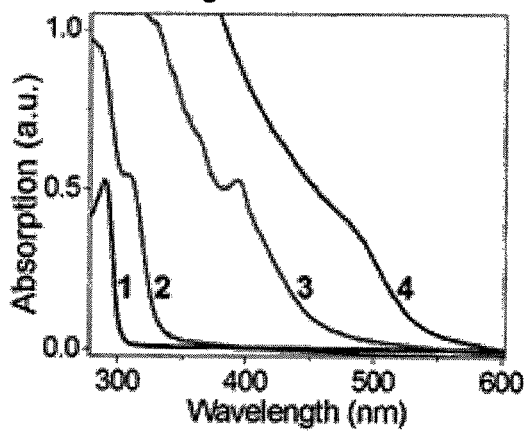
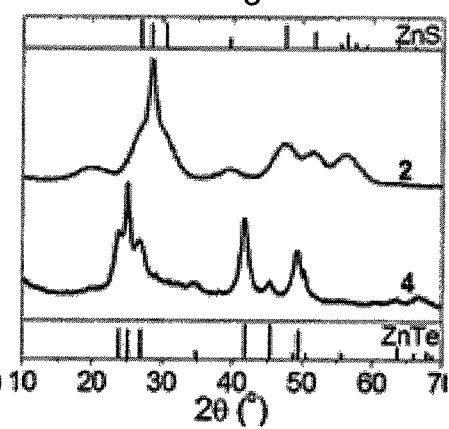
Fig. 10E
Fig. 10F

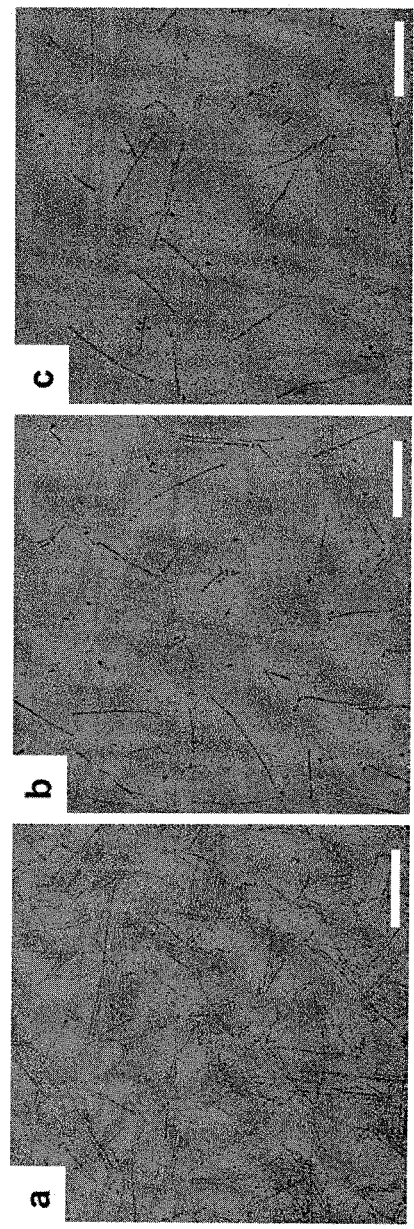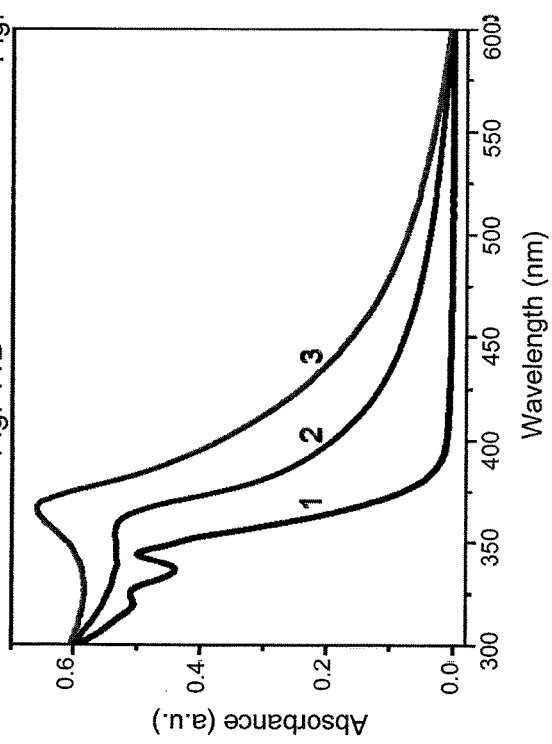
Fig. 11A  Fig. 11B  Fig. 11C  Fig. 11D

Fig. 12A
Fig. 12B
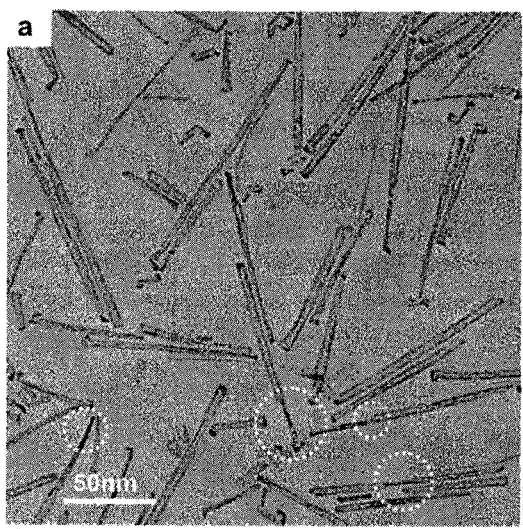
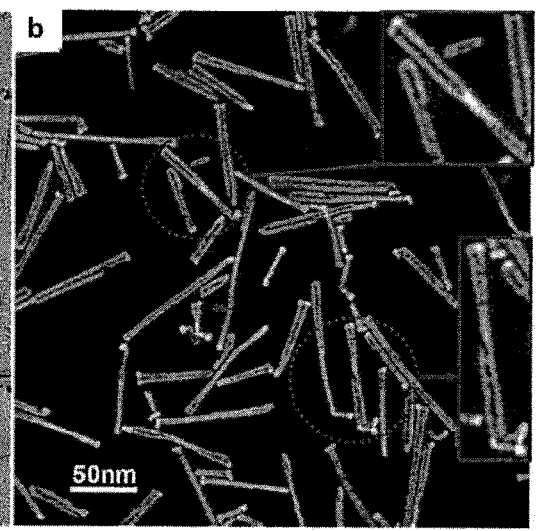
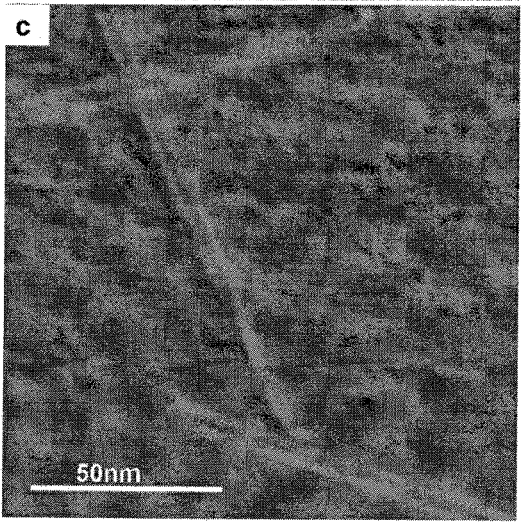
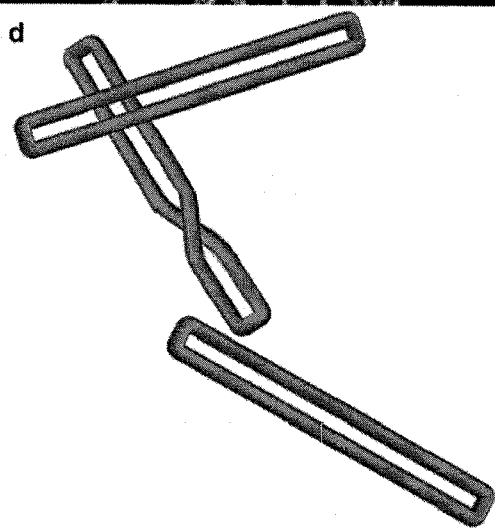
Fig. 12C
Fig. 12D

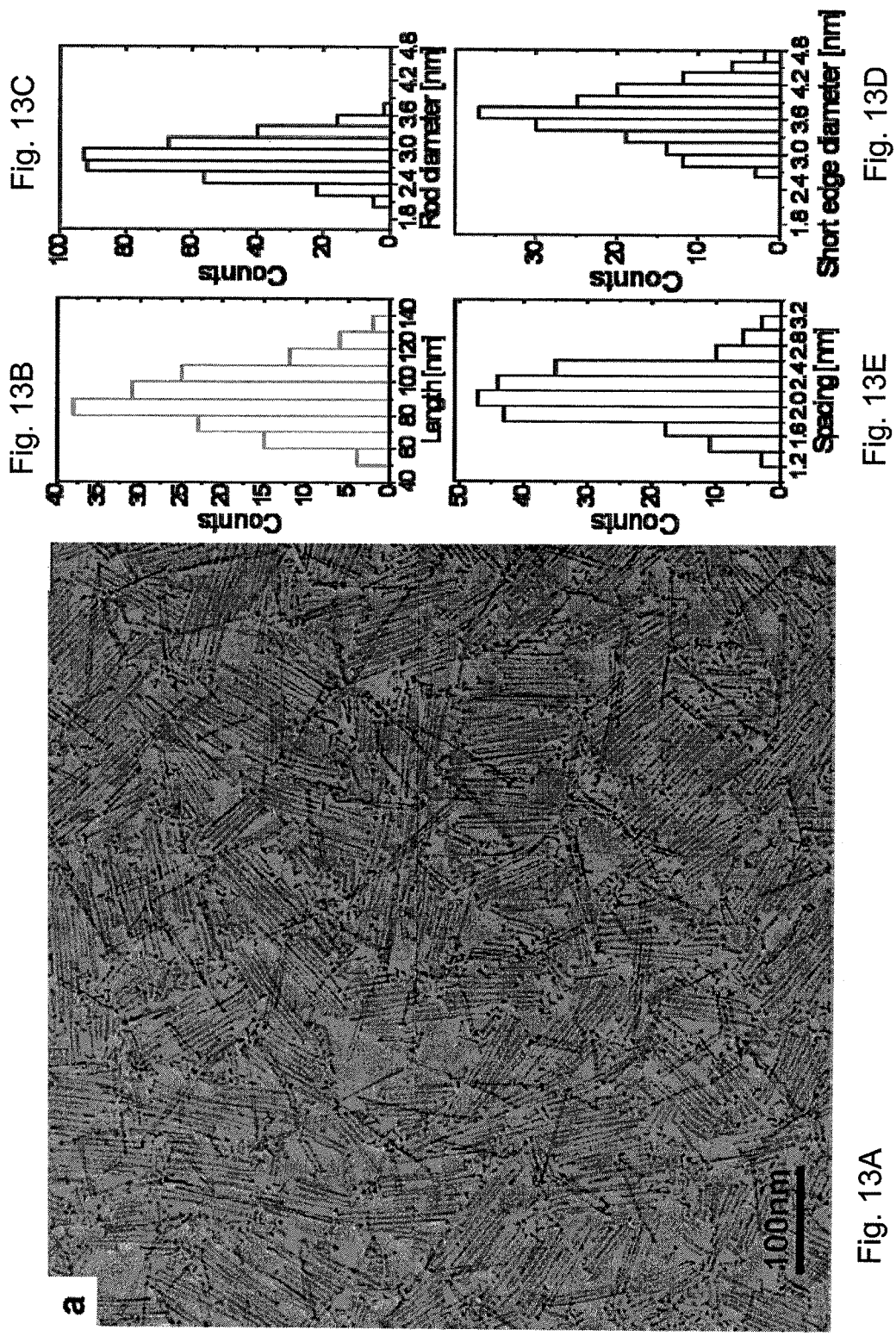

Fig. 15A
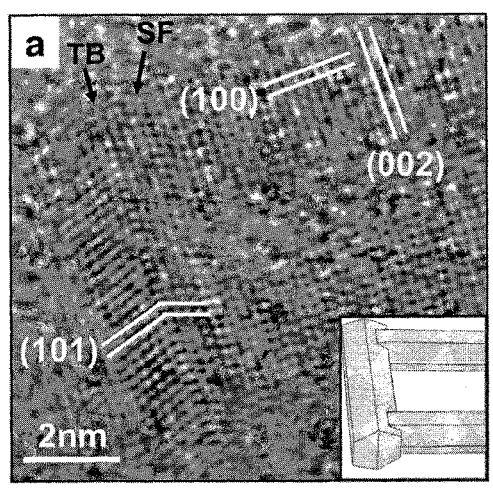
Fig. 15B
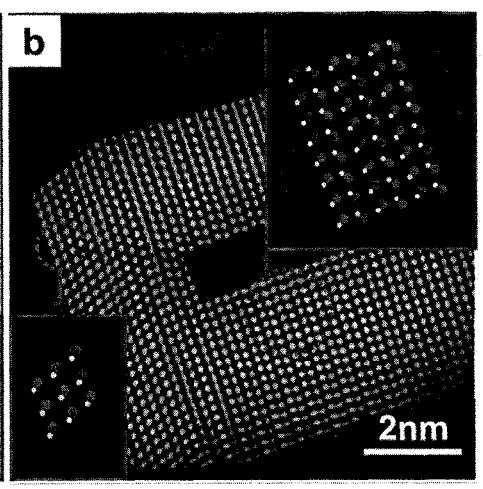
Fig. 15C
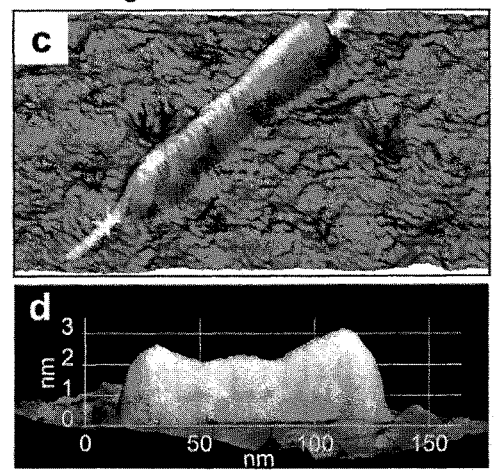
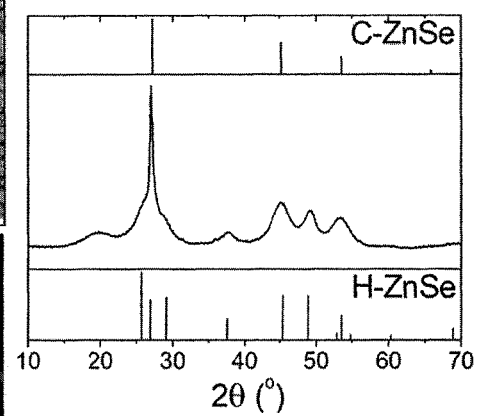
Fig. 15D
Fig. 15E

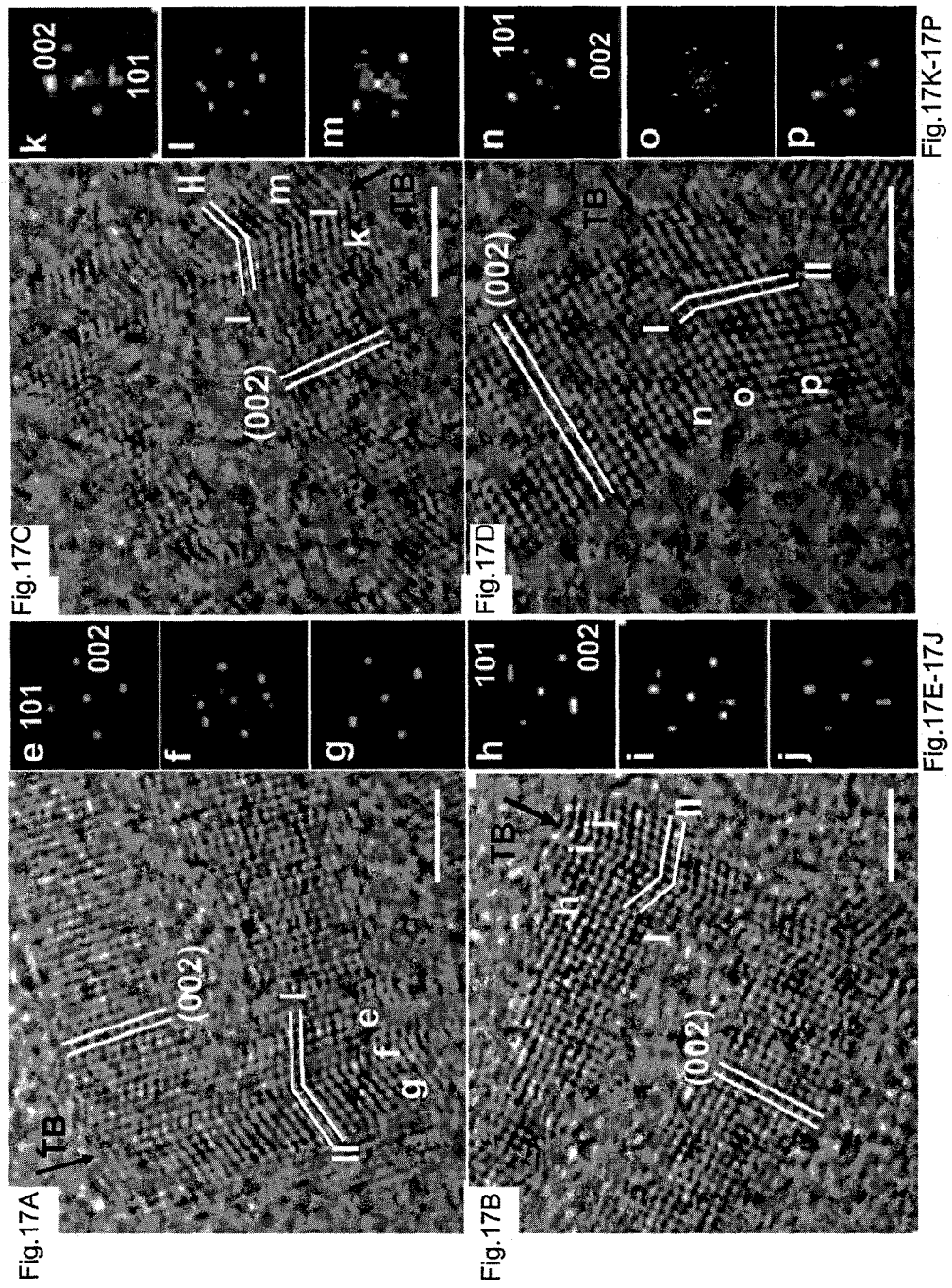

Fig. 19A
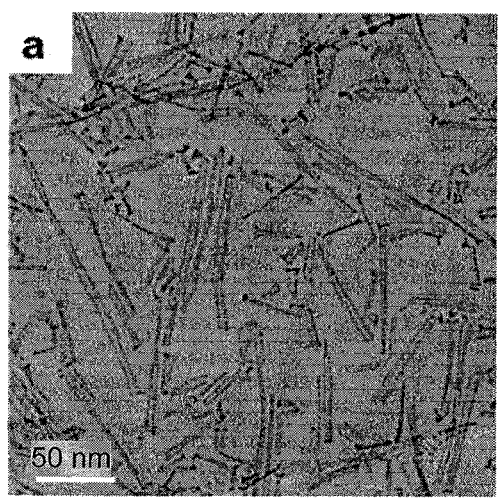
Fig. 19B
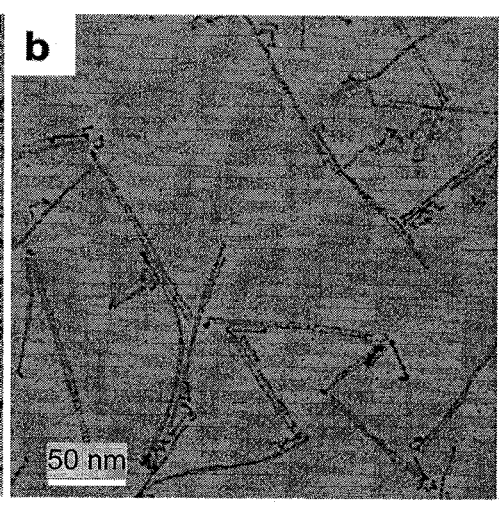
Fig. 20A
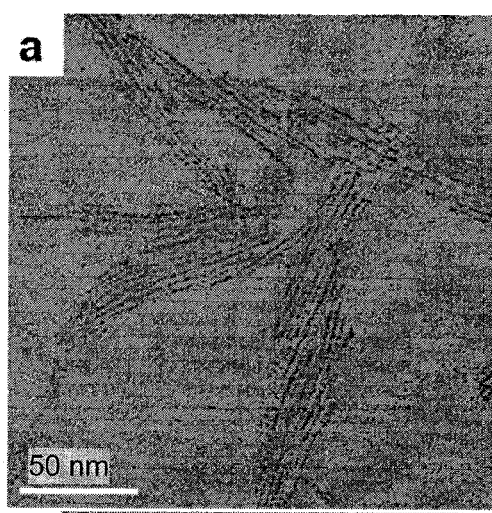
Fig. 20B
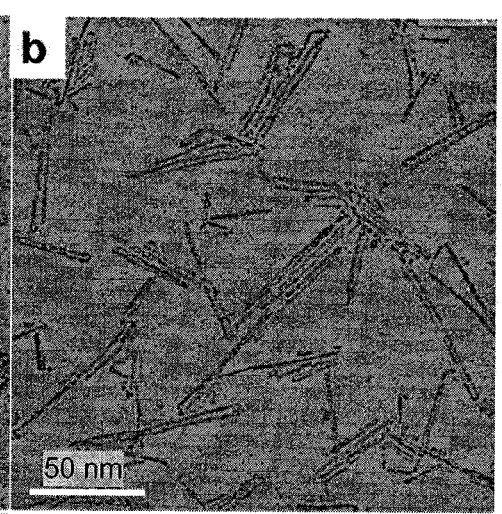
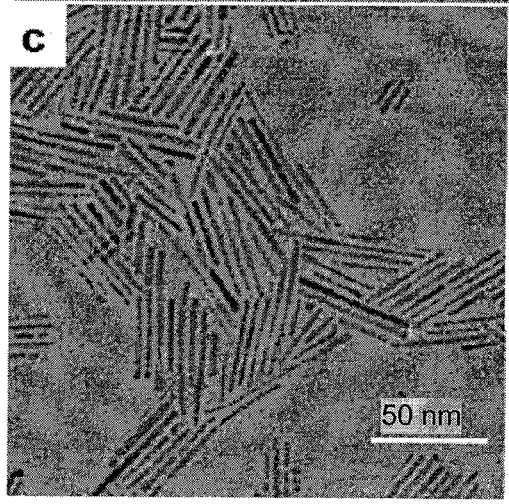
Fig. 20C
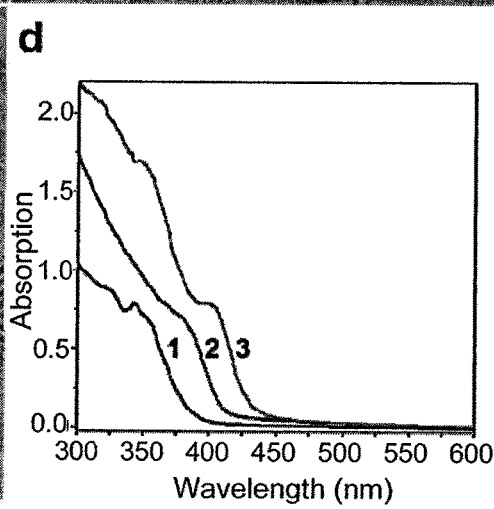
Fig. 20D

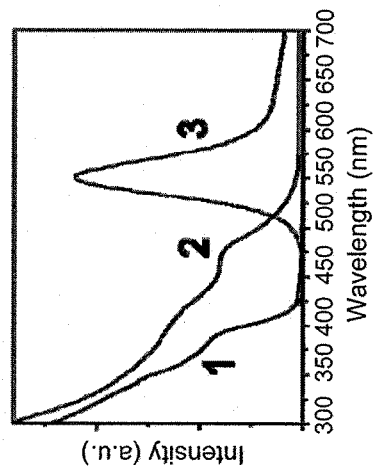
Fig. 23A
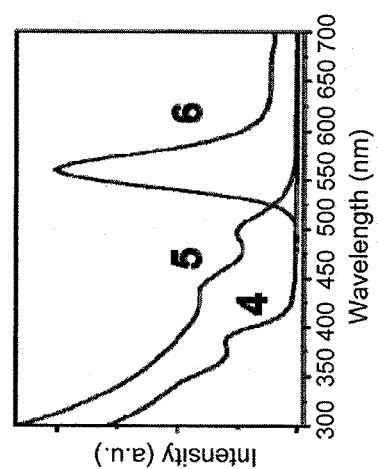
Fig. 23B
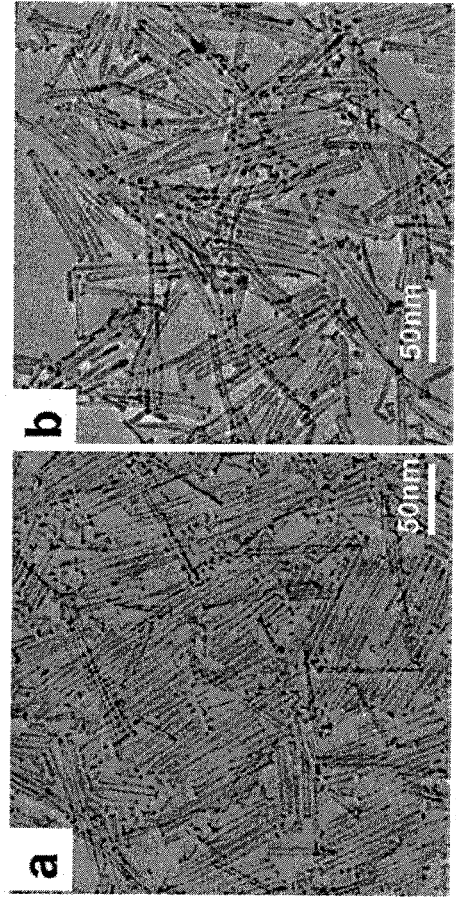
Fig. 23C
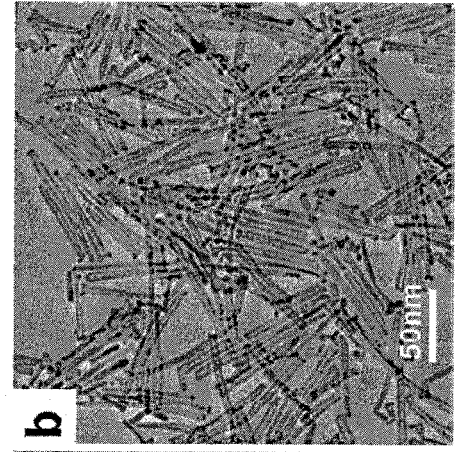
Fig. 23D
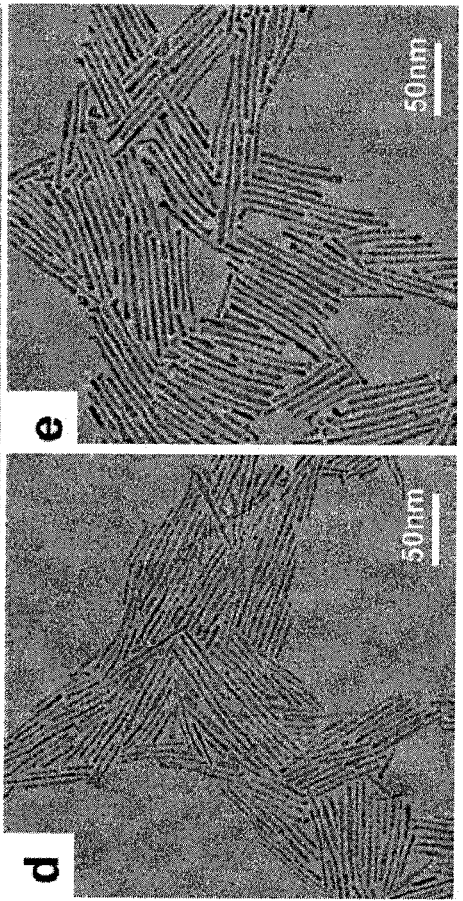
Fig. 23E
Fig. 23F

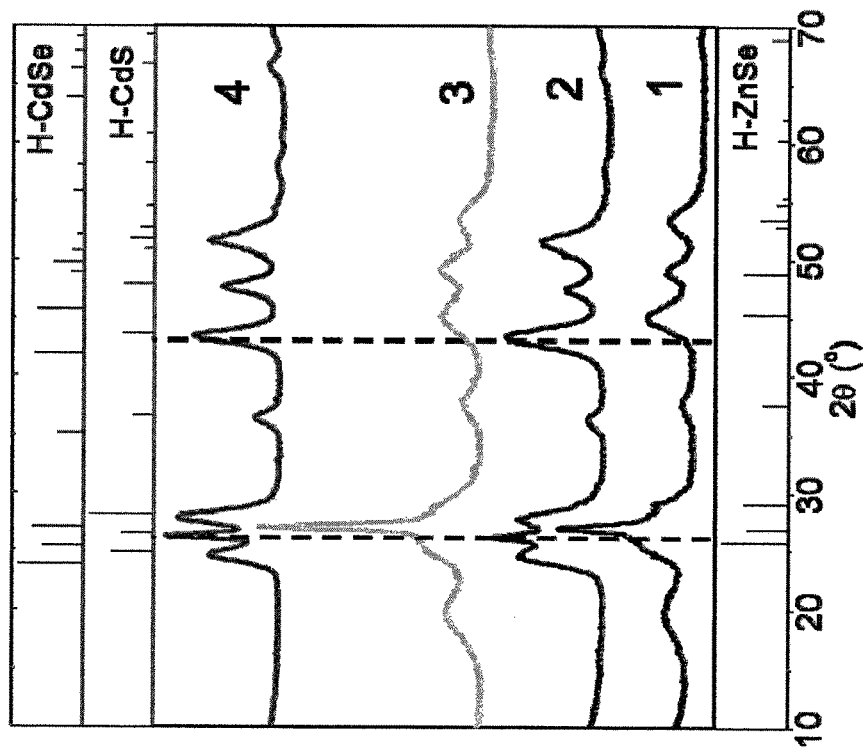
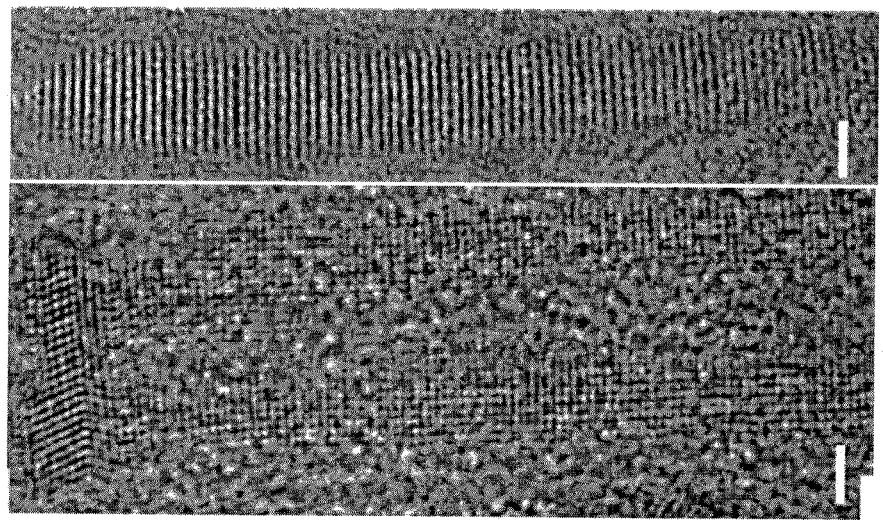

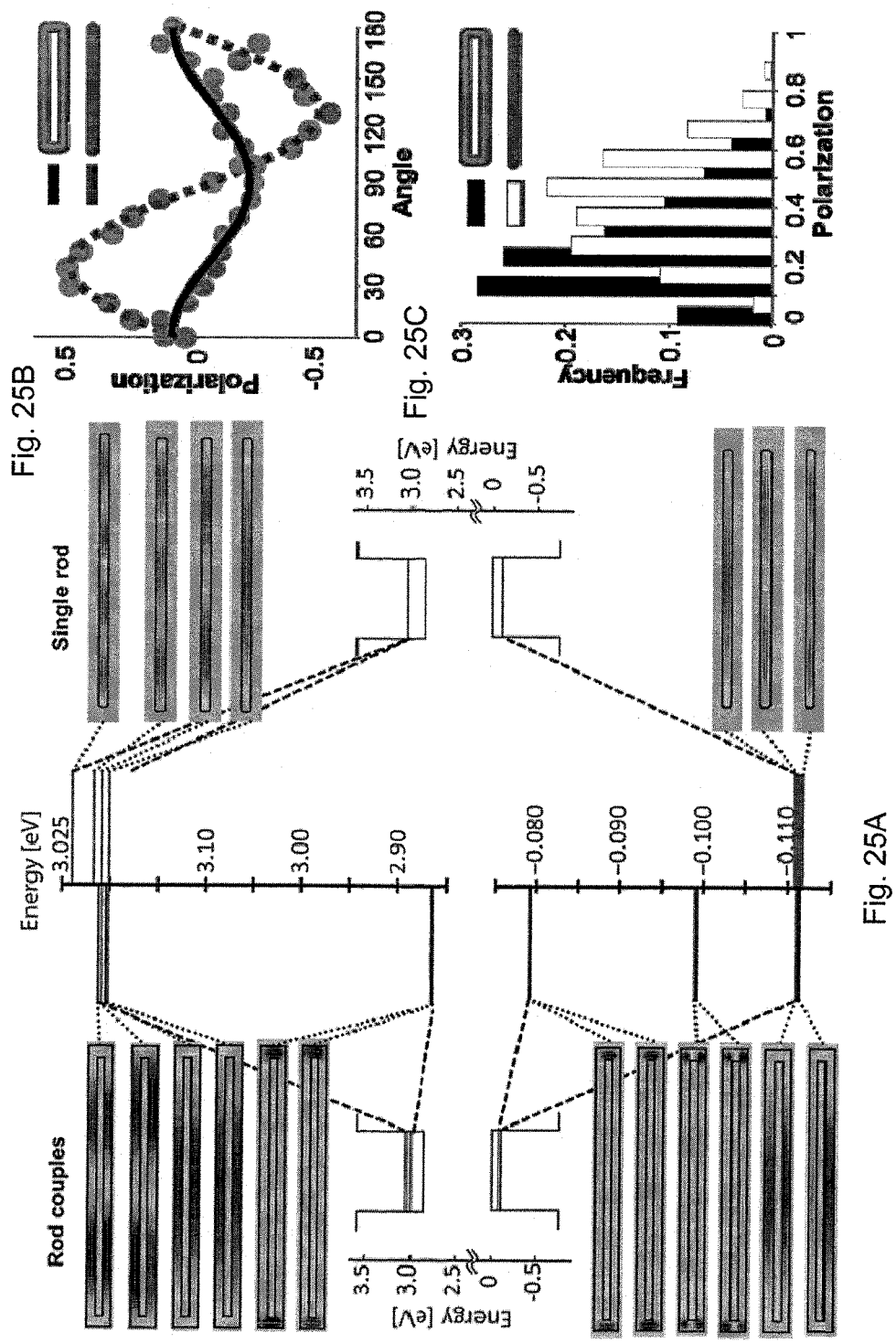

Fig. 27A
Fig. 27B
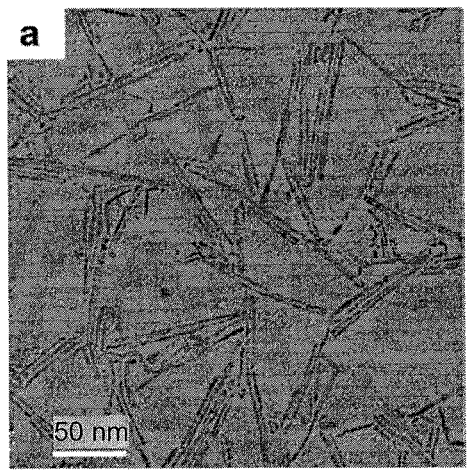
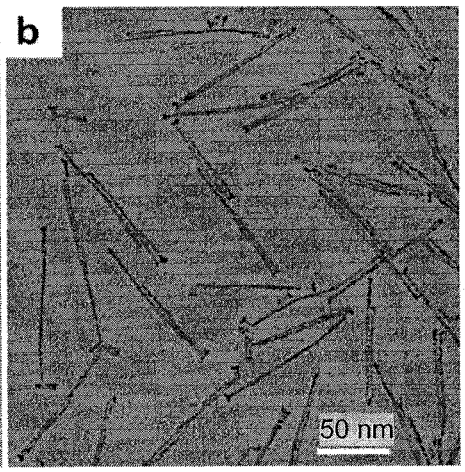
Fig. 28A
Fig. 28B
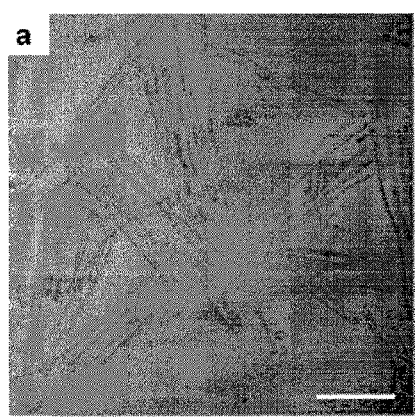
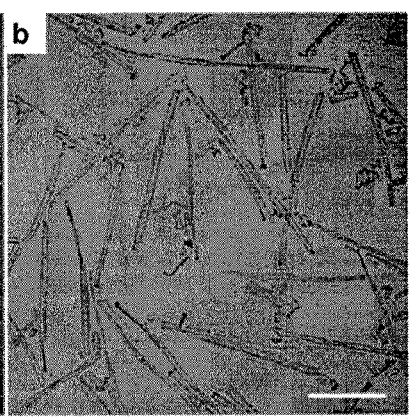
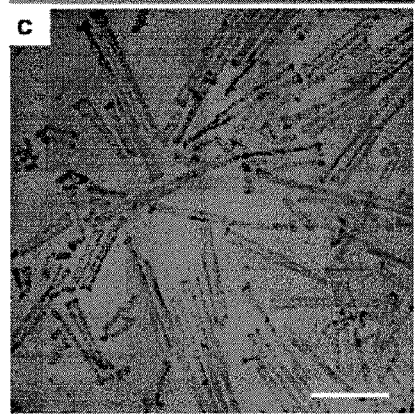
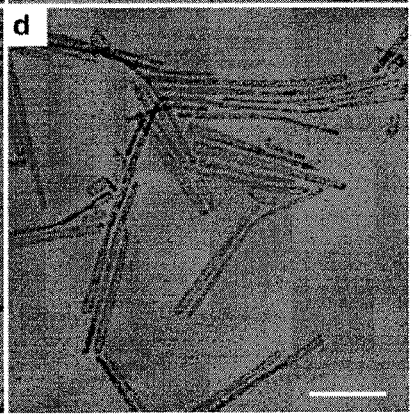
Fig. 28C
Fig. 28D

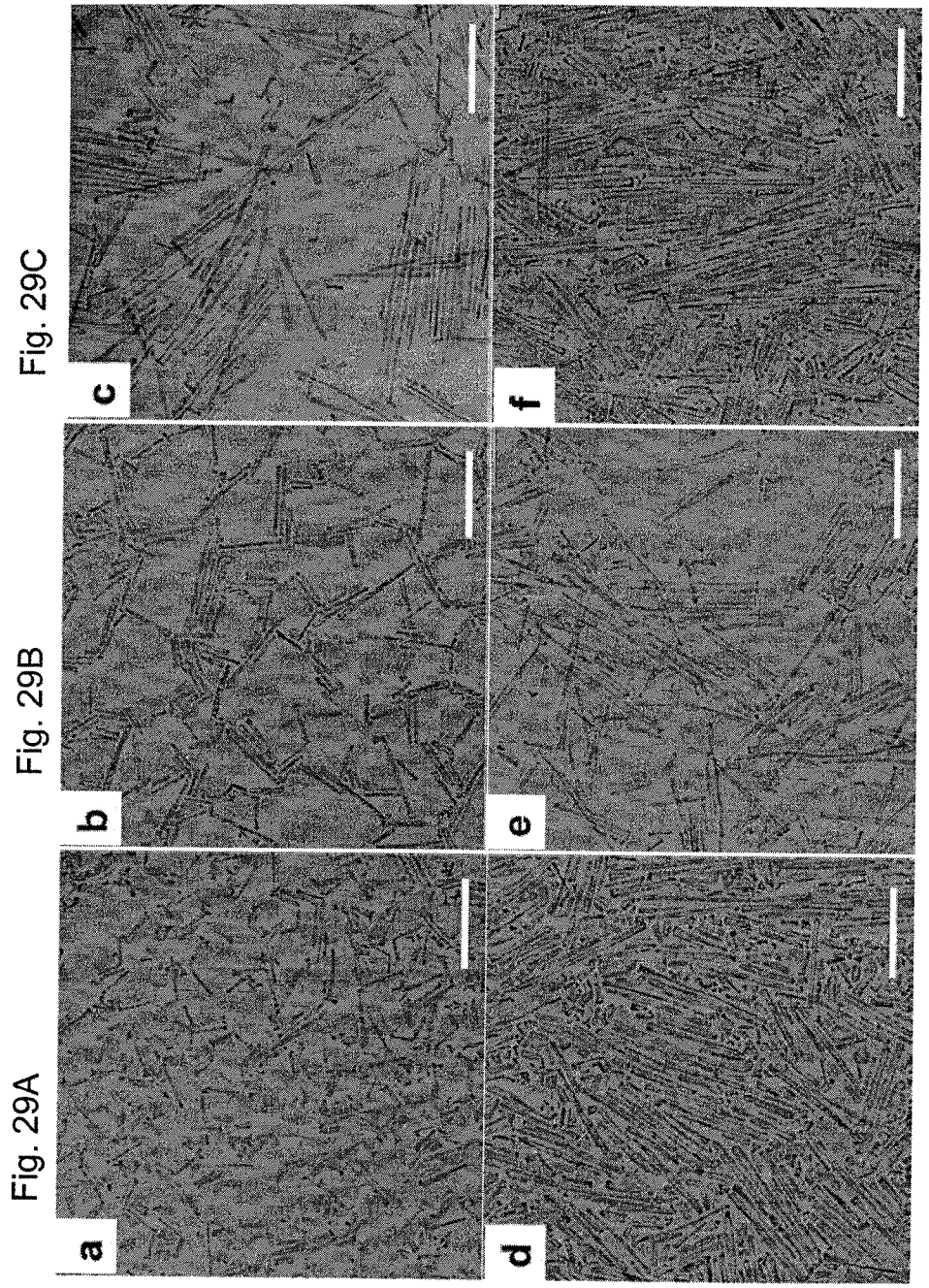

COLLOIDAL SEMICONDUCTOR METAL CHALCOGENIDE NANOSTRUCTURES

TECHNOLOGICAL FIELD

This invention generally relates to metal chalcogenide nanostructures, method for their preparation and methods of use.

BACKGROUND

Semiconductor nanorods are often considered as quasi-one-dimensional (1D) systems. They manifest linearly polarized emission, reduced lasing threshold and improved charge transport as compared with their counterpart spherical quantum dots. Present investigations of colloidal semiconductor nanorods are mainly based on the system of cadmium chalcogenides due to their facile synthetic accessibility.

However, it is still a challenge to fabricate quasi-1D zinc chalcogenide nanocrystals with controlled aspect ratios. Development of such nanocrystals are of high importance, as the availability of cadmium-free (or "green") zinc chalcogenide nanorods, produced through this strategy, provides a desirable platform for eco-friendly components for use in, e.g., optics, photocatalysis, electronic devices and bio-labeling.

Selective monomer attachment and coalescence of particles are among the most important growth mechanisms of quasi-1D colloidal nanocrystals. On one hand, the growth rates of different facets of a nanocrystal are determined either by the internal growth behavior of these facets or the binding energy between the facet and the organic surfactant molecule. So monomers attach much faster to the high-energy facet than the others, leading to the formation of elongated nanostructures. On the other hand, nanorods can be produced by the co-alignment and coalescence from isolated individual building blocks via an oriented attachment process.

Compared with cadmium chalcogenide nanorods (CdS, CdSe and CdTe), which have been intensively studied, zinc chalcogenide nanorods (ZnS, ZnSe and ZnTe) are hardly investigated due to the difficulty in their synthesis, which is related to the stability of different crystal structures, not necessarily being compatible with anisotropic growth. The seeded growth approach in the presence of phosphonic acid as the surfactant in trioctylphosphine (TOP)/trioctylphosphine oxide (TOPO) solvents produces CdSe/CdS quantum rods with excellent size distribution and controlled aspect ratio [1-3]. However, attempts to use this approach to synthesize quasi-1D zinc chalcogenide nanorods have been unsuccessful, resulting in either polycrystalline or polypod-shaped zinc chalcogenide nanoparticles with poor size distributions [4-9].

It has been demonstrated that alkylamines, rather than TOP/TOPO, which act as both surfactant ligands and solvents, are more suitable for synthesizing zinc chalcogenide nanorods [10-14] due to the better compatibility between alkylamine ligands and zinc ions; yet the control of the diameter of the nanorods has not been achieved. In these cases, the thermal decomposition of organic precursors produces tiny ZnSe and ZnS spherical quantum dots. Instead of a dopting monomer attachment growth mechanism, the produced individual quantum dots co-align and coalesce into elongated nanowires. However, the diameters of the produced nanowires are mainly below 3 nm [11-12, 15-20], suggesting that the limitation of width control of zinc chalcogenide nanorods imposed by alkylamines is hard to be circumvented.

Recently, Achraya et al. [21] reported synthesizing metal $Mn^{2+}$ doped ZnSe 1D nanorods via fragmentation. The ion doped 1D nanorods growth involved utilizing (crude) sample of nanowire precursors and swift injection to hot solutions.

REFERENCES

[1] Carbone, L. ; Nobile, C.; Giorgi, M. D.; Sala, F. D.; Morello, G.; Pompa, P.; Hytch, M.; Snoeck, E.; Fiore, A. F.; Franchini, I. R.; Nadasan, M.; Silvestre, A. F.; Chiodo, L.; Kudera, S.; Cingolani, R.; Krahne, R.; Manna, L. Synthesis and micrometer-scale assembly of colloidal CdSe/CdS nanorods prepared by a seeded growth approach. *Nano Lett.* 7, 2942-2950 (2007).

[2] Talapin, D. V.; Nelson, J. H.; Shevchenko, E. V.; Aloni, S.; Sadtler, B.; Alivisatos, A. P. Seeded growth of highly luminescent CdSe/CdS nanoheterostructures with rod and tetrapod morphologies. *Nano Lett.* 7, 2951-2959 (2007).

[3] Sitt, A., Salant, A., Menagen, G., Banin, U. Highly emission nano rods-in-rod heterostructures with strong linear polarization. *Nano Lett.* 11, 2054-2060 (2011).

[4] Li, L. S., Pradhan, N., Wang, Y. J., Peng, X. High quality ZnSe and ZnS nanocrystals formed by activating zinc carboxylate precursors. *Nano. Lett.* 4, 2261-2264 (2004).

[5] Li, Y. C., Li, X. H., Yang, C. H., Li, Y. F. Ligand-controlling synthesis and ordered assembly of ZnS nanorods and nanodots. *J. Phys. Chem. B* 108, 16002-16011 (2004).

[6] Cozzoli, P. D.; Manna, L.; Curri, M. L.; Kudera, S.; Giannini, C.; Striccoli, M.; Agostiano, A. Shape and phase control of colloidal ZnSe nanocrystals. *Chem. Mater.* 17, 1296-1306 (2005).

[7] Yao, T. T.; Zhao, Q.; Qiao, Z.; Peng, F.; Wang, H.; Yu, H.; Chi, C.; Yang, J. Chemical synthesis, structural characterization, optical properties, and photocatalytic activity of ultrathin ZnSe nanorods. *Chem. Eur. J.* 17, 8663-8670 (2011).

[8] Jiang, F.; Li. Y.; Ye, M.; Fan, L.; Ding, Y.; Li, Y. Ligand-tuned shape control, oriented assembly, and electrochemical characterization of colloidal ZnTe nanocrystals. *Chem. Mater.* 22, 4632-4641 (2010).

[9] Fanfair, D. D., Korgel, B. A ZnE (E=S, Se, Te) nanowires grown by the solution-liquid-solid mechanism importance of reactant decomposition kinetics and the solvent. *Cryst. Growth Des.* 8, 3246-3252 (2008).

[10] Pradhan, N., Efrima, S. Supercrystals of uniform nanorods and nanowires, and the nanorod-to-nanowire oriented transition. *J. Phys. Chem. B* 108, 11964-11970 (2004).

[11] Acharya, S., Efrima, S. Two-dimensional pressure-driven nanorod-to-nanowire reactions in langmuir monolayers at room temperature. *J. Am. Chem. Soc.* 127, 3486-3490 (2005).

[12] Panda, A. B., Acharya, S., Efrima, S. Ultranarrow ZnSe nanorods and nanowires: structure, spectroscopy, and one-dimensional properties. *Adv. Mater.* 17, 2471-2474 (2005).

[13] Deng, Z. T.; Tong, L.; Flores, M.; Lin, S.; Cheng, J. X.; Yan, H.; Liu, Y. High-quality manganese-doped zinc sulfide quantum rods with tunable dual-color and multiphoton emissions. *J. Am. Chem. Soc.* 133, 5389-5396 (2011).

[14] Zhang, J., Sun, K., Kumbhar, A., Fang, J. Y. Shape-control of ZnTe nanocrystal growth in organic solution. *J. Phys. Chem. C* 112, 5454-5458 (2008).
[15] Zhang, Y. J.; Xu, H. R.; Wang, Q. B. Ultrathin single crystal ZnS nanowires. *Chem. Commu.* 46, 8941-8943 (2010).
[16] Chin, P. T. K.; Stouwdam, J. W.; Janssen, R. A. J. Highly luminescent ultranarrow Mn doped ZnSe nanowires, *Nano Lett.* 9, 745-750 (2009).
[17] Deng, Z.; Yan, H.; Liu, Y.; Controlled colloidal growth of ultrathin single-crystal ZnS nanowires with a magic-size diameter, *Angew. Chem. Int. Ed.* 49, 8695-9698 (2010).
[18] Zhu, G.; Zhang, S.; Xu, Z.; Ma, J.; Shen, X. Ultrathin ZnS single crystal nanowires: controlled synthesis and room-temperature ferromagnetism properties, *J. Am. Chem. Soc.* 133, 15605-15612 (2011).
[19] Hou, L.; Zhang, Q.; Ling, L.; Li, C. X.; Chen, L.; Chen, S. Interfacial fabrication of single-crystalline ZnTe nanorods with high blue fluorescence, *J. Am. Chem. Soc.*135, 10618-10621 (2013).
[20] Jia, G.; Sitt, A.; Hitin, G. H.; Hadar, I.; Bekenstein, Y.; Amit, Y.; Popov, I.; Banin U Couples of colloidal semiconductor nanorods formed by self-limited assembly, *Nature Mater.* 13, 301-307 (2014).
[21] Acharya S.; Sarkar, S.; Pradhan, N. Material diffusion and doping of Mn in wurtzite ZnSe nanorods, *J. Phys. Chem.*0 117, 6006-6012 (2013).
[22] Li, J. J.; Wang, Y. A.; Guo. W.; Keay, J. C.; Mishima, T. D.; Johnson, M. B.; Peng, X. J. Am. Chem. Soc 125, 12567-12575 (2003).

GENERAL DESCRIPTION

High quality zinc chalcogenides based nanostructures, e.g., nanorods, are desirable, as they provide, on one hand, quasi-1D nanocrystals with improved and unique electro-optic characteristics, such as improved charge carrier transport, reduced lasing threshold and polarized photoluminescence with wavelength tunable by the dimensions, and in particular by the diameter of the nanorods through the quantum confinement effect, and, on the other hand, as they are less toxic or non-toxic, they enable "green" use in a variety of applications such as optics, displays, lighting, solar energy, photocatalysis and biological labeling.

However, the path to achieving high quality non-spherical zinc chalcogenide nanostructures has been hurdled by synthetic difficulties, as conventional synthetic routes, such as monomer attachment or coalescence, resulted in nanocrystals with either poor qualities (e.g. broad size distribution, broad shape distribution, polycrystalline nanorods, and polymorphic nanoparticles) or uncontrollable (unitary) aspect ratios. This is partially due to the stability of different crystal structures of zinc chalcogenide nanocrystals that are not necessarily compatible with anisotropic growth needed for the formation of quantum rods.

The inventors of the present invention have generally developed methodologies for the production of high quality quasi-1D zinc chalcogenide nanorods and high quality 2-D zinc chalcogenide quadrilateral nanostructures, "nanorod couples", with controlled characteristics. The synthetic methodologies for both zinc chalcogenide nanorods and start with the synthesis of ultrathin nanowires. On one hand, the obtained ultrathin nanowires were purified by cleaning in order to remove all the unreacted monomers, enabling production of nanorods with controlled aspect ratios by a self-ripening process via thermal-activated material diffusion; and on the other hand, if zinc and chalcogen precursors were intentionally added to the reaction solution, or if the crude nanowires solution were not purified, a gradual heating of the reaction solution to an elevated temperature, e.g. 280° C., produced highly desirable and unique structures of the zinc chalcogenides quadrilateral nanostructures via twinning growth on the end facets of each two nanowire components.

The novel process of the invention permits the synthesis of zinc chalcogenide nanorods and nanorod couples from their respective nanowires.

Without wishing to be bound to theory, the methodology behind the manufacture of the zinc nanorods, which may also be employed as precursors for the production of the nanorod couples, involves mass redistribution in zinc chalcogenide nanowires to afford the nanorods; the mass distribution is induced by thermally-activated material diffusion. The mass redistribution (used herein interchangeably with mass/material diffusion) may be an inter-particle process or an intra-particle process.

As further demonstrated, the novel methodology can be applied to produce a great range and variety of zinc chalcogenide nanostructures including ZnS, ZnSe and ZnTe, suggesting that this strategy is general and could be instructive for synthesizing other quasi-1D and 2D nanostructures via colloidal synthesis.

The inventors have also been able to convert the zinc chalcogenide nanostructures of the invention into other metal chalcogenide nanostructures, thus opening the door for the efficient manufacture of metal chalcogenide nanostructures from precursor zinc nanostructures.

Thus, the invention generally provides zinc chalcogenide nanostructures selected from nanorods and quadrilateral nanostructures also termed herein nanorod couples.

In some embodiments, the nanorods and quadrilateral nanostructures are manufactured from the corresponding nanowires. In other embodiments, the quadrilateral zinc nanostructures are manufactured from the zinc nanorods of the invention.

The process of the invention for the preparation of zinc chalcogenide nanorods is generally depicted in FIG. 1A and the process for the preparation of the metal, e.g., zinc, chalcogenide quadrilateral nanostructures from the nanorods of the invention or form the corresponding nanowires is generally depicted in FIG. 1B.

The nanowires utilized in the processes of the invention are typically ultrathin nanowires, as further disclosed herein below, which may be obtained by direct synthesis or may be used as available from a commercial source. The nanowires used in accordance with processes of the invention are generally referred to herein as "precursor nanowires". In some embodiments, the nanowires are prepared immediately prior to the preparation of the nanorods or nanostructures of the invention, or may be prepared in advance and allowed to mature in the synthesis medium.

In some embodiments, prior to using the nanowires, the medium comprising the nanowires is purified, e.g., excess or residual amounts of monomer precursors are removed, to afford a nanowire solution which is free or substantially free of precursor monomers.

The "monomer precursors" or "monomers", as used herein, are the precursors utilized in the manufacture of the nanowires. The monomers may be selected amongst (1) single source monomers containing both the zinc and the chalcogen, e.g. zinc diethyldithiocarbamate, and (2) monomers containing zinc precursors and chalcogen precursors.

The zinc precursors may be selected from zinc nitride, zinc chloride, zinc acetate, zinc oxide, dimethylzinc, zinc stearate, zinc oleate and zinc phosphonic compounds. The chalcogen precursors may be selected from chalcogen elements, selenourea, thiols, bis(trimethylsilyl)sulfide, trioctylphosphine-chalcogenides, tributylphosphine-chalcogenides, $H_2S$, $H_2Se$, $H_2Te$, amine-chalcogenides compounds, and alkene-chalcogenide compounds.

In some embodiments, the monomers are selected amongst zinc precursors and chalcogen precursors.

In some embodiments, the purifying step may include precipitating and re-dispersing the nanowires in a fresh solution, e.g., chloroform, toluene, and alcohol such as methanol or ethanol. In some embodiments, said purification step may be performed several times. In further embodiments, the purification step may be performed in duplicate, triplicate or quadruplicate. The medium in which the nanowires are contained following purification is typically an organic solvent. According to one example, the purification is carried out by introducing into the medium in which the nanowires are grown in an organic solvent which is capable of fully dissolving the precursor materials (metal chalcogenide precursors, or monomers needed for the production of the nanowires, as detailed herein), centrifuging the medium in order to separate the nanowires from the organic medium and repeatedly washing, e.g., twice, three times, etc, the nanowires to remove as much of the precursors as possible to afford a precursor-free or substantially free nanowire medium.

Alternatively, the purifying step may be carried out by any other means for achieving complete elimination or reduction in the amount of the monomer precursors. The purification step may reduce the monomers precursors in 50% or 60% or 70% or 80% or 90% or 95% or 98% or 99%.

In some embodiments, the nanowire medium comprises 0, 0.1, 0.2, 0.3, 0.4, 0.5, 0.6, 0.7, 0.8, 0.9, 1, 2, 3, 4, 5, 6, 7, 8, 9, 10% higher monomer precursors subsequent to the purification step.

The nanowires solution or medium, as a precursor solution for the preparation of nanorods or quadrilateral nanostructures of the invention, may be treated prior to the gradual annealing step resulting in the nanorods or nanostructures of the invention. The treatment steps may encompass one or more of the following: dispersing, dissolving, purifying, precipitating, and re-dispersing in a clean solvent (medium) or another solvent, evaporation of solvent, adding chemical agents or ligands, exchanging ligands (attached to the nanowires), and any combination thereof.

Reference is now made to Scheme 1 below which provides a general and non-limiting scheme for processes and products of the invention.

Scheme 1

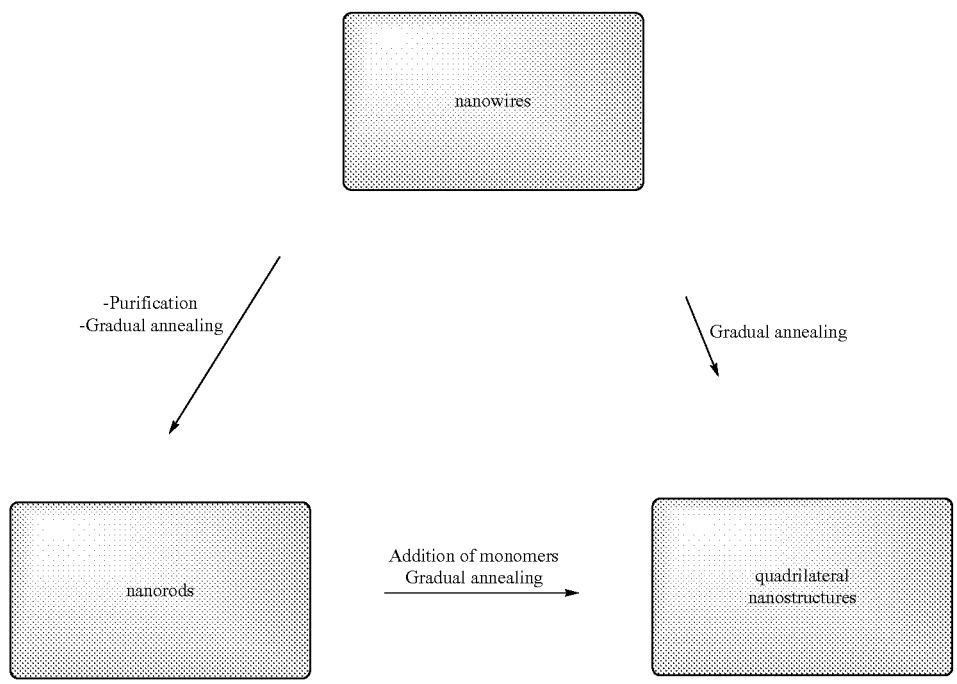

The nanowires solution, either purified as above, or unpurified, namely containing an amount of the precursor monomers, is gradually annealed to afford either the nanorods of the invention or the quadrilateral nanostructures of the invention. Without wishing to be bound by theory, in the absence of monomers, namely when the nanowire solution is free from monomers, gradual annealing of the nanowires generates a controlled mass redistribution and formation of the nanorods, as depicted in FIG. 1A. The ability to control the mass redistribution eliminates or substantially eliminates fragmentation of the nanowires. When gradual annealing of the nanowires occurs in the presence of the precursor monomers, namely on the "as is" nanowire solution (unpurified), it produces fusion or coupling or twinning of the nanowires and formation of the quadrilateral nanostructures.

The size and final shape of the quadrilateral nanostructures of the invention may depend not only on the reaction conditions and the specific metal (e.g., zinc) chalcogenide employed, but also on the initial morphology of the starting nonmaterial, as depicted in FIG. 1B. As will be further demonstrated below, when the quadrilateral nanostructures are prepared from the nanowire solution, the quadrilateral skeleton will be formed from fusion of two nanowires, and thus the two sides of the quadrilateral structure originating from the nanowires will substantially maintain the morphology (length and width) of the nanowires. Alternatively, as shown in Scheme 1, the quadrilateral nanostructures may be prepared from the nanorods of the invention, in which case two of the quadrilateral sides originating from the nanorods will substantially maintain the morphology (length and width) of the nanorods.

In view of the above, it is clear that the quadrilateral structures may be produced not only from zinc chalcogenides but also from other metal chalcogenides, as further disclosed and exemplified hereinbelow.

As used herein, the term "metal chalcogenide", unless otherwise specifically referred to a specific metal species, refers to compounds of a metal with sulfur, selenium or tellurium or polonium. Exemplary metals include Ga, In, Ti, Sn, Pb, Bi, Zn, Cd, Hg, Cu, Ag, Au, Ni, Pd, Pt, Co, Rh, Ir, Fe, Ru, Os, Mn, Tc, Re, Cr, Mo, W, v, Nb, Ta, Ti, Zr, Hf, Sc and Y. Metal chalcogenides may be selected from Metal chalcogenides may be selected from CdS, CdSe, $Sn_2S_6$, $Sn_2Se_6$, $In_2Se_4$, $In_2Te_3$, $Ga_2Se_3$, $CuInSe_2$, $Cu_7S_4$, $Hg_3Se_4$, $Sb_2Te_3$, ZnS, ZnSe, ZnTe, AgS, AgSe, AgTe, $Cu_2S$, $Cu_2Se$, $CuInS_2$, PbS, PbSe, PbTe, ZnS, ZnSe and ZnTe.

In some embodiments, the metal is selected from Cd, Cu, Ag and Pb. The metal chalcogenide is thus selected from Cd-chalcogenides, Cu-chalcogenides, Ag-chalcogenides and Pb-chalcogenide.

In some embodiments, the metal chalcogenide is a zinc chalcogenide. The zinc chalcogenides may be selected from ZnS, ZnSe and ZnTe.

Thus, the invention provides a process for producing metal, e.g., zinc, chalcogenide nanostructures selected from nanorods and quadrilateral nanostructures having improved characteristics (as disclosed above), the process comprising heating/annealing a sample of ultrathin nanowires, in a medium (and under conditions) allowing mass redistribution or mass diffusion in said nanowires or fusion (coupling or twinning) of said nanowires.

In some embodiments, the process for the preparation of zinc chalcogenide nanorods comprises gradually annealing medium comprising nanowires under conditions allowing mass redistribution or mass diffusion to thereby form said nanorods; the nanorods being formed via controlled mass distribution and not via fragmentation or truncation of the nanowires into a plurality of nanorods.

In some embodiments, the process for the preparation of zinc chalcogenide nanorods comprises:
gradually annealing a sample of nanowires in a medium, said medium being free or substantially free or containing no more than a 5% amount of nanowire monomers relative to the original monomers concentration;
to thereby cause transformation of the nanowires in the medium into the respective nanorods.

In some embodiments, the process comprises a step of obtaining a sample of nanowires in a medium and purifying the sample prior to affecting gradual annealing.

Thus, the invention provides a process for the preparation of zinc chalcogenide nanorods, the process comprising:
obtaining nanowires in a medium,
purifying said medium to render said medium free of monomer material or reduce the concentration of the monomers to below 5% of the original monomers concentration; and
gradually annealing said medium;
to thereby cause transformation of the nanowires in the medium into the respective nanorods.

In other embodiments, the process comprises:
obtaining a solution consisting nanowires, e.g., zinc chalcogenides nanowires and at least one amine compound in a liquid medium; and
gradually annealing said solution under conditions permitting material diffusion/mass redistribution in the nanowire solution;
to thereby cause transformation of the nanowires in the solution into the respective nanorods.

As used herein, the expression "no more than a 5% amount of nanowire monomers relative to the original monomers concentration", or any lingual variation thereof, refers to an amount of the nanowires monomers, also referred to as "metal chalcogenide monomers" or "monomers" used in the preparation of the metal nanowires, which is at most 5% of the original amount of the precursors originally used in the preparation of the monomers. Where the original amount of the nanowires monomers is not known, the amount of the monomers may be calculated considered as negligible or that no monomer amount is present.

In the process for preparing the nanowires used in the processes for making nanorods and nanostructures according to the invention, the nanowire monomers used may be (1) single source monomers containing both the zinc and the chalcogen, e.g. zinc diethyldithiocarbamate, and/or (2) monomers containing zinc precursors and chalcogen precursors.

The zinc precursors may be selected from zinc nitride, zinc chloride, zinc acetate, zinc oxide, dimethylzinc, zinc stearate, zinc oleate and zinc phosphonic compounds. The chalcogen precursors may be selected from chalcogen elements, selenourea, thiols, bis(trimethylsilyl)sulfide, trioctylphosphine-chalcogenides, tributylphosphine-chalcogenides, $H_2S$, $H_2Se$, $H_2Te$, amine-chalcogenides compounds, and alkene-chalcogenide compounds.

In some embodiments, where the solution comprises nanowires is said to be substantially free of monomers or is purified to be substantially free of monomers, it typically contains (without purification or following purification) no more than 5%, 4%, 3%, 2%, 1%, 0.5%, 0.4%, 0.3%, 0.2% or 0.1% of the original monomer concentration.

In other embodiments, the solution consisting nanowires has been prepared by purifying a medium in which the nanowires were manufactured to remove all precursor monomers.

The amine compound may be any amine selected amongst alkylamines, alkenylamines (e.g., comprising one or more double bonds) and alkynylamines (e.g., comprising one or more triple bonds). In some embodiments, the nanowires are contained or comprised in a solution also containing at least one alkylamine The alkylamine may be selected amongst $C_2$-$C_{25}$alkylamines, $C_{10}$-$C_{25}$alkylamines, $C_{15}$-$C_{25}$alkylamines, $C_{20}$-$C_{25}$alkylamines, as well from monoalkylamines, dialklyamines and trialkylamines In some embodiments, the alkylamines are selected from $C_2$-$C_{25}$alkylamines In some embodiments, the alkylamines are selected from $C_{10}$-$C_{25}$alkylamines In some embodiments, the alkylamines are selected from $C_{15}$-$C_{25}$alkylamines In some embodiments, the alkylamines are selected from $C_{20}$-$C_{25}$alkylamines In some embodiments, the alkylamines are selected from $C_2$, $C_3$, $C_4$, $C_5$, $C_6$, $C_7$, $C_8$, $C_9$, $C_{10}$, $C_{11}$, $C_{12}$, $C_{13}$, $C_{14}$, $C_{15}$, $C_{16}$, $C_{17}$, $C_{18}$, $C_{19}$, $C_{20}$, $C_{21}$, $C_{22}$, $C_{23}$, C24 and $C_{25}$-alkylamine. Where the alkylamine is a dialkylamine or a trialkylamine, namely in cases where the nitrogen (N) atom of the amine is covalently bound to two alkyl or three alkyl groups, respectively, each of the alkyl groups may or may not be the same and each may be selected amongst the above recited alkyl chains. For example, a dialkyl group may have two $C_9$ alkyl chains, or one being a $C_9$ alkyl and the other a $C_{25}$ alkyl. In other words, a "$C_2$-$C_{25}$alkylamine" defines both a mono-alkylamine having a carbon chain of between $C_2$ and $C_{25}$ carbon atoms, or a di-alkylamine wherein each of the two alkyl groups is selected independently amongst $C_2$ to $C_{25}$ alkyls, or a tri-alkylamine wherein each of the three alkyl groups is selected independently amongst $C_2$ to $C_{25}$ alkyls.

The amine compound may be selected from dodecyl amine (DDA), tetradecyl amine (TDA), hexadecyl amine (HDA), octadecyl amine (ODA), oleic acid (OA), decylamine, dioctylamine, octylamine, oleylamine, tributylamine, trihexylamine and trioctylamine.

In some embodiments, the amine compound is oleylamine

As used herein, the term "solution" or "medium" refers to a liquid combination of at least one solvent, typically an organic solvent selected from alkylamines and a quantity of the nanowires, nanorods, or nanostructures of the invention. Where the solution is said to consist nanowires, nanorods, or nanostructures, it is said to contain the nanowires, nanorods, or nanostructures in at least one solvent (being a liquid medium).

Unlike processes such as that disclosed in the art [21], which involve addition of nanowires to an alkylamine at a high temperature (e.g., 260-300° C.) and by fast injection, the process of the invention involves the addition of the nanowires to an alkylamine at room temperature. According to the process of the invention, the solution of nanowires, e.g., in some embodiments as a mixture of nanowires in at least one type of alkylamine, optionally degassed, is heated gradually to a temperature ranging from 100 to 120° C. at a rate of between 5 and 30° C./minutes, or as further disclosed herein. Upon reaching the maximum temperature, the mixture is maintained for a period of time (e.g., a few minutes to one hour), thereafter the temperature is increased to a temperature ranging from 250 and 325° C., at a rate of 5 to 30° C./minute.

The process of the invention combining the step of mixing the nanowires with the alkylamine at room temperature, rather than at a high temperature, and the gradual annealing provides stable nanorods and prevents nanowires and nanorods from degradation or fragmentation. When the process was carried out under conditions involving fast injection of the nanowires, fragmentation occurred. The nanorods of the invention are not fragmented nanowires.

In further embodiments, the process for making the nanorods of the invention may further comprise a step of forming a coat or a shell around the zinc chalcogenide nanorods; the coat or shell thus producing a core/shell or a core/multishell nanostructure, wherein the core is a zinc chalcogenide nanorods and the shell being composed of a material which may or may not comprise zinc.

The multishell may comprise 1 to 10 or 1 to 5 or 3 or 2 shells. The thickness of the shell may range from about one monolayer to 50 monolayers. The thickness of the shell may range from about 0.3 to about 6 nm.

In some embodiments, the shell material in a core/shell or multishell nanostructures according to the invention may be selected amongst any semiconductor material. The material of the semiconductor shell may be a II-VI, IV-VI2, III-V, IV-VI, I2-VI or I-III-VI2 semiconductor or combinations thereof. For example, the shell material may be selected from ZnS, ZnSe, ZnTe, ZnO, CdS, CdSe, CdTe, CdO, HgS, HgSe, HgTe, $TiO_2$, $SiO_2$, GaAs, GaP, GaAs, GaSb, GaN, InAs, InP, InSb, AlAs, AlP, AlSb, PbS, PbSe, PbTe, PbO, $Cu_2S$, $Cu_2Se$, $CuInS_2$, $CuInSe_2$, alloys thereof and mixtures thereof.

In some embodiments, the shell is another Zn-chalcogenide material. In some embodiments, the shell material is a material selected from ZnTe, ZnSe, ZnS, alloys thereof and mixture thereof.

In some embodiments, the core/shell systems are rods selected from ZnSe/ZnS, ZnTe/ZnSe, ZnTe/ZnSe/ZnS, and alloys thereof.

In some embodiments, the core/shell systems are selected from ZnTe/CdS, ZnSe/CdS.

In some embodiments, the core/multishells rods are selected from ZnTe/CdS/ZnS, ZnSe/CdS/ZnS, and ZnSe/CdSe/CdS.

The process of forming a coat or a shell around a nanorod of the invention may be selected, as known in the art, from slow addition of shell material precursors, or a successive ionic layer adsorption and reaction (SILAR) [22] or seeded growth method [1, 2].

In some embodiments, the medium comprising zinc chalcogenide nanorods is further used for the production of the quadrilateral nanostructures of the invention.

In some embodiments, the process further comprises:
  treating the medium comprising nanorods with an amount of monomers used in the preparation of nanowires, as disclosed herein; and
  gradually annealing the medium comprising the nanorods and monomers;
to thereby cause transformation of the nanorods in the medium into quadrilateral nanostructures.

In some embodiments, the monomers may be a single source containing both zinc and chalcogen, e.g. zinc diethyldithiocarbamate, and/or the monomers may be selected amongst to constitute both zinc precursors and chalcogen precursors.

In some embodiments, the zinc precursors may be selected from zinc nitride, zinc chloride, zinc acetate, zinc oxide, dimethylzinc, zinc stearate, zinc oleate, and zinc phosphonic compounds. The chalcogen precursors may be selected from chalcogen elements, selenourea, thiols, bis (trimethylsilyl)sulfide, trioctylphosphine-chalcogenides, tributylphosphine-chalcogenides, $H_2S$, $H_2Se$, $H_2Te$, amine-chalcogenides compounds and alkene-chalcogenide compounds).

In some embodiments, the monomers are selected amongst single source monomers containing both zinc and a chalcogen, as defined above, and a mixture of zinc precursors and chalcogen precursors, each as defined.

In some embodiments, the nanorods are zinc chalcogenide nanorods according to the present invention.

In other embodiments, the nanorods are zinc chalcogenide nanorods prepared according to procedures known in the art such as [21].

In some embodiments, the amount of monomers, used for the preparation of nanowires, as detailed herein, added to the medium comprising the nanorods is equal or smaller than the amount of nanorods. In further embodiments, the ratio monomers:nanorods is between 1:1 and 1:6. In other embodiments, the ratio of monomers added to nanorods is 1:1, 1:2, 1:3, 1:4, 1:5 or 1:6 (monomers:nanorods). In other embodiments, the ratio monomers:nanorods is between 1:1 and 1:3. In further embodiments, the ratio monomers:nanorods is between 1:2 and 1:3.

Alternatively, the nanostructures may be prepared by gradually annealing a medium comprising zinc chalcogenide nanowires and an amount of monomers (namely an unpurified nanowire solution, as disclosed hereinabove), to cause transformation of the nanowires into quadrilateral nanostructures.

Thus, in such embodiments, the invention comprises:
obtaining a solution comprising nanowires and monomers; and
gradually annealing said solution to thereby cause transformation of the nanorods in the medium into quadrilateral nanostructures.

The "nanowires" which are precursors in processes of the invention, for manufacturing nanorods and nanostructures, may be of a material selected amongst metal chalcogenide, e.g., zinc chalcogenides. The nanowires are typically ultrathin, namely having a diameter smaller than 2.5 nm; or in some embodiments smaller than 5 nm. In some embodiments, the diameter of the nanowires is between 1 and 2.5 nm. In other embodiments, the diameter is between 2.5 and 5.

The nanowires typically have a length in the nanometer to the micrometer regime (0.015 µm to 50 µm). The average length of the nanowires may be above 15 nm.

In some embodiments the average length is above 30 nm In some embodiments the average length is above 100 nm. In some embodiments, the average length is above 500 nm. In other embodiments, the average length is above 1 µm. In some embodiments, the average length is above 10 µm. In further embodiments, the average length is above 50 µm.

In some embodiments, the average length is from 15 to 1000nm.

The aspect ratio of the nanowires is typically large. In some embodiments, the nanowires may have an aspect ratio (length/diameter) above 4. In some embodiments, the nanowires may have an aspect ratio (length/diameter) above 12. In some embodiments, the nanowires have an aspect ratio (length/diameter) above 50. In other embodiments, the nanowires may have an aspect ratio above 100. In further embodiments, the nanowires may have an aspect ratio between 50 and 200.

In some embodiments, the aspect ratio of the nanowires is 50 times larger than the aspect ratio of the nanorods produced therefrom. In some embodiments, the aspect ratio of the nanowires is 10 times larger than the aspect ratio of the nanorods produced therefrom. In some embodiments, the aspect ratio of the nanowires is 5 times larger than the aspect ratio of the nanorods produced therefrom. In some embodiments, the aspect ratio of the nanowires is 3 times larger than the aspect ratio of the nanorods produced therefrom.

In some embodiments, the nanowires have an average length ranging from 15 nm to 50 µm and an average diameter ranging from 1 nm to 2.5 nm.

In some embodiments, the zinc chalcogenide nanowires have an average length ranging from 15 to 1000 nm and an average width ranging from 1 to 2.5 nm.

In some embodiments, the nanowires may be associated (coated) with surface ligands, typically organic ligands. In some embodiments, each precursor nanowire is coated, partially or wholly with a plurality of ligands, selected in a non-limiting fashion from trioctylphosphine (TOP), tributylphosphine (TBP), trioctylphosphine oxide (TOPO), dodecyl amine (DDA), tetradecyl amine (TDA), hexadecyl amine (HDA), octadecyl amine (ODA), decylamine, dioctylamine, octylamine, oleylamine, tributylamine, trihexylamine, trioctylamin, oleic acid (OA), dodecylphosphonic acid (DDPA), tridecylphosphonic acid (TDPA), octadecylphosphonic acid (ODPA), hexylphosphonic acid (HPA) and thiols.

The gradual annealing of the nanowires in solution is carried out in a medium permitting nanorods formation, at an appropriate temperature. The medium permitting formation of the nanorods is typically a growth solution (or medium) comprising the nanowires, an appropriate solvent with optionally appropriate ligands and/or chemical agent. In some cases, the ligands solution serves also as the solvent solution. The growth solution may be the medium of the sample of the nanorods as obtained.

In some embodiments, the precursor nanowires are obtained in a powder form, therefore, the sample comprising them may be dispersed in a growth solution prior to the annealing step. In some embodiments, the sample comprising the precursor nanowires may be precipitated and re-dispersed into a growth solution prior to the gradual annealing step.

The growth solution provides the nanowires and may also provide ligands designed for assisting in mass re-distribution during nanorods synthesis, as well as, for assisting in dispersing and dissolving the nanowires in the growth solution.

Generally and without wishing to be bound by theory, promotion of mass redistribution and consequently nanorod formation is usually achieved by using ligands which are lightly attached to the precursor nanowire. In general, weak attaching ligands are organic ligands comprising a carbonaceous (organic) tail and a moiety, which may be selected from amines, and carboxylic acid. In some embodiments, the weak ligands are selected from dodecyl amine (DDA), tetradecyl amine (TDA), hexadecyl amine (HDA), octadecyl amine (ODA), oleic acid (OA), decylamine, dioctylamine, octylamine, oleylamine, tributylamine, trihexylamine and trioctylamine.

In some embodiments, the weak ligands are selected from alkylamines In other embodiments, the ligand is oleylamine.

In some cases, the required ligands (one or more) are present in the nanowire solution. In further embodiments, the nanowire solution is subjected to a ligand-exchange step (i.e., the ligands associated with surface of the precursor nanowires), prior to the gradual annealing step.

The gradual annealing step is carried out in a solution (medium) comprising the nanowires, by gradually elevating the temperature of the solution to an appropriate temperature while permitting formation of nanorods. The gradual annealing refers to increasing the temperature gradually in a way that does not involve a thermal shock; namely it does not involve an abrupt increase in the temperature. In some embodiments, the gradual elevation of the temperature may be at a rate of about several tenths of a degree Celsius per minute to about several tens of a degree Celsius per minute. In some other embodiments, the rate is above 0.1° C./minute. In some embodiments, the rate is above 1° C./minute. In some embodiments, the rate is above 5° C./minute. In some embodiments, the rate is above 10° C./minute.

In some embodiments, the rate ranges from 0.1° C./min to 50° C./min In further embodiments, the rate ranges from 1° C./minute to 50° C./min In other embodiments, the rate ranges from 0.1° C./minute to 10° C./minute.

In some embodiments, the temperature is elevated to a temperature being higher than 100° C. In other embodiments, the temperature is higher than 200° C. In some embodiments, the temperature is higher than 250° C. In some embodiments, the temperature is higher than 300° C.

In some embodiments, the temperature is the temperature at which the medium being gradually heated begins to boil.

In other words, in such embodiments the temperature is the boiling point temperature of the reaction medium.

In some embodiments, the maximum temperature is between 100° C. to 400° C. In other embodiments, the maximum temperature is between 200° C. to 400° C. In further embodiments, the maximum temperature is between 250° C. to 350° C. In further embodiments, the maximum temperature is between 250° C. to 325° C. In still other embodiments, the maximum temperature is between 250° C. to 300° C.

In some embodiments, the annealing conditions (rate of gradual increase, starting temperature and maximum temperature) are identical both to the process of manufacturing nanorods from nanowires and to the process of manufacturing quadrilateral nanostructures from nanowires.

In other embodiments, the annealing conditions (maximum temperature) utilized in the process of manufacturing nanorods from nanowires are different from those utilized in the process of manufacturing quadrilateral nanostructures from nanowires. For example, the maximum temperature utilized in the process of manufacturing nanorods may be much higher than that for quadrilateral structures, e.g. between 280° C. to 325° C.

The process of the invention provides medium comprising nanorods of controllable size. The dimensions of the nanorods may be determined by the duration of reaction, e.g., the period of time the reaction solution is kept at an appropriate temperature of 280° C. to 300° C. The maximum temperature is 325° C. The dimensions of the nanorods are also determined by the length of the nanowires used as precursors for the synthesis. In some embodiments, the reaction is terminated immediately after reaching the rod formation temperature. In other embodiments, the reaction duration is above 1 minute. In some other embodiments, the reaction duration is above 5 minute. In some embodiments, the reaction duration is above 10 minute.

In some other embodiments, the reaction duration ranges from 5 seconds to 100 minutes. In some other embodiments, the reaction duration ranges from 1 minute to 60 minutes. In some other embodiments, the reaction duration ranges from 5 minute to 60 minutes.

In one of its additional aspects, the invention provides a medium comprising as-prepared zinc chalcogenide nanorods, wherein each zinc chalcogenides nanorod being a quasi-1D zinc chalcogenide nanorod; the medium has improved characteristics as follows:

1. it comprises a high yield of zinc chalcogenide nanorods having narrow distribution of shapes, structures and sizes;
2. it comprises a high yield of zinc chalcogenide nanorods that are single crystalline;
3. it exhibits high stability; high thermal and photo stability
4. it comprises a population of zinc chalcogenide nanorods having an average diameter above 2.5 nm; and
5. it comprises a population of zinc chalcogenide nanorods having controlled aspect ratios.

As noted above, the medium of the invention comprises "as-prepared zinc chalcogenide nanorods". In other words, the nanorods comprised in the medium are the crude nanorods composition obtained directly in the specific medium in which their synthesis (e.g., colloidal) is carried out, with no (or substantially no) further purification treatments (e.g., size selective precipitation, purification, ligand exchange), i.e., a crude sample (solution/dispersion) of nanorods. The "medium of nanorods" comprising one or more nanorods (nanocrystals), typically a plurality of nanorods, may be in a form selected from a solution (or colloidal solution), a suspension or a dispersion of nanorods. In some embodiments, the medium is a liquid medium. In some embodiments, the liquid medium is a mixture of one or more organic solvents (liquids), which may or may not further contain solubilized materials. In some embodiments, the medium is an organic solution.

Thus, as the solution or medium comprises nanorods which are the direct product of mass redistribution, the invention also provides zinc chalcogenide nanorods manufactured by mass redistribution from the corresponding zinc chalcogenide nanowires.

In some embodiments, the zinc chalcogenide nanowires are present in the medium in which the nanorods are manufactured, with the medium comprising no excess of monomers.

The "nanorods" prepared according to the process of the invention and comprised in the medium are non-spherical nanoparticles exhibiting growth along the elongated axis of the nanoparticles, while maintaining small dimensions in the other axes, resulting in nanoparticles having one axis which is elongated (longer) relative to the other axes (or diameter). The nanorods of the invention are different in their dimensions from the nanowires from which they are manufactured.

The dimensions of all axes are in the nanoscale regime (1.5nm to 1,000 nm.). The size of the nanorods is given as the length of the longest axis of the particle, its width (short axis or diameter) and/or its aspect ratio which is the ratio of length to diameter.

In some embodiments, the average (mean) length of the longest axis of the nanorods may range from about 5 nm to about 1,000 nm. In some embodiments, the average (mean) length of the longest axis of the nanorods may range from about 5 nm to about 500 nm.

In some embodiments, the average length of the longest axis is above 10 nm. In some embodiments, the average length of the longest axis is above 50 nm. In some embodiments, the average length of the longest axis is above 100 nm.

In some embodiments, the average length of the longest axis is between 5 to 200 nm. In some embodiments, the average length of the longest axis is between 10 to 200 nm. In some embodiments, the average length of the longest axis is between 10 to 100 nm.

The average width of the nanorods may be smaller than 100 times the Bohr radius of the Zn chalcogenide material. In some embodiments, the average length of the nanorods may be smaller than 50 times the Bohr radius of the Zn chalcogenide material. In further embodiments, the average length of the nanorods may be smaller than 40 times the Bohr radius of the Zn chalcogenide material; smaller than 30 times the Bohr radius of the Zn chalcogenide material; smaller than 20 times the Bohr radius of the Zn chalcogenide material; smaller than 15 times the Bohr radius of the Zn chalcogenide material; smaller than 10 times the Bohr radius of the Zn chalcogenide material; or smaller than 5 times Bohr radius of the Zn chalcogenide material.

The average (mean) width (or diameter) of the shortest axis of the nanorods may range from about 1.5 nm to about 100 nm. In some embodiments, the average width ranges from about 1.5 nm to about 50 nm. In other embodiments, the average width ranges from about 1.5 nm to about 20 nm. In further embodiments, the average width ranges from 1.5 to 15 nm. In some embodiments, the average width ranges from 1.5 to 12 nm. In some embodiments, the average width ranges from 1.5 to 10 nm.

In some embodiments, the average width ranges from about 2.5 nm to about 100 nm. In some embodiments, the average width ranges from about 2.5 nm to about 50 nm. In some embodiments, the average width ranges from about 2.5 nm to about 20 nm.

In some embodiments, the average width ranges from 2.5 to 15 nm. In some embodiments, the average width ranges from 2.5 to 12 nm. In some embodiments, the average width ranges from 2.5 to 10 nm.

In some embodiments, the average width ranges from 2.5 to 6 nm.

In some embodiments, the average width ranges from about 4 nm to about 100 nm. In some embodiments, the average width ranges from about 4 nm to about 50 nm. In some embodiments, the average width ranges from about 4 nm to about 20 nm. In some embodiments, the average width ranges from 4 to 15 nm. In some embodiments, the average width ranges from 4 to 12 nm. In some embodiments, the average width ranges from 4 to 10 nm.

In some embodiments, the average width is above 10 nm. In other embodiments, the average width is above 5 nm. In other embodiments, the average width is above 4 nm. In other embodiments, the average width is above 3 nm. In other embodiments, the average width is above 2.5 nm.

In some embodiments, the average width is below 100 nm. In other embodiments, the average width is below 50 nm. In other embodiments, the average width is below 40 nm. In other embodiments, the average width is below 30 nm. In other embodiments, the average width is below 20 nm.

In other embodiments, the average width of the nanorods may range from about 3 to about 20 nm. In other embodiments, the average width may range from about 5 to about 20 nm. In other embodiments, the average width may range from about 3 to about 20 nm. In other embodiments, the average width may range from about 4 to about 20 nm. In other embodiments, the average width may range from about 5 to about 20 nm. In further embodiments, the average width may be 2 5 nm, or 2 nm, or 3 nm, or 4 nm, or 5 nm, or 6 nm, or 7 nm, or 8 nm, or 9 nm, or 10 nm, or 11 nm, or 12 nm, or 13 nm, or 14 nm, or 15 nm, or 16 nm, or 17 nm, or 18 nm, or 19 nm, or 20 nm, or 21 nm, or 22 nm, or 23 nm, or 24 nm, or 25 nm, or 26 nm, or 27 nm, or 28 nm, or 29 nm or 30 nm.

The average width of the nanorods may be smaller than 10 times the Bohr radius of the Zn chalcogenide material; smaller than 5 times the Bohr radius of the Zn chalcogenide material; smaller than 4 times the Bohr radius of the Zn chalcogenide material; smaller than 3 times the Bohr radius of the Zn chalcogenide material; smaller than 2 times the Bohr radius of the Zn chalcogenide material; or smaller than 1.5 times the Bohr radius of the Zn chalcogenide material.

In other embodiments, the nanorod may have an average aspect ratio (length/diameter) of between 2 and 200. In other embodiments, the nanorod may have an average aspect ratio of between 2 and 30. In other embodiments, the nanorod may have an average aspect ratio of between 2 and 20. In other embodiments, the nanorod may have an average aspect ratio of between 2 and 15. In other embodiments, the nanorod may have an average aspect ratio of between 2 and 10.

In some embodiments, the average aspect ratio is smaller than 30. In some embodiments, the average aspect ratio is smaller than 25. In further embodiments, the average aspect ratio is smaller than 20. In still further embodiments, the average aspect ratio is smaller than 15 and in further embodiments, the average aspect ratio is smaller than 10.

In some embodiments, the nanorods are an intermediate state between 0D (quantum dot) and quasi-1D (nanowire), i.e., an intermediate state between confinement of carriers in three dimensions to confinement of carriers in two dimensions.

In some embodiments, the Zn chalcogenide material is ZnS, the average width of the nanorods may be between 2 nm and 6 nm. In some embodiments, the Zn chalcogenide material is ZnS, the average width of the nanorods may be between 2 nm and 20 nm. In some embodiments, the Zn chalcogenide material is ZnS, the average width of the nanorods may be between 2 nm and 30; between 2 and 40 nm; between 2 and 50 nm; between 2 and 60 nm; between 2 and 70 nm; between 2 and 80 nm; between 2 and 90 nm or between 2 and 100 nm.

In further embodiments, the Zn chalcogenide material is ZnS, the average length of the nanorods may be between 5 nm and 50 nm. In further embodiments, the Zn chalcogenide material is ZnS, the average length of the nanorods may be between 5 nm and 30; between 5 and 40 nm; between 5 and 60 nm; between 5 and 70 nm; between 5 and 80 nm; between 5 and 90 nm; between 5 and 100 nm; or between 5 nm and 200 nm. In further embodiments, the Zn chalcogenide material is ZnS, the average length of the nanorods may be between 5 nm and 1000 nm.

In some embodiments, the Zn chalcogenide material is ZnSe, the average width of the nanorods may be between 2.5 nm and 9 nm. In some embodiments, the Zn chalcogenide material is ZnSe, the average width of the nanorods may be between 2.5 and 10 nm; between 2.5 nm and 20; between 2.5 nm and 30; between 2.5 nm and 40 or between 2.5 nm and 50 nm. In some embodiments, the Zn chalcogenide material is ZnSe, the average width of the nanorods may be between 2.5 nm and 200 nm.

In further embodiments, the Zn chalcogenide material is ZnSe, the average length of the nanorods may be between 5 nm and 100 nm. In further embodiments, the average length of the nanorods may be between 5 nm and 30; between 5 and 40 nm; between 5 and 60 nm; between 5 and 70 nm; between 5 and 80 nm; or between 5 and 90 nm. In further embodiments, the Zn chalcogenide material is ZnSe, the average length of the nanorods may be between 5 nm and 200 nm. In further embodiments, the Zn chalcogenide material is ZnSe, the average length of the nanorods may be between 5 nm and 1000 nm.

In some embodiments, the Zn chalcogenide material is ZnTe, the average width of the nanorods may be between 2.5 nm to 15 nm. In some embodiments, the average width of the nanorods may be between 2.5 to 10 nm; between 2.5 nm to 20; between 2.5 nm to 30; between 2.5 nm to 40 or between 2.5 nm to 50 nm. In some embodiments, the Zn chalcogenide material is ZnTe, the average width of the nanorods may be between 2.5 nm to 60 nm. In some embodiments, the Zn chalcogenide material is ZnTe, the average width of the nanorods may be between 2.5 nm to 200 nm.

In further embodiments, the Zn chalcogenide material is ZnTe, the average length of the nanorods may be between 5 nm and 150 nm. In further embodiments, the average length of the nanorods may be between 5 nm and 30; between 5 and 40 nm; between 5 and 60 nm; between 5 and 70 nm; between 5 and 80 nm; between 5 and 90 nm; between 5 and 100 nm; between 5 and 110 nm; between 5 and 120 nm; between 5 and 130 nm; or between 5 and 140 nm. In further embodiments, the Zn chalcogenide material is ZnSe, the average length of the nanorods may be between 5 nm and 200 nm. In further embodiments, the Zn chalcogenide material is ZnTe, the average length of the nanorods may be between 5 nm and 1000 nm.

The nanorods prepared and employed in accordance with the invention may be associated (coated) with surface ligands, typically organic ligands. Such organic ligands are selected to affect one or more physical or chemical characteristics, e.g., solubility of the nanorods. In some embodiments, each nanorod is coated, partially or wholly with a plurality of ligands. The ligands on the surface of the nanorods may be maintained or removed or exchanged depending on the specific application.

As stated above, the nanorods are constructed of zinc and a chalcogenide. The chalcogenide may be selected amongst elements of Group VIA of the periodic table. In some embodiments, the chalcogenide is selected from 0, S, Se and Te. In further embodiments, the chalcogenide is selected from S, Se and Te.

In some embodiments, the sample of nanorods of the invention comprises nanorods selected from ZnS, ZnSe and ZnTe.

In some embodiments, the nanorods of the invention comprise nanorods selected from selected from ZnTe, ZnSe, ZnS, alloys thereof, and mixture thereof.

In some embodiments, the sample of nanorods of the invention comprises Zn chalcogenide alloy nanorods of the general formula $ZnS_xSe_{1-x}$, $ZnSe_xTe_{1-x}$ and $ZnS_xTe_{1-x}$, wherein x being between 0 and 1. In some embodiments, x is zero. In other embodiments, x is one.

In some embodiments, the sample of nanorods comprises nanorods of Zn chalcogenide alloys comprising more than one chalcogenide.

In some embodiments, the nanorods comprise Zn chalcogenide alloys with at least one chalcogenide and at least one other element. The alloy nanorods may be selected from ZnSeS, ZnTeS and ZnTeSe.

The sample of nanorods of the invention comprises Zn chalcogenide and may further comprise a shell or multishell, i.e, have a core/shell or core/multishell structure. The multishell may comprise 1 to 10 or 1 to 5 or 3 or 2 shells. The thickness of the shell may range from about one monolayer to 50 monolayers. The thickness of the shell may range from about 0.3 to about 6 nm.

In such core/shell or multishell systems, the core is a nanorod according to the invention and the shell may be selected amongst any semiconductor material.

The material of the semiconductor shell may be a II-VI, IV-VI2, III-V, IV-VI, I2-VI or I-III-VI2 semiconductor or combinations thereof. For example, the shell material may be selected from ZnS, ZnSe, ZnTe, ZnO, CdS, CdSe, CdTe, CdO, HgS, HgSe, HgTe, $TiO_2$, $SiO_2$, GaAs, GaP, GaAs, GaSb, GaN, InAs, InP, InSb, AlAs, AlP, AlSb, PbS, PbSe, PbTe, PbO, $Cu_2S$, $Cu_2Se$, $CuInS_2$, $CuInSe_2$, alloys thereof, and mixtures thereof.

In some embodiments, the shell is another Zn-chalcogenide material. In some embodiments, the shell material is a material selected from ZnTe, ZnSe, ZnS, alloys thereof, and mixture thereof.

In some embodiments, the core/shell systems are rods selected from ZnSe/ZnS, ZnTe/ZnSe, ZnTe/ZnSe/ZnS, and alloys thereof.

In some embodiments, the core/shell systems are selected from ZnTe/CdS, ZnSe/CdS.

In some embodiments, the core/multishells rods are selected from ZnTe/CdS/ZnS, ZnSe/CdS/ZnS, and ZnSe/CdSe/CdS.

The nanorods of the invention, either as is and/or when constructed as core/shell and/or core/multishell nanorods, may have an emission ranging from ultra-violet to infrared. In some embodiments, the emission ranges from ultra-violet to near infrared.

In further embodiments, the emission ranges from visible to near infrared. In some further embodiments, the emission is in the blue light regime.

As further stated above, the medium comprising zinc chalcogenide nanorods of the invention may be characterized by one or more of the following:
1. comprising a high yield of zinc chalcogenide nanorods having a narrow distribution of shapes, structures and sizes;
2. comprising a high yield of single crystalline zinc chalcogenide nanorods;
3. exhibiting high stability;
4. comprising a population of zinc chalcogenide nanorods having an average diameter above 2.5 nm; and
5. comprising a population of zinc chalcogenide nanorods having controllable aspect ratios.

In some embodiments, the medium comprises zinc chalcogenide nanocrystals of a narrow distribution of sizes in rod shape; namely, the majority of the nanoparticles are nanorods with only a small portion of the nanoparticles or none of the nanoparticles being of other shapes (such as, spherical nanoparticles). Additionally, amongst the population of nanorods, all or the majority thereof are straight nanorods, with the other minority thereof may be of a bent or branched structure.

In some embodiments, at least 70% of the nanoparticles are nanorods. In further embodiments, at least 80% of the nanoparticles are nanorods. In further embodiments, at least 90% of the nanoparticles are nanorods. In yet other embodiments, at least 95% of the nanoparticles are nanorods; in yet other embodiments, at least 98% of the nanoparticles are nanorods; and in other embodiments, between 95 and 98% of the nanoparticles are nanorods.

The nanorods are further said to have a narrow size distribution. The size of the nanorods may be defined by the following dimensions: diameter, length, and/or aspect ratio. Typically, for the nanorods in the medium, all size dimensions are narrowly distributed. In some embodiments, the size of the nanorods (diameter and/or length and/or aspect ratio) in the sample is ±30% of their mean value (as defined herein). In further embodiments, the size of the nanorods is ±20% of their mean value. In further embodiments, the size of the nanorods is ±10% of their mean value. In further embodiments, the size of the nanorods is ±5% of their mean value. In further embodiments, the size of the nanorods is ±2% of their mean value.

The width and/or length of the nanorods are further said to have a small standard deviation ($\sigma$) ranges. In some embodiments, the standard deviation ($\sigma$) of width and/or length of the nanorods in the sample is ±30% of their mean value (as defined herein). In further embodiments, the standard deviation ($\sigma$) of width and/or length of the nanorods is ±20% of their mean value. In further embodiments, the standard deviation ($\sigma$) of width and/or length of the nanorods is ±10% of their mean value. In further embodiments, the standard deviation ($\sigma$) of width and/or length of the nanorods is ±5% of their mean value. In further embodiments, the standard deviation ($\sigma$) of width and/or length of the nanorods is ±2% of their mean value.

The medium of the invention comprises a high yield of single crystalline nanorods. In other words, in the medium, the majority of nanorods are single crystalline nanorods with only a small portion of the nanorods or none of them are in an amorphous or polycrystalline or polymorphic form (phase).

In some embodiments, at least 70% of the nanorods are single crystals. In further embodiments, at least 80% of the nanorods are single crystals. In other embodiments, at least 90% of the nanorods are single crystals. In yet further embodiments, at least 95% of the nanorods are single crystals. In yet further embodiments, at least 98% of the nanorods are single crystals. In additional embodiments, between 95 to 99% of the nanorods are single crystals.

In some embodiments, the zinc chalcogenide nanorods are 2.5-20 nm in width and 5-500 nm in length.

The sample of nanorods substantially retains its characteristics even under various (one or more) treatments and/or applications (utilizations) such as precipitation steps, purification protocols (e.g., precipitation and re-dispersion in a clean solvent), ligand exchange, etc. In some embodiments, the sample may be subjected to illumination. The treatments and/or applications (utilizations) may be employed continuously or repetitively.

The medium of the invention is further characterized by comprising a plurality of nanorods produced by a process enabling control (tuning) of the nanorods size, length, diameter, and aspect ratio during the colloidal synthesis.

In another aspect, the invention provides medium comprising zinc chalcogenide nanorods obtainable by a process as disclosed herein above.

In a further aspect, the invention provides a medium of zinc chalcogenide nanorods obtained by a process as disclosed herein above.

The zinc chalcogenide quadrilateral nanostructures of the invention may be prepared, as described herein, from the following starting materials:

1. a mixture of zinc chalcogenide nanowires and one or more zinc chalcogenide nanowire monomer precursors;
2. zinc chalcogenide nanorods; and/or
3. zinc chalcogenide nanorods prepared according to the present invention.

The zinc chalcogenide quadrilateral nanostructure is characterized by a frame-like shape wherein each of two end facets of nanorods or nanowires are joined or fused so as to surround a space empty of the crystalline semiconductor material or material composing the nanostructure. It can contain ligands and/or solvent molecules. The quadrilateral nanostructure may be selected amongst a variety of four-sided substantially 2D nanostructures. Non-limiting examples include a square, a rhombus, a rectangle, a parallelogram, a trapezoid and a kite.

In some embodiments, the quadrilateral nanostructure is substantially a rectangle wherein at least two opposite faces, originating from the nanowires or nanorods, are parallel and/or have substantially the same length, width and/or aspect ratio.

Thus, the invention also provides zinc chalcogenide quadrilateral nanostructures, wherein each of the nanostructure four sides is of a zinc chalcogenide material, as defined hereinabove, and having the morphology and dimensions emerging from the starting material nanowires or nanorods.

As used herein with respect to the quadrilateral nanostructures, the precursors for making such systems may be any nanowires or nanorods as recited herein. As the quadrilateral nanostructures may also be prepared from other nanowires or nanorods, any known nanowire population or nanorod population may be utilized in their manufacture, as detailed herein.

Also as the methodology of manufacturing the zinc quadrilateral nanostructures may be extended to other metal chalcogenides starting from other metal chalcogenide nanowires or metal chalcogenide nanorods, the invention further contemplates metal quadrilateral nanostructures, the metal chalcogenide being selected from compounds of a metal with sulfur, selenium or tellurium or polonium. Exemplary metals include Ga, In, Ti, Sn, Pb, Bi, Zn, Cd, Hg, Cu, Ag, Au, Ni, Pd, Pt, Co, Rh, Ir, Fe, Ru, Os, Mn, Tc, Re, Cr, Mo, W, v, Nb, Ta, Ti, Zr, Hf, Sc and Y. Metal chalcogenides may be selected from CdS, CdSe, $Sn_2S_6$, $Su_2Se_6$, $In_2Se_4$, $In_2Te_3$, $Ga_2Se_3$, $CuInSe_2$, $Cu_7S_4$, $Hg_3Se_4$, $Sb_2Te_3$, ZnS, ZnSe, ZnTe, AgS, AgSe, AgTe, $Cu_2S$, $Cu_2Se$, $CuInS_2$, PbS, PbSe, PbTe ZnS, ZnSe and ZnTe.

In some embodiments, the metal is selected from Cd, Cu, Ag and Pb. The metal chalcogenide is thus selected from Cd-chalcogenides, Cu-chalcogenides, Ag-chalcogenides and Pb-chalcogenide.

Alternatively, the zinc nanorods and zinc quadrilateral nanostructures of the invention may be utilized as starting materials for the preparation of other metal chalcogenide nanorods and nanostructures according to the invention via cation exchange processes. Thus, the invention further contemplates a process for converting a zinc nanorod or zinc quadrilateral nanostructure, the process comprising treating a solution of zinc chalcogenide nanorods or quadrilateral nanostructures with a metal salt solution of under conditions permitting cation exchange and conversion of the zinc chalcogenide nanorod or nanostructure into the corresponding metal chalcogenide nanorod or nanostructure.

The nanorods or quadrilateral nanostructures of the invention may be utilized for a variety of electronic and optical applications, in different fields, such as lighting, flat panel displays, optics, biomedicine, solar energy and photocatalysis. In some embodiments, the nanorods are suitable for use in biomedicine. In further embodiments, the nanorods and/or quadrilateral nanostructures are used in medical imaging. In further embodiments, the nanorods and/or quadrilateral nanostructures are used in bio-tagging.

The invention also provides a device comprising the nanorods or quadrilateral nanostructure of the present invention. In some embodiments, the device is selected from a diode, a photodiode, a transmitter, a laser, a gain device, an amplifier, a switch, a marker, a bio-marker, a display, a large area display, liquid-crystal displays (LCDs), a detector, a photodetector, a sensor, a light emitting diode, a lighting system and a solar cell.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which:

FIG. 2D: Absorption spectra of ZnSe nanocrystals. Curves 1-3 correspond to FIGS. 2A-C, respectively. FIG. 2E: XRD pattern of sample in FIG. 2C. The standard XRD patterns of cubic (top) and hexagonal (bottom) ZnSe are given for reference.

FIGS. 3A-C shows sizing histograms of diameter (left frames), length (middle frames) and volume (right frames) of the original ZnSe nanowires (FIG. 3A), and ZnSe quantum rods after 5 minutes at 280° C. (FIG. 3B) and 15 minutes at 280° C. (FIG. 3C), shown in FIGS. 2A-C, respectively.

FIGS. 4A-E depict ZnSe quantum rods evolved from ZnSe nanowires. TEM images and sizing histograms (diameter, length and volume) of original ZnSe nanowires (FIG. 4A), ZnSe quantum rods evolved therefrom after 20 minutes (FIG. 4B) and 60 minutes (FIG. 4C) at 280° C. All scale bars are 50 nm. FIG. 4D: Absorption spectra of ZnSe nanocrystals. Curves 1-3 correspond to FIGS. 4A-C, respectively. FIG. 4E: XRD pattern of sample in FIG. 4C. The standard XRD patterns of cubic (top) and hexagonal (bottom) ZnSe are given for reference.

FIG. 6A: TEM and FIG. 6B HRTEM images of ZnSe quantum rods produced from ZnSe nanowires after aging at room temperature for 4 weeks, revealing that the aging of ZnSe nanowires improves the size distribution of ZnSe quantum rods. The arrow in FIG. 6B indicates that the orientation of the long axis of ZnSe quantum rod is parallel to the c-crystallographic axis of the hexagonal wurtzite structure.

FIGS. 7A-C present TEM images of ZnSe nanowires (FIG. 7A) as-prepared, (FIG. 7B) aged for four weeks at room temperature, revealing no evident changes on the dimensions of the aged ZnSe nanowires compared with the as-prepared ones. FIG. 7C shows comparison of absorption spectra of the as-prepared and the aged ZnSe nanowires. 1 and 2 correspond to FIG. 7A and FIG. 7B, respectively.

FIGS. 8A-D show TEM images of ZnSe quantum rods synthesized starting with aged ZnSe nanowires. All scale bars are 50 nm. Diameterxlength (FIG. 8A) 3.5±0.3×26±7 nm, (FIG. 8B) 3.8±0.4×62±25 nm, (FIG. 8C) 4.2±0.6× 52±19 nm, and (FIG. 8D) 3.5±0.3×95±17 nm.

FIGS. 9A-D depict sizing histogram of diameter (left panel) and length (right panel) of ZnSe quantum rods, shown in FIGS. 8A. Diameterxlength (FIG. 9A) 3.5±0.3×26±7 nm, (FIG. 9B) 3.8±0.4×62±25 nm, (FIG. 9C) 4.2±0.6×52±19 nm, and (FIG. 9D) 3.5±0.3×95±17 nm.

FIGS. 10A-F depict ZnS (ZnTe) quantum rods evolved from ZnS (ZnTe) nanowires. TEM images of ZnS nanowires (FIG. 10A), ZnS quantum rods evolved from FIG. 10A after 30 minutes at 280° C. (FIG. 10B), ZnTe nanowires (FIG. 10C), ZnTe quantum rods evolved from FIG. 10C after 30 minutes at 280° C. (FIG. 10D). All scale bars are 50 nm. FIG. 10E: Absorption spectra of ZnS and ZnTe nanocrystals. 1-4 correspond to FIGS. 10A-D, respectively. FIG. 10F: XRD patterns of ZnS and ZnTe quantum rods. 2 and 4 correspond to FIG. 10B and FIG. 10D, respectively. The standard XRD patterns for hexagonal wurtzite ZnS and ZnTe were given for reference.

FIGS. 11A-D depict evolution of ZnSe nanowires in the presence of zinc precursors. TEM images of original ZnSe nanowires (FIG. 11A), ZnSe nanoparticles evolved from FIG. 11A, after 10 minutes (FIG. 11B) and 45 minutes (FIG. 11C) at 280 ° C. All scale bars are 50 nm. FIG. 11D: Absorption spectra of ZnSe nanocrystals. 1-3correspond to FIGS. 11A-C, respectively.

FIGS. 12A-D presents electron microscopy images of ZnSe nanorod couples. FIG. 12A: TEM. Dotted circles point out twisting within the rod couple. FIG. 12B: HAADF-STEM. Insets present zoom-in of individual nanorod couples denoted by dotted circles. FIG. 12C: HRSEM. FIG. 12D, Schematic illustration of the individual nanorod couples corresponding to FIG. 12C.

FIGS. 13A-E are TEM image and sizing characterization of ZnSe nanorod couples. FIG. 13A: TEM image, and sizing histograms for FIG. 13B, Length, average 90±16 nm. FIG. 13C: Diameter of rod couples arms, average 2.8±0.3 nm. FIG. 13D: Diameter of rod couples short edges, average 3.7±0.4 nm. FIG. 13E: Spacing between each arms of nanorod couples, average 2.1±0.4nm.

FIGS. 15A-E provide structural characterization of ZnSe nanorod couples. FIG. 15A: HRTEM image of an individual ZnSe nanorod couple showing the (002) twinning plane connection region. White lines indicate orientation of selected crystal planes. Twin boundary (TB) and stacking fault (SF) are labeled by arrows. Inset shows the schematic illustration of the contact region of a nanorod couple. FIG. 15B: FFT reconstructed image corresponding to FIG. 15A. Insets show zoom-in on regions of different orientations (Zn atoms are marked in red and Se atoms in yellow). FIG. 15C: AFM image of an individual ZnSe nanorod couple. FIG. 15D: Cross-sectional height analysis along the long axis corresponding to FIG. 15C, revealing slightly increased thickness at both edges. FIG. 15E: Powder XRD pattern of ZnSe nanorod couples. The standard XRD patterns for cubic (top, C-) and hexagonal (bottom, H-) ZnSe are presented for reference. The structure matches the hexagonal wurtzite ZnSe while the strong narrow peak at 27° corresponds to the (002) plane of the elongated growth axis.

FIGS. 17A-P are HRTEM images and FFT analysis of selected areas of ZnSe nanorod couples. FIGS. 17A-D: HRTEM images of the contact areas of individual ZnSe nanorod couples. White lines indicate orientation of selected crystal lattice planes. Twin boundary (TB) is labeled by arrows. FIGS. 17E-P: FFT of selected areas in FIGS. 17A-D revealing the crystallographic relations. All scale bars are 2 nm.

FIGS. 18A: Schematic illustration of nanorod couples formation starting from small ZnSe quantum dots. Facets highlighted in blue and red correspond to zinc and selenium rich facets, respectively. FIGS. 18B-E: TEM images, the insets replicate the nanoparticle outlines. FIGS. 18B: 5 minutes at 230° C. yielding isolated ZnSe dots and short rods. FIGS. 18C: 20 minutes at 230° C. yielding long and thin ZnSe nanorods formed by oriented attachment. FIGS. 18D: 2 minutes at 280° C. yielding a mixture of nanorod couples and nanorods. FIGS. 18E: 15 minutes at 280° C. yielding nanorod couples formed by self-limited assembly. FIGS. 18F: Absorption spectra of ZnSe nanocrystals at the different growth stages. Spectra (1 to 4) correspond to FIGS. 18B-E, respectively. FIGS. 18G: Schematic illustration of a ZnSe nanorod couple passivated by oleylamine ligands showing dense ligand packing on the inner side walls. The distance provided by such packing between the two rod arms is ~2.1 nm in agreement with the TEM sizing analysis.

FIGS. 19A-B are TEM images of ZnSe rod couples synthesized at temperatures above 280° C. FIG. 19A: 300° C. FIG. 19B: 320° C.

FIGS. 20A-D are ZnSe nanostructures produced by the purification and re-adding monomer approach. TEM images of FIG. 20A: Purified original ZnSe long nanorods. FIG. 20B: ZnSe nanorod couples obtained after the reaction evolved for 30 minutes at 280° C. with adding zinc and selenium monomers. FIG. 20C: Thick and short ZnSe nanorods after the reaction evolved for 30 minutes at 280° C. without adding zinc and selenium monomers. FIG. 20D: Absorption spectra of ZnSe nanocrystals. Spectra 1-3 correspond to FIGS. 20A-C, respectively.

FIG. 22A: HDA. FIG. 22B: ODA. All scale bars are 50 nm.

FIGS. 23A-F are TEM images and optical spectra of ZnCdSe/CdS nanorod couples and nanorods. TEM images of FIG. 23A, original ZnSe nanorod couples. FIG. 23B: ZnSe nanorod couples corresponding to FIG. 23A reacted with Cd and S showing nanorod couple structure is well preserved upon the reaction. FIG. 23C: Absorption (1 original nanorod couples, 2 ZnCdSe/CdS nanorod couples) and photoluminescence (3 ZnCdSe/CdS nanorod couples) spectra. TEM images of FIG. 23D, original ZnSe nanorods. FIG. 23E: ZnCdSe nanorods corresponding to FIG. 23D reacted with Cd and S showing nanorod structure is well preserved upon the reaction. FIG. 23F: Absorption (4 original ZnSe nanorod, 5 ZnCdSe/CdS nanorods) and photoluminescence (6 ZnCdSe/CdS nanorod) spectra. The excitation wavelengths were used to match the first excitonic absorption peaks of the nanocrystals.

FIGS. 24A-C are structural characterization of ZnCdSe/CdS nanorod couples and nanorods. HRTEM images of FIG. 24A, ZnSe nanorod couples reacted with Cd and S showing nanorod couple structure is maintained upon the reaction. FIG. 24B: ZnSe nanorods reacted with Cd and S revealing the anisotropic rod structure is well maintained upon the reaction. All scale bars are 2 nm. FIG. 23C: Powder XRD pattern of (1) original ZnSe nanorod couples. (2) ZnSe nanorod couples reacted with Cd and S. (3) original ZnSe nanorods. (4) ZnSe nanorods reacted with Cd and S. The standard XRD patterns for hexagonal (H-) ZnSe, (H-) CdSe and (H-) CdS are shown for reference. The dashed lines associated with the (002) and (110) planes act as guides to illustrate the shift of XRD patterns to lower angles between ZnCdSe/CdS nanocrystals and their respective original counterparts.

FIGS. 25A-C depict level structure and optical properties of nanorod couples compared to nanorods. FIG. 25A: Electronic structure of rod couples (left) compared to nanorods (right) of similar rod dimensions (length 90 nm, rod diameters 2 8 nm, short edge diameter 3.7 nm, and spacing 2.1 nm). Top and bottom panels depict a zoom in on the near band-edge energy levels and envelope wave functions of electron and hole states respectively. The wave functions are portrayed at the cross-section along the zx plane (y=0), red indicates positive values, blue indicates negative values, and green indicates zero. Electrons and holes states are presented in different energy scales for clarity. The electron-hole band edge states in rod couples exhibit high probability density at the short edges. FIG. 25B: Representative single particle polarization dependence measurements for rod couples (solid line) and nanorods (dotted line) showing the polarization $(I_{//}-I_\perp)/(I_{//}+I_\perp)$, calculated from the photoluminescence images and fitted with sinusoidal function. FIG. 25C: Histograms of single particle photoluminescence polarization comparing nanorod couples (black) and nanorods (white). The degree of polarization is significantly lower for nanorod couples.

FIG. 26A Schematic illustration of the features control of nanorod couples, which includes the control of diameter of short arms, diameter of long arms, length of long arms, spacing between two long arms, and materials of the nanorod couples. FIG. 26B-E Cation exchange for obtaining CdSe and PbSe nanorod couples. Addition of $Cd^{2+}$ oleate to ZnSe nanorod couples in solution gives CdSe nanorod couples (yellow solution) whereas the addition of $Pb^{2+}$ oleate gives PbSe nanorod couples (brown solution). TEM images of FIG. 26B CdSe and FIG. 26C PbSe nanorod couples. FIG. 26D Powder XRD pattern and FIG. 26E absorption spectra of ZnSe (1), CdSe (2) and PbSe (3) nanorod couples, the inset shows the schematic illustration of cation exchange. The standard XRD patterns for hexagonal ZnSe and CdSe, and for cubic PbSe are shown as reference.

FIGS. 27A-B are TEM images of ZnSe nanorod couples. FIG. 27A: Initial fusing of the nanorod couples from nanorods. FIG. 27B: After the growth of additional monomers, revealing the diameter of short arms of the nanorod couples in FIG. 27B is thicker than that in FIG. 27A.

FIG. 28 are TEM images of ZnSe nanorod couples with large diameter of the long arms. All scale bars are 50 nm.

FIG. 29 provide TEM image ZnSe nanorod couples with different lengths. All scale bars are 50 nm.

DETAILED DESCRIPTION OF EMBODIMENTS

A novel strategy is disclosed for synthesizing zinc chalcogenide quantum rods via a colloidal chemical synthetic approach Unlike the well-known growth mechanisms such as monomer attachment and particle coalescence often termed directed attachment, the formation of zinc chalcogenides quantum rods involves mass redistribution from their respective ultrathin long nanowires through the thermal-activated material diffusion. It is understood that the novel strategy is general and could be applied to other systems to fabricate anisotropic quasi-1D nanostructures.

The strategy of the invention uses a thermal-activated material diffusion approach to synthesize, e g , ZnSe, quantum rods by mass redistribution from their respective nanowire counterparts. Moreover, also demonstrated is the observation that this strategy can be applied to ZnS and ZnTe as well, and for synthesizing other quasi 1D colloidal nanostructures in nanorod form.

Figure 1A:
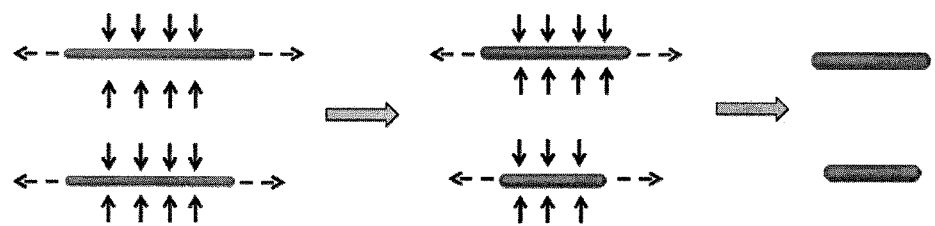
FIG. 1A depicts ZnSe quantum rods evolution from ZnSe nanowires. The mechanism associated with the evolution from nanowires to nanorods is illustrated. Dashed arrows represent the dissolution of monomers from the end facets to the solution and solid arrows represent the growth of monomers onto the side facets from the solution.
Figure 1B:
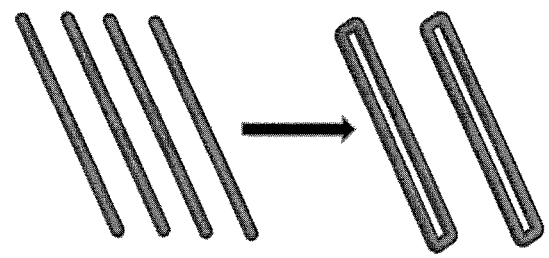
FIG. 1B is a schematic illustration of the formation of quadrilateral nanostructures.

The synthetic approach is illustrated in the flowchart of Fig. 1A. This strategy starts with the synthesis of ultrathin nanowires. In the second step, at an elevated temperature, the monomers dissolve into the solution from the end facets of the nanowires, which are the least stable region, and in the meanwhile grow onto the side facets of the nanowires, forming quantum rods via a self-ripening process.

ZnSe was used as an illustrative example for this strategy, to substantiate the proposed mechanism. The details of the synthesis of ZnSe nanowires are addressed herein. As demonsatrted, this synthetic approach produced nearly monodispersed ZnSe nanowires (FIG. 2A) with a uniform diameter of 2±0.3 nm (FIG. 3A).

Figures 2A, 2B, 2C:
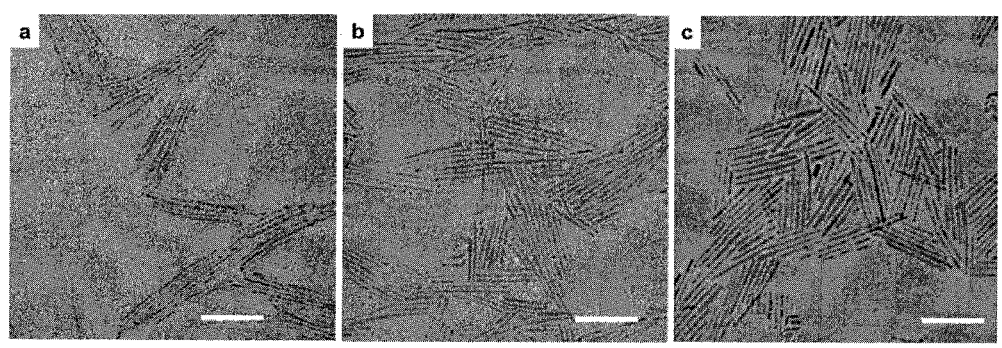
FIGS. 2A-E are TEM images of original ZnSe nanowires (FIG. 2A), ZnSe quantum rods evolved therefrom (FIG. 2A) after 5 minutes (FIG. 2B) and 15 minutes (FIG. 2C) at 280° C. All scale bars are 50 nm.

In the next step, the synthesis of ZnSe quantum rods was achieved, starting with long ZnSe nanowries (length=90±16 nm, FIG. 2A). The produced ZnSe nanowires were separated from the growth solution by dilution with chloroform and precipitation by methanol, and then redissolved into oleylamine solution. The reaction mixture was heated up to 280° C. Within 5-15 minutes at 280° C., TEM measurements on aliquots showed that the long axis of the original ZnSe nanowires reduced in size, whereas the short axis expanded, producing nearly monodispersed ZnSe quantum rods (FIGS. 2B, 2C).

Figure 2D:
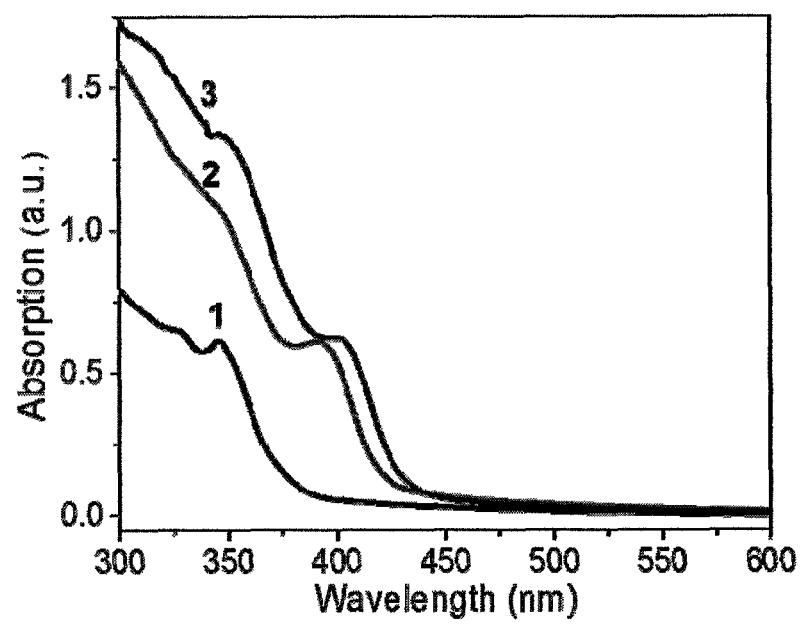

Starting with long ZnSe nanowires (length=90±16 nm, width=2.4±0 3 nm, FIGS. 2A, 3A), the length of the products shrunk to 52±19 nm while the width increased to 3.5±0.5 nm, as the reaction evolved for 5 minutes at 280° C. (FIGS. 2B, 3B). Further reaction at this temperature, for a period of 20, minutes produced ZnSe quantum rods with a width of 4.2±0.6 nm and a length of 40±19 nm (FIGS. 2C, 3C). Accordingly, the absorption onset red shifted from 345 nm to 393 nm, and then to 404 nm after 5 and 15 minutes at 280° C. (FIG. 2D), respectively, in agreement with the increase of the width of the produced ZnSe quantum rods. The X-ray diffraction (XRD) patterns (FIG. 2E) matched the hexagonal wurtzite ZnSe structure. The sharp feature at 27° in the XRD pattern associated with the (002) plane indicated that the long axis of ZnSe nanorods corresponded to the crystallographic c-axis of the wurtzite structure.

In addition to the sizing histograms on the width and length of the produced ZnSe quantum rods, those on the volume enabled a quantitative analysis to further support the mechanism of formation of ZnSe quantum rods from their nanowires (FIGS. 3 and 4). TEM characterizations (FIGS. 2 and 4) showed that the width and length of the produced ZnSe quantum rods dramatically changed. However, their volumes only slightly varied, from 410 $nm^3$ to 360 $nm^3$ for the synthesis starting with long nanowires (FIGS. 3 and 4). The inventors concluded that the volume of the individual nanoparticles was only slightly reduced during this process, clearly suggesting that a self-ripening process is the predominant mechanism for the formation of ZnSe quantum rods from their nanowires. It is the first time that this mechanism has been employed to synthesize colloidal quasi-1D semiconductor nanocrystals.

The diameter of the final ZnSe quantum rods could be controlled by changing the reaction temperature. For a given nanowire synthesis, increasing the reaction temperature at this stage to 325° C. led to ZnSe quantum rods with an average diameter of 4 5 nm, compared to a diameter of 3 nm obtained when a temperature of 280° C. was used.

The synthesis of ZnSe quantum rods was also demonstrated starting with short ZnSe nanowires. For the synthesis starting with short ZnSe nanowires (length=45±14 nm, width=2.4±0 3 nm, FIG. 4A), as the reaction proceeded for 20 minutes at 280° C., the length of the products shrunk to 15±5 nm while the diameter increased to 3.3±0.4 nm (FIG. 4B). Further reaction at this temperature for 60 minutes produced relatively short quantum rods with a length of 13±5 nm and a width of 3.9±0.7 nm (FIG. 4C). The changes in the width of the nanoparticles were manifested in a red shift in the absorption onsets, from 345 nm to 385 nm and then to 401 nm after 20 minutes and 60 minutes at 280° C., respectively (FIG. 4D). The volumes of ZnSe nanocrystals in this case also only slightly reduced from 161 $nm^3$ to 136 $nm^3$, for short nanowires and final products, respectively (FIG. 4), consistent with the growth mechanism proposed above.

The XRD pattern (FIG. 2E, 4E) matched hexagonal wurtzite ZnSe and the sharp feature of the (002) plane corroborated the long axis direction. Combining the synthesis of ZnSe quantum rods starting with long ZnSe nanowires above, and the synthesis starting with short nanowires herein, it demonstrated that the width and aspect ratio control (FIG. 5) of quasi-1D ZnSe nanocrystals could be successfully achieved by this strategy. In the case of the nanorod synthesis starting with long wires (FIG. 2A-C), the aspect ratios of quasi-1D ZnSe nanocrystals changes from 38±7nm, to 22±8nm, and to 16±8nm, respectively (black points in FIG. 5). In the case of the nanorod synthesis starting with short wires (FIG. 4A-C), the aspect ratios of quasi-1D ZnSe nanocrystals changes from 19±6nm, to 5±2nm, and to 3±2nm, respectively (black rectangles in FIG. 5).

Figure 5:
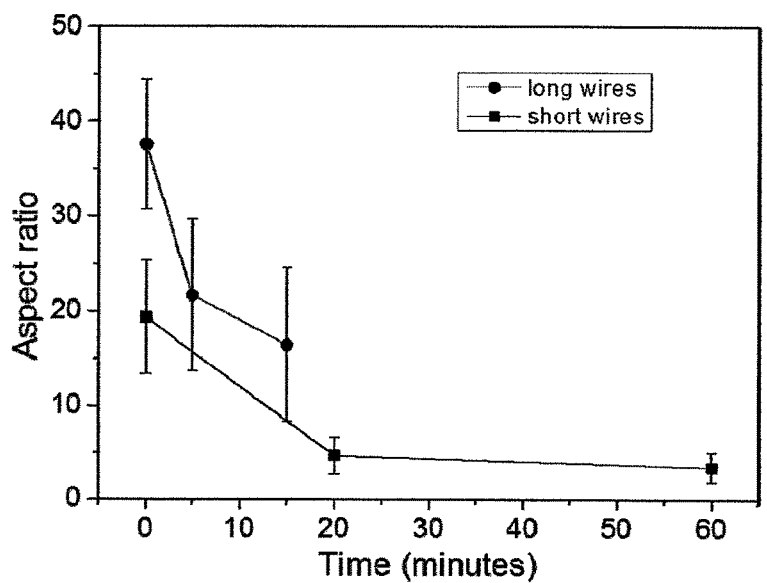
FIG. 5 depicts evolution of the aspect ratios of ZnSe nanoparticles from nanowires to quantum rods as a function of the reaction time at 280° C. The points and rectangles correspond to the evolution of ZnSe nanoparticles starting with long wires (90±16 nm, FIG. 2A) and short wires (45±14 nm, FIG. 4A), respectively.

FIG. 5 shows the evolution of the aspect ratios of ZnSe nanoparticles from nanowires to quantum rods as a function of the reaction time at 280° C. The control of the aspect ratios of quasi-1D ZnSe nanocrystals, which ranges from 38 to 3, was successfully achieved.

Starting the synthesis of ZnSe quantum rods with the aged ZnSe nanowires, which have been kept in oleylamine at room temperature for 2-4 weeks, improved the size distribution of the produced ZnSe quantum rods (FIG. 6). Compared with the as-prepared ZnSe nanowires, no obvious modifications in the dimensions of the aged nanowires were observed, whereas the absorption onset of aged ZnSe nanowires showed a slight red shift, with the elimination of the sharp absorption excitonic feature (FIG. 7C).

Figure 2E:
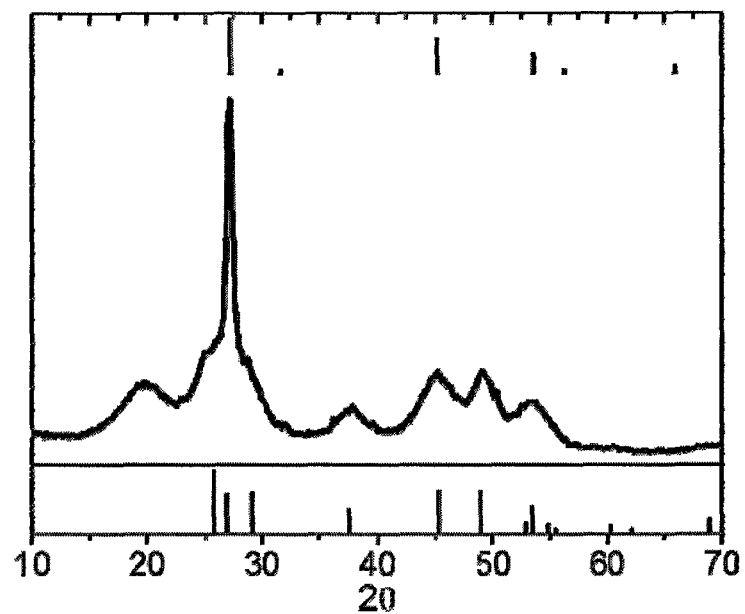

High resolution TEM (HRTEM) measurements (FIG. 6B) showed that the quantum rods were single crystalline and the lattice plane spacings extracted from the fast Fourier transform (FFT) analysis of selected areas were 0.33 nm hkl (002) and 0.35 nm hkl (100). These two planes were perpendicular to each other, typical of a hexagonal wurtzite ZnSe structure. The perpendicular orientation of the (002) plane with respect to the long axis of the quantum rods was consistent with the sharp features of the (002) plane in the XRD patterns, which corresponded well with the hexagonal ZnSe structure (FIGS. 2E and 4E).

FIG. 7 indicates that the ZnSe quantum rods could be synthesized starting with the aged ZnSe nanowires, showing a size distribution which at times is better or is comparable to those started with the as-prepared ZnSe nanowires. TEM characterization did not show evident changes in the dimensions between the aged ZnS nanowires (FIG. 7B) and the as-prepared ones (FIG. 7A). However, upon aging of the as-prepared ZnSe nanowires, the sharp features of the absorption onset smeared out and the absorption onset slightly red shifted (FIG. 7C).

Figures 6A, 6B:
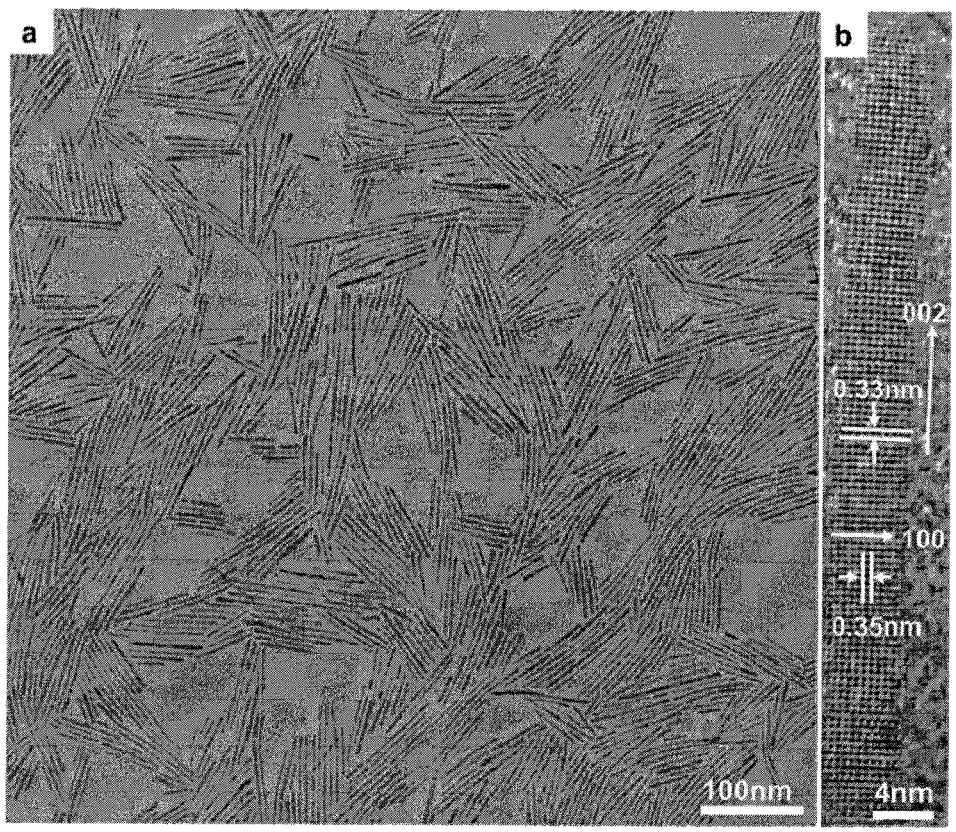
FIGS. 6A-B present TEM image of ZnSe quantum rods (widthxlength: 3.8±0.4×55±19 nm) synthesized from the aged ZnSe wires (widthxlength: 2.4±0.3×137±25 nm).

In addition to FIG. 6A, FIG. 8 shows TEM images of ZnSe quantum rods synthesized starting with aged nanowires. The length of the produced ZnSe quantum rods ranged from 26 nm to 95 nm and the width ranged from 3.5 nm to 4.2 nm. Starting with the aged ZnSe nanowires, in accordance with the methodology detailed herein ZnSe quantum rods with good size distributions were produced, presenting controlled widths and lengths (FIG. 8, also refer to FIG. 9 for sizing histograms).

To further demonstrate the generality of this methodology, it was employed to synthesize other zinc chalcogenides quantum rods, including ZnS and ZnTe, starting with their respective nanowires counterparts. ZnS (FIG. 10A) and ZnTe nanowires (FIG. 10C) with a diameter of ~2 nm were prepared via colloidal chemical synthetic approaches and their absorption spectra manifest the band gaps at 290 nm and 394 nm, respectively (FIG. 10E). As the reaction evolved for 30 minutes at 280° C., ZnS (with a diameter of ~3.5 nm, FIG. 10B) and ZnTe quantum rods (with a diameter of ~4.5 nm, FIG. 10D) were produced. The changes in the width of the quantum rods were manifested by the red shifts in the absorption onsets, to 310 nm and 490 nm for ZnS and ZnTe, respectively (FIG. 10E). XRD characterization showed that the produced ZnS and ZnTe quantum rods were hexagonal wurtzite structures with preferential elongation along the (002) lattice plane (FIG. 10F).

Combining the results on the synthesis of ZnS and ZnTe quantum rods with those of ZnSe, it clearly demonstrated that the thermodynamically driven self-ripening based synthetic methodology was general and could successfully circumvent the limitation of the width control of quasi-1D nanocrystals imposed by alkylamines, generating zinc chalcogenides quantum rods with controlled aspect ratios.

Synthesis starting with a mixture containing both ZnSe nanowires and excess zinc precursor was also carried out. This synthesis was analogous to the purification and re-adding monomer approach used previously and which enableed control over the characteristics of the ZnSe nanorod couples. It was anticipated that the ripening of ZnSe nanowires would be inhibited in the presence of zinc monomer if the formation of quantum rods was based on a ripening process via the reaction solution.

The synthetic conditions were exactly the same as those addressed for the synthesis of ZnSe quantum rods, except that the starting material was a mixture containing both ZnSe nanowires and zinc oleylamine stock solution. As the reaction evolved for 10 minutes at 280° C., the diameter of the produced nanoparticles became slightly larger compared with that of the original ZnSe nanowires (FIG. 11B) and the absorption onset slightly red shifted from 345 nm to 356 nm (FIG. 11D). Further reaction at this temperature for 45 minutes did not change much the dimensions of the nanocrystals (FIG. 11C) and the absorption onset had only a rather small further red shift, from 356 nm to 366 nm (FIG. 11D). FIG. 11 shows the evolution of ZnSe nanocrystals from ZnSe nanowires in the presence of excess zinc monomers at elevated temperature. The dimensions of the produced ZnSe nanocrystals only slightly increased as the reaction proceeded for 10-45 minutes. This demonstrateed that the ripening process of the ZnSe nanowires was significantly hindered in the presence of zinc precursors. This suggested that the self-ripening mechanism, which led to the formation of zinc chalcogenide quantum rods from their nanowires counterparts, was a thermodynamically driven material diffusion process via solution.

Self-assembly is a powerful bottom-up approach at the basis of supra-molecular and supra-nanocrystal chemistry, leading to formation of ordered self-assembled molecular monolayers, nanocrystal arrays and functional nanocrystal superstructures. Typically, self-assembly processes involve comparatively weak interactions between the components, such as hydrogen bonds and Van der Waals interactions, but this can also lead in a second step to covalently bound anisotropic nanostructures, as demonstrated in the growth of nanowires, rods, rings, sheets and platelets via a process of "oriented attachment". In this mechanism, nanocrystals are formed first. Then, specific facets of the nanocrystals are attached via weak interactions. At a later stage, partial removal of the surface passivating ligands is followed by covalent bonding of two adjacent facets, leading to extended structures.

This type of powerful self-assembly mechanism is significantly and surprisingly expanded in the technology disclosed herein, to include a self-limited assembly process that leads to growth of "nanorod couples" combining precisely two anisotropic zinc chalcogenide nanorods or nanowires that fuse into a single nanostructure; the so called quadrilateral nanostructure of the invention. This self-limited process is attributed to the growth of the connecting twin structures between each two nanorod components, which reduces significantly the driving force for further reactions of a nanorod couple.

Nanorod couples present unique shape controlled properties and also provide a new platform for studying coupling effects in anisotropic rods, with relevance to applications in optics, photocatalysis and optoelectronic devices.

Single-crystal nanorod couples of ZnSe were synthesized by a high temperature colloidal chemical synthesis route. FIG. 12 presents the structural characterization of the product (a large field of view is provided in FIG. 13). The transmission electron microscopy (TEM) image shows predominantly nanorod couples constituting two parallel rods that are fused at one or both edges. Remarkably, in each structure only two rods are attached while a distribution of lengths is seen Sizing measurements show that the diameters of each single rod component of the nanorod couple are similar, 2.8±0.3 nm, and the spacing between them is also uniform, 2.1±0.4 nm. The typical length extracted is 90±16 nm (histograms provided in FIG. 13).

Figure 14:
FIG. 14 presents HRSEM image of ZnSe nanorod couples.
Figure 16A:
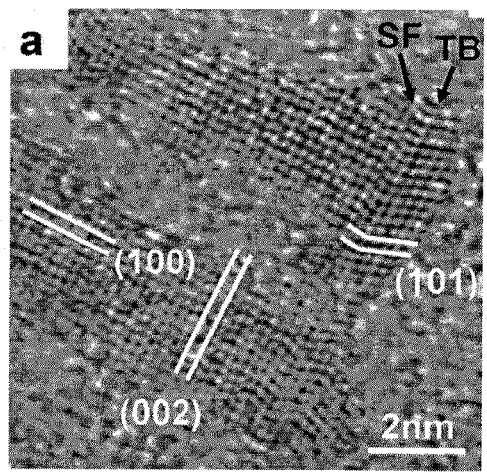
FIGS. 16A-D are HRTEM structural characterization of ZnSe nanorod couples. HRTEM images of the contact areas of individual ZnSe nanorod couples. White lines indicate orientation of selected crystal lattice planes. Twin boundary (TB) and stacking fault (SF) are labeled by arrows.
Figure 16B:
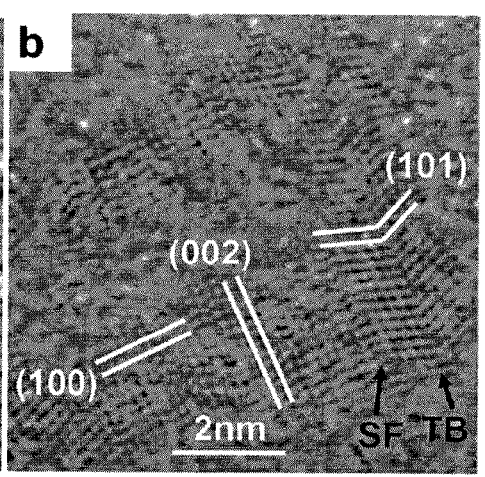
Figure 16C:
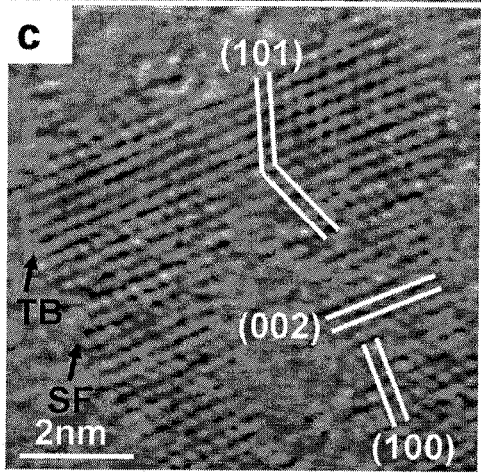
Figure 16D:
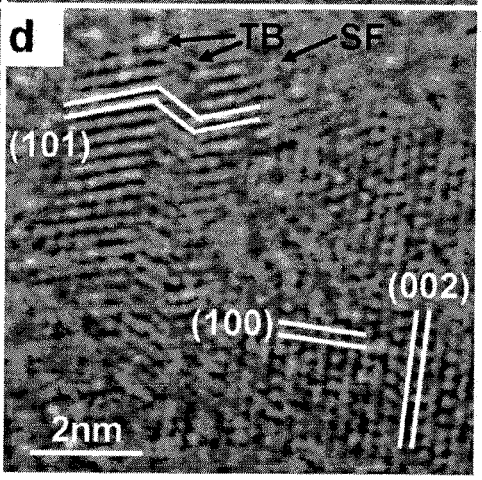

The assignment of the observed structures to two connected rods is supported further by the high angle annular dark field scanning transmission electron microscopy (HAADF-STEM) characterization (FIG. 12B). Zoom-in shows that some rod couples exhibit twisting along the structure which is also clearly observed by high-resolution scanning electron microscopy (HRSEM) (FIG. 12C and FIG. 14). The twisting feature can reduce the electrostatic repulsion between the two nanorod components of a nanorod couple. This twisting effect also explains the apparent width variations observed along some rod-couples (examples marked by circles in FIG. 12A). Such orientation effects of the rod couple on the grid are also manifested in the contrast differences observed in the HAADF-STEM image corresponding to different thickness of the material with which the electron beam interacts. In some instances, an apparent single rod structure is seen, but clearly with higher contrast, which can be attributed to the perpendicular arrangement of the rod couple on the surface. These features provide already indications of the mechanism of the formation of nanorod couples through self-assembly from individual nanorods, which is further addressed below.

High-resolution TEM (HRTEM) characterization (FIG. 15) shows that the nanorod couples are crystalline. Lattice plane spacings extracted from the fast Fourier transform (FFT) analysis of selected areas are 3.38 Å hkl (002) and 3.47 Å hkl (100) and the angle between these two planes is ~90°, typical of a hexagonal ZnSe wurtzite structure. The perpendicular orientation of the (002) plane with respect to the long axis of the nanorod couples indicates its correspondence to the c-axis of the wurtzite crystal structure. The x-ray diffraction (XRD) pattern (FIG. 15E) matches hexagonal wurtzite ZnSe while the sharp feature of the (002) plane indeed corroborates the long axis direction. A closer inspection of the contact areas at both ends of the nanorod couples by HRTEM (FIG. 15B and FIGS. 16 and 17) shows that the connection between the two nanorod components is formed via growth creating a twin boundary without displacement along the (002) plane. Atomic force microscopy (AFM) images of individual ZnSe nanorod couples (FIG. 15) reveal an increased height at both ends of the long axis of the nanorod couples, consistent with the schematic structure depicted in the inset of FIG. 15A, and with the formation of the twin boundary.

Figure 18A:
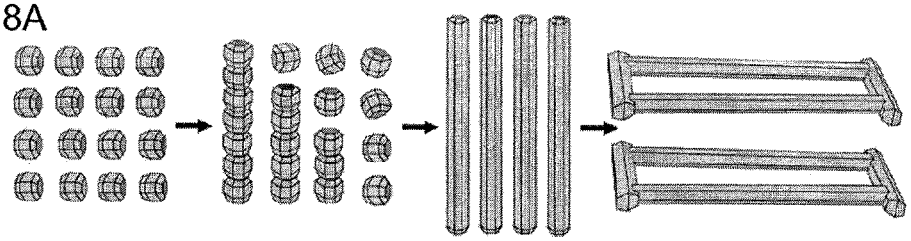
FIGS. 18A-G depict mechanistic study of the formation of ZnSe nanorod couples.

To study the nanorod couple growth mechanism, we characterized intermediate products by TEM and optical absorption spectroscopy. From this we propose the growth mechanism presented schematically in FIG. 18A and consisting of three stages, starting with growth of small quantum dots that assemble in a second step into thin nanorods via directed attachment, which then join and fuse via the self-limited self-assembly step into nanorod couples. We note that this mechanism differs from that reported for formation of PbSe nanorings that was associated with oriented attachment of preformed fragments of fused PbSe nanocrystals. That has indeed led to additional non-ring morphologies, unlike the rod-couples discussed here.

Figure 18B:
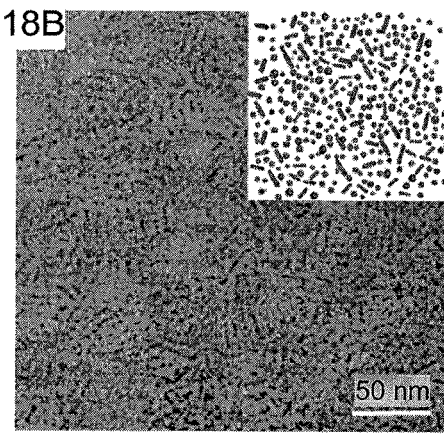
Figure 18C:
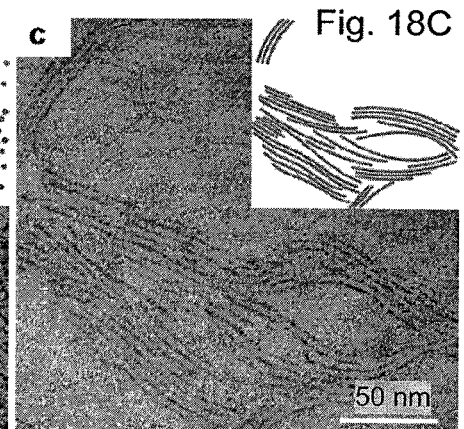

During the early reaction stage, within the first 5 minutes at 230° C., a mixture of small and isolated ZnSe quantum dots and short rods was obtained (FIG. 18B, diameters ~2 nm). The absorption spectrum manifests a band gap at 345 nm, significantly blue shifted from the bulk ZnSe band gap of 459 nm due to quantum confinement. As the reaction evolved for 20 minutes at 230° C., the first absorption excitonic peak slightly sharpens while maintaining its wavelength. Thin nanorods are seen by TEM (FIG. 18C) with diameters similar to that observed for the preceding dots and short rods, while the length increased to ~90 nm. This indicates that the thin elongated nanorods were formed by self-assembly of quantum dots and short nanorods by the oriented attachment mechanism. Additional annealing at 230° C. for times ranging from 1 hour to 12 hours did not further change the dimensions of the thin ZnSe nanorods. This is consistent with the observations of length limits of the oriented attachment of large nanorods assigned to steric hinderance effects.

Figure 18D:
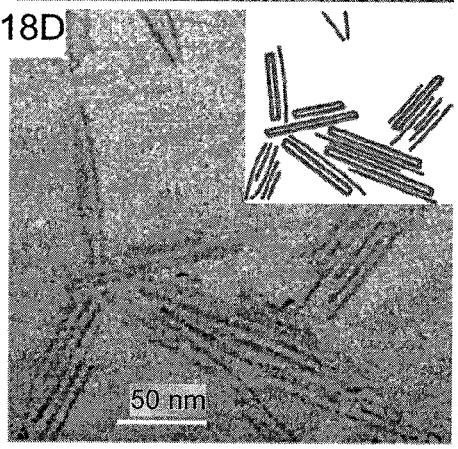
Figure 18E:
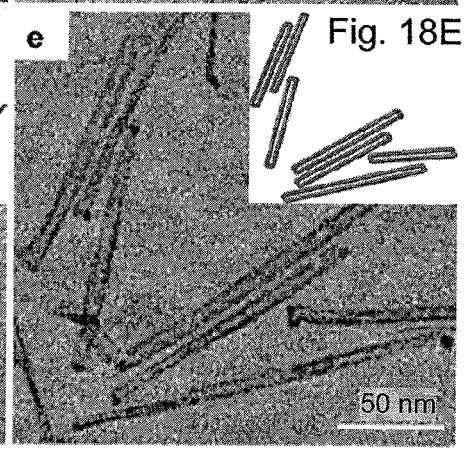
Figure 18F:
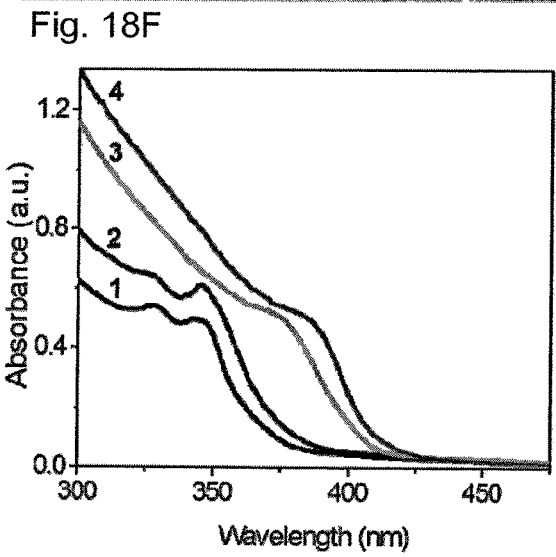

ZnSe nanorod couples were obtained only when the temperature of the system was ramped up to 280° C. After 2 minutes at 280° C., the solution started to become turbid and the TEM image showed a mixture of nanorod couples and thin rods (FIG. 18D). The corresponding absorption onset red shifted by 30 nm, from 345 nm to 375 nm. After the reaction evolved for 15 minutes at this temperature, more than 95% of the nanorods assembled into nanorod couples (FIG. 18E), accompanied by a further slight red shift (from 375 nm to 384 nm) of the absorption onset. We also found that the rod couples formation takes place at higher temperatures (300 and 320° C., FIG. 19), although with less optimal size distributions.

The end facets of the nanorods are more reactive compared to the side walls usually providing preferential elongation. At the lower temperature, the directed attachment process forming nanorods depletes the isolated dots and short rods from the reaction medium. Further directed attachment of rods to rods is then limited by the steric hindrance stopping the growth along the long axis via this process. Increasing the temperature of the system to 280° C. leads to the rod-couple formation, since the lability of the passivating ligands at the rod apexes is increased. This allows for reactivity of the apexes with the excess unreacted monomers growing onto these end facets, forming the connecting twin structures between the two nanorod components of a nanorod couple. Once the connections are formed, the driving force for further reactions of the rod couple is reduced significantly due to the presence of the thicker and more stable end portions. This provides the basis for the self-limited assembly process.

To further establish the mechanism proposed above and to provide additional control over the rod couples characteristics, a slightly different approach was employed for their synthesis. In this approach, purified ZnSe long nanorods were used and compare two experiments - one was conducted with adding zinc and selenium precursors while the other was carried out without them (FIG. 20). In the presence of the precursors, ZnSe nanorod couples were obtained (FIG. 20B), and the absorption onset also shows a significant red shift (FIG. 20D). Without the added zinc and selenium precursors however, thick and short ZnSe nanorods were obtained instead (FIG. 20C).

These comparative experiments clearly demonstrate that the unreacted monomers play a crucial role in the stabilization of the ZnSe long nanorods and also act as material sources for the fusion of ZnSe rods into rod couples. These results provide strong additional evidence for the proposed mechanism of formation of nanorod couples. This purification and re-adding monomer approach also can be used to gain further control over the nanorod couple characteristics as will be demonstrated below.

Figure 21:
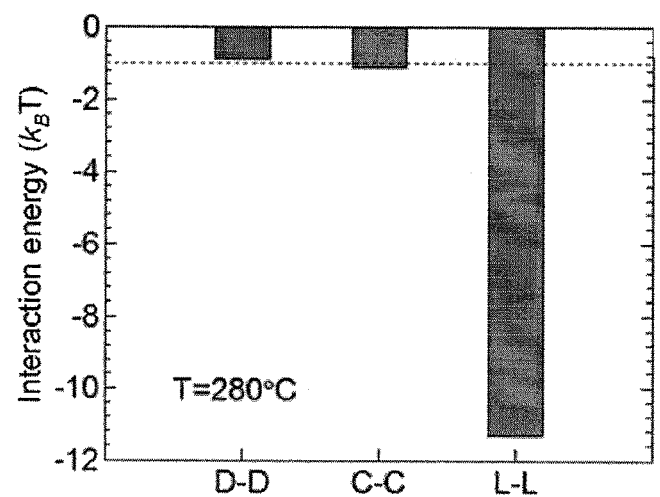
FIG. 21 depict Energetic gain from assembly of two ZnSe nanorods from infinity to $d_s$=2.1 nm, taking into account the permanent dipole moment (D-D, 0.9 $k_BT$), dispersion interaction for crystal-crystal (C-C, 1.1 $k_BT$) and ligand-ligand interaction (L-L, 11.2 $k_BT$). Red dashed line marks 1 $k_BT$ at 280° C.

To create the rod couples structure, two rods need to couple together for the connection reaction to take place. The dipole-dipole (D-D), crystal-crystal (C-C), and ligand-ligand (L-L) interactions that are involved in the self-assembly of the nanorod couples from individual nanorods in solution were calculated (FIG. 21). The L-L interactions were found to be dominant and are ~11 times $k_BT$ at the high reaction temperature ($k_B$ is the Boltzmann constant and T is the process temperature which is 280° C.). However, in solution, this part of the interactions will be mostly cancelled out by the ligand-solvent (L-S) interactions which stabilize the rod dispersion since the oleylamine solvent itself also serves as the ligand. The C-C as well as D-D interactions are each on the order of $k_BT$. In the absence of other dominant forces one may conclude that these interactions combine to provide an adequate driving force for the initial short time interaction of the two rods, enabling the growth of the connections creating the rod couple.

The observed 2.1 nm spacing between the two rods within the couples is consistent with this explanation, considering that the side walls of ZnSe nanorods are densely packed by oleylamine capping ligands and are significantly less reactive compared with the end facets. The length of the surface ligands of two nanorod components of a nanorod couple leads to the observed spacing which is close to the length of an oleylamine ligand molecule. This offers also a route to control the rod distance within the rod-couples by using different ligands type and length. This is demonstrated by carrying out the ZnSe nanorod couples synthesis with other alkylamines including octadecylamine (ODA) and hexadecylamine (HDA) which also produced ZnSe nanorod couples (FIG. 22), demonstrating the generality of this route.

The unique transition from single rods structure to rod couples leads to a significant change in the system's geometry, which is manifested in the envelope wave functions of the charge carriers and in the energy levels structure. In order to study the electronic structure of coupled rods, and in particular to probe the charge carriers' distribution throughout the nanoparticles, a finite well effective mass approximation approach was solved numerically for a frame architecture of appropriate dimensions, with the diameter of the short connecting arms larger than the rod components.

The wave functions of the band-edge states are predominantly confined to the short arms of the rod couples in accordance with their larger diameter. This leads to a red shift by ~0.35 eV of the calculated band gap transition in the rod couple compared with the isolated rods. This is consistent with the observed red-shift in the absorption onset upon rod couple formation. Note that in rod couples there are two close lying edge states with either similar or opposite phases at each end. Even for a model of rod couples with the same diameter of the short and long arms, these were found to be the lowest lying states.

The higher excited states of the rod-couples occupy mostly the long edges of the structure, they resemble states in nanorods. However, unlike in nanorods, the wave functions in the two parallel rod couples can be either of similar phase (symmetric with respect to the yz plane), or of opposite phase (antisymmetric with respect to the yz plane). The symmetric and antisymmetric states are almost degenerate; indicating that within this model that includes a high potential barrier at the surface, coupling between the two arms is relatively low. However, in order to address the coupling more accurately, factors such as Coulomb interactions and level mixing should be taken into account, which are beyond the scope of the model used here.

The level structure points out to a distinct change in the polarization characteristics of the nanorod couples compared with rods. Because the band-edge state of the rod couples is a short-edge state, while in the single rod systems it is a long-edge state, a significant decrease in the photoluminescence polarization is expected to occur in these systems with respect to single nanorods. In order to measure the polarization of rod couples and nanorods, single particle photoluminescence polarization measurements were performed on ZnSe/CdS core/shell nanorod couples and ZnSe/CdS nanorods that were over-coated in a similar manner A few layers of CdS were grown in order to eliminate surface traps and to increase the emission quantum yields. TEM and HRTEM measurements (FIGS. 23 and 24) confirmed that the produced ZnSe/CdS core/shell particles maintained the distinct structural features of the original nanorod couples.

Typical polarization dependence for single rod versus single rod couple is presented in FIG. 25B with significantly lower degree of polarization ($P=(I_{//}-I_\perp)/(I_{//}+I_\perp)$) observed for the single rod couple. This difference is of statistical significance as shown in the polarization histograms in FIG. 25C, allowing to extract low mean polarization factor of 0.2 for the nanorod couples versus 0.5 for the nanorods. This indicates a large decrease in the polarization factor consistent with the theoretical results, since the short rod couple arms are not expected to produce significant polarization considering their small aspect ratio.

Figure 26A:
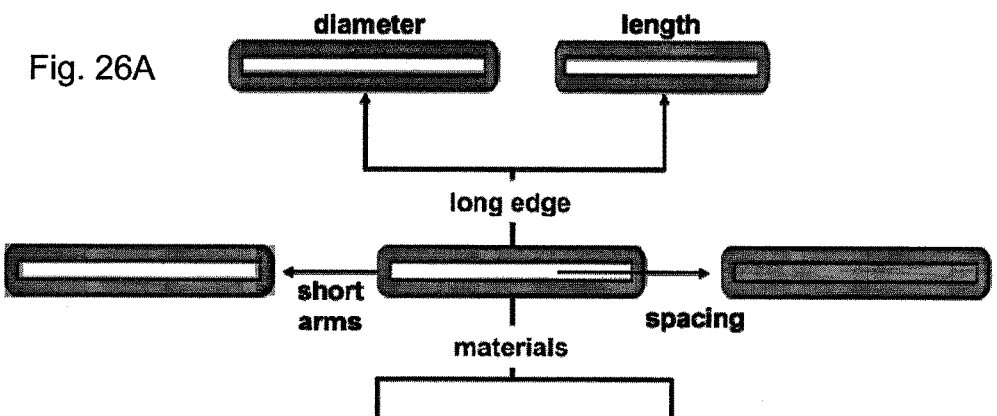
FIGS. 26A-E depict the control of nanorod couples features.
Figure 26B:
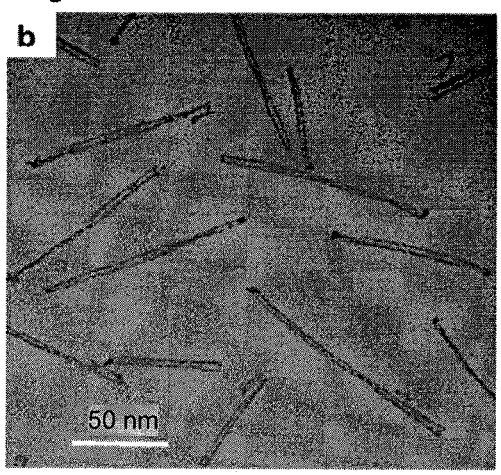
Figure 26C:
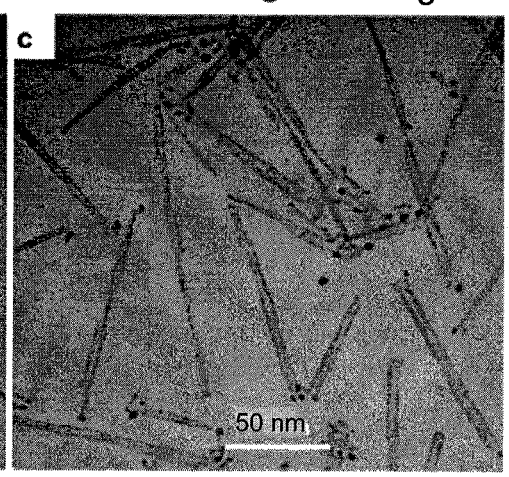
Figure 26D:
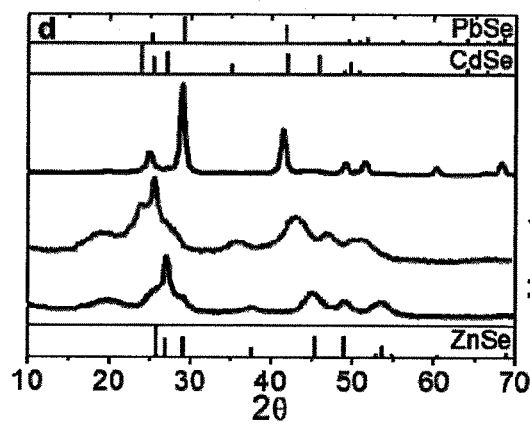
Figure 26E:
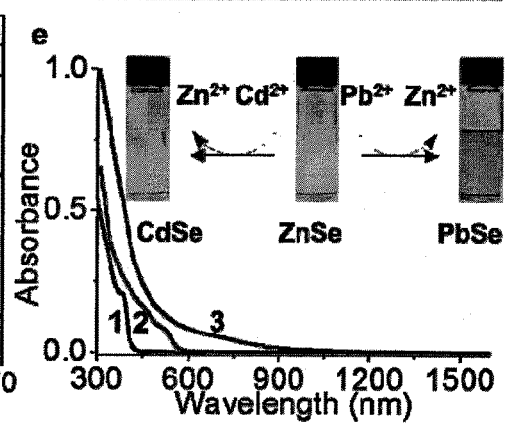

The synthetic procedure for ZnSe nanorod couples is based on an environmental compatible phosphine-free colloidal method prepared via a self-limited assembly process. There are various routes to achieve further control over the rod couples characteristics, leading to control over their properties, as illustrated in FIG. 26A. Using the purification and re-adding mononer approach, we were able to control the diameters of the short rod arms (FIG. 27), the diameter of the long rod arms (FIG. 28), the length of the long rod arms (FIG. 29), and as already mentioned, the spacing between each two nanorods of a nanorod couple. Furthermore, the composition of the nanorod couples was readily expanded via cation exchange, leading to a family of nanorod couple structures, as in FIG. 26. CdSe and PbSe nanorod couples were produced (FIG. 26E). TEM images of both products (FIG. 26B and 26C) show that the rod couple morphology was preserved while the XRD measurements (FIG. 26D) show that indeed CdSe and PbSe structures were formed. The absorption spectra of both products were also completely altered by this modification (FIG. 26E). For cation exchange with Cd, the absorption onset red shifted to ~550 nm, consistent with the smaller band gap of CdSe and exhibited a shoulder indicative of an excitonic feature. For cation exchange with Pb, nanorod couples showed absorbance at long wavelengths, consistent with the significantly smaller band gap of PbSe. This demonstrates the expansion of the family of nanorod couples through a straightforward reaction.

In summary, a novel type of colloidal nanostructure, nanorod couple, formed via a self-limited self-assembly mechanism is provided. In this mechanism, initially, directed attachment leads to growth of nanorods. When this process saturates, raising the reaction temperature leads to formation of a rod couple consisting of precisely two nanorods connected by twinning structures. Upon the growth of the connecting regions, further reactivity is hindered providing a self-limited growth process. Furthermore, the electronic and optical properties are directly modified by the nanorod couple morphology leading to reduced emission polarization compared to nanorods. Using purified rods while adding proper precursors to form the rod couples in a second stage, opens the path also to realize rod-couples heterostructures with different composition of the short connecting arms (FIG. 26A). Cation exchange allows to readily tune the band gap of nanorod couples by the modification of the composition. In particular, we prepared by this approach PbSe nanorod couples in which the wavefunctions of electrons and holes are delocalized significantly considering the large exciton Bohr radii of PbSe (~46 nm). Therefore the unique PbSe nanorod couple structure also provides an ideal system to investigate the electronic coupling effect between two closely spaced quantum rods.

Methods

Chemicals. $Zn(NO_3)_2 \cdot 6H_2O$ (99%), zinc diethyldithiocarbamate (97%), $ZnCl_2$ (99.995%), lithium triethylborohydride (1 M in tetrahydrofuran), cadmium (II) oxide (>99.99%), lead acetate trihydrate (99.999%), oleic acid (technical grade 90%), 1-Octadecene (ODE, technical grade, 90%), trioctylphosphine (TOP, 90%), trioctylphosphine oxide (TOPO, 99%), octadecylamine (ODA, 97%), hexadecylamine (HDA, 98%), chloroform (99% anhydrous), toluene (99% anhydrous) and methanol (99.8% anhydrous) were purchased from Sigma Aldrich. Selenium powder (99.999%) and tellurium powder (99.999%) were purchased from Strem Chemicals Inc. Oleylamine (approximate $C_{18}$-content 80-90%) was purchased from Acros. Octadecylphosphonic acid (ODPA) and hexylphosphonic acid (HPA) were purchased from PCI Synthesis. All chemicals were used as received without further purification.

Instrument Specifications & Sample Preparation

UV-visible-near IR absorption spectroscopy: UV-Visible-Near IR absorption spectroscopy was performed on a JASCO V-570 spectrometer using quartz cuvettes.

Powder x-ray diffraction (XRD) patterns: XRD patterns were obtained using Cu Kα photons from a Phillips PW 1830/40 diffractometer operated at 40 kV and 30 mA. Samples were deposited as a thin layer on a low-background scattering quartz substrate.

Electron microscopy measurement: Transmission Electron Microscopy (TEM) grids were prepared by depositing one drop of a solution of purified nanoparticles onto a standard carbon coated grid. TEM was performed using a Tecnai $G^2$ Spirit Twin T-12 transmission electron microscope with a tungsten filament running at an accelerating voltage of 120 keV. High Resolution Transmission Electron Microscopy (HRTEM) was performed using a Tecnai F20 G² high resolution transmission electron microscope running at an accelerating voltage of 200 keV with a field emission gun as an electron source. This microscope was also used for the high angle annular dark field scanning transmission electron microscopy (HAADF-STEM) measurements.

Scanning electron microscopy (SEM) analysis: Samples for SEM measurement were prepared by dipping a piece of silicon wafer into a toluene solution containing nanorod couples such that the solution-substrate contact line sweeps down along the substrate slowly during the evaporation process'. Images were taken using Magellan (TM) 400L extra high resolution scanning electron microscope (XHR-SEM). The XHR-SEM was operated at an acceleration voltage of 1 KeV and a landing energy of 500 V to 50 V (by applying a positive bias to the stage). Samples were exposed to short cycles of oxygen plasma, using the built-in plasma cleaner, to remove organic contamination and improve image contrast.

Atomic force microscopy (AFM) analysis: AFM analysis of nanoparticles was carried out with a Nanowizard 3 AFM on quantitative imaging (QI) mode (JPK Instruments). Silicon nitride cantilevers (Appnano HYDRA AFM probes) with a resonance frequency of 49.8±0.1 kHz (in air) and an average spring constant of k=0.39±0.03 N/m (as determined by the thermal noise method) were used. Nanoparticles were imaged using the QI mode, which minimizes shearing forces acting on the sample and thus avoids dislocation of the nanoparticles by the tip.

Single particle photoluminescence polarization measurements: A dilute solution of purified nanoparticles in toluene is spin-coated onto a clean microscope cover glass. Excitation of the sample for photoluminescence measurements was done using an unpolarized light emitting diode (LED) at 470±20 nm (Prizmatix) in an Epi-illumination configuration and focused through a high numerical aperture oil immersion objective (X100 1.4 N.A. - Nikon). Photoluminescence emission is collected through the same objective, filtered spectrally and then passed through a rotating half wave plate which rotates the polarization vector of the emission. Following this, the emitted light passes through a polarizing beam displacer, that splits the light into two perpendicularly polarized beams (horizontal and vertical) and shifts them spatially one with respect to the other. The images of the two polarizations are collected simultaneously using an electron multiplying charge coupled device (EMCCD, Andor iXon3), yielding significant improvement in the signal to noise ratio for the polarization determination. The intensity of both polarization components is extracted from the different pairs of images, and the experimental polarization at different rotation angles of the half wave plate is calculated according to $P=(I_{//}-I_{\perp})/(I_{//}+I_{\perp})$. These values are well fitted by a sinusoidal function which yields the degree of polarization for each particle. Measurements were performed under slow Ar flow for improved stability.

Synthesis of ZnSe nanowires. In a typical synthesis, 0.2 mmol (59.5 mg) $Zn(NO_3)_2 \cdot 6H_2O$ and 10 mL oleylamine were mixed in a three-neck flask. The mixture was degassed and refilled with Ar three times at room temperature and then heated to 110° C. and kept at this temperature for 0.5 hr. At 160° C., 2 mL 0.1 M Se oleylamine solution was injected into the flask. After the injection, the temperature was set at 120° C. and the mixture was degassed for 10 minutes. Then the temperature was raised up to 230° C. in 6 minutes. After 20 minutes at 230° C., the reaction was quenched by removing the heating mantle.

The synthesis of ZnSe nanowires were also carried out according to the above description with some modifications, such as: (i) variety of Zn:Se ratios; (ii) after degassing step, heating to 110° C. for up to 2 hr; (iii) omitting the step of setting the temperature to 120° C. after injection; (iv) the selenium solution is injected at different temperatures: 160° C. or 200° C. or 230° C. or 260° C.

Synthesis of ZnS nanowires. In a typical synthesis, 0.05 mmol (18 mg) zinc diethyldithiocarbamate and 10 mL oleylamine were mixed in a three-neck flask. The mixture was degassed and refilled with Ar three times at room temperature then it was heated to 110° C. and kept at this temperature for 0.5 hr. Then the temperature was raised up to 230° C. in 6 minutes from 110° C. After 20 minutes at 230° C., the reaction was quenched by removing the heating mantle.

Synthesis of ZnTe nanowires. 0.2 mmol (27.3 mg) $ZnCl_2$ and 10 mL oleylamine were mixed in a three-neck flask. The mixture was degassed and refilled with Ar three times at room temperature then it was heated to 110° C. and kept at this temperature for 0.5 hr. 0.5 M tellurium stock solution was prepared by dissolving tellurium powder into TOP at 280° C. 0.4 mL 0.5 M tellurium solution was mixed with 0.34 mL lithium triethylborohydride (1 M in tetrahydrofuran) and 1 mL oleylamine in the glove box and then the mixture was injected into the flask at 160° C. After the injection, the temperature was set at 120° C. and the mixture was degassed for 10 minutes. Then the temperature was raised up to 230° C. in 6 minutes from 120° C. After 20 minutes at 230° C., the reaction was quenched by removing the heating mantle.

The synthesis of ZnSe nanowires were also carried out according to the above description with some modifications, such as: (i) use of 0.2 mmol (59.5 mg) $Zn(NO_3)_2 \cdot 6H_2O$ instead of 0.2 mmol (27.3 mg) $ZnCl_2$; (ii) Te stock solution was prepared by dissolving Te powder into trioctylphosphine (TOP) in the presence of lithium triethylborohydride (superhydride).

Purification of zinc chalcogenides nanowires. The produced zinc chalcogenides nanowires crude solution was dissolved into chloroform and precipitated by adding methanol with the aid of centrifugation.

Aging of ZnSe nanowires. After the purification, ZnSe nanowires were redissolved into oleylamine and then the reaction solution was kept in the glove box at room temperature for 2-4 weeks prior to the synthesis of ZnSe quantum rods.

The aging of ZnSe nanowires were also carried out by redissolving purified ZnSe nanowires were redissolved into oleylamine and/or chloroform.

Synthesis of zinc chalcogenides quantum rods. Purified zinc chalcogenides nanowires were redissolved in oleylamine in a three-neck flask. The reaction mixture was degassed and refilled with Ar three times at room temperature. Then it was heated gradually (at a rate of 5-30° C./minute) to 110° C. and kept at this temperature for 10 minutes. Then the temperature the reaction solution was raised up gently (at a rate of 5-30° C./minute) to 280° C. in 10 minutes and kept at this temperature for 5-120 minutes. Aliquots were taken from time to time. The reaction was terminated by removing the heating mantle.

The synthesis of zinc chalcogenides quantum rods were also carried out according to the above description with some modifications, such as: (i) chloroform was added to the solution of ZnSe nanowires in oleylamine in order to assist their solubilization in oleylamine; (ii) The reaction solution temperature (ripening temperature) was 290° C. or 305° C. or 325° C.

Preparation of zinc precursor stock solution. 0.067 M zinc stock solution was prepared by dissolving 0.2 mmol (27.3 mg) $Zn(NO_3)_2 \cdot 6H_2O$ and 10 mL oleylamine in a three-neck flask. The mixture was degassed and refilled with Ar three times at room temperature then it was heated to 110° C. and kept at this temperature for 0.5 hr.

ZnSe Nanorod Couple Synthesis

The synthesis of ZnSe nanorod couples was carried out under inert atmosphere using standard Schlenck techniques. In a typical synthesis, 0.067 M selenium stock solution was prepared by dissolving 2 mmol (159 mg) selenium powder in 30 mL oleylamine at 220° C. $Zn(NO_3)_2 \cdot 6H_2O$ (0.2 mmol, 59.5 mg) and oleylamine (15 mL) were added to a three-neck flask (50 mL). The mixture was placed under vacuum and purged with argon three times and then heated to 110° C. under vacuum and kept at this temperature for 1 hr. At 160° C., 3 mL selenium solution (0.067 M) was swiftly injected into the flask. After the injection, temperature was set at 120° C. and the mixture was degassed for 10 minutes at this temperature. Then the solution was heated up to 230° C. in 7 minutes and stabilized at this temperature for 20 minutes. The mixture was then heated up to 280° C. in 4 minutes and the solution became turbid in 3 minutes. The nanocrystals were allowed to grow for 15 minutes at 280° C. After cooling to 80° C., the crude reaction mixture was diluted with chloroform and oleic acid with a volume ratio of 4:1. Methanol was added in order to precipitate the nanocrystals with the aid of centrifugation, removing excess of organic materials and unreacted monomers.

ZnSe/cdS Core/Shell Nanorod Couples and Nanorods Synthesis

In a typical synthesis, trioctylphosphine (TOPO 2.0 g), octadecylphosphonic acid (ODPA 75 mg), hexylphosphonic acid (HPA 10 mg) and CdO (15 mg) were added to a three neck flask (50 mL). The mixture was placed under vacuum and purged with argon three times and then heated to 150° C. for 0.5 h under vacuum. The solution was heated under an argon atmosphere, to above 320° C. until it became colorless. Then the mixture was heated to 350° C. and 3 mL TOP was swiftly injected into the flask. After the temperature was stabilized at 365° C., a TOP (1.5 mL) solution containing ZnSe nanorod couples or nanorods ($1 \times 10^{-9}$ mol) and sulfur (30 mg) was injected into the flask. After the injection, the nanocrystals were allowed to grow for 30 seconds. The reaction was terminated by removing the heating mantle. After cooling to 80° C., the crude reaction mixture was diluted with toluene. Methanol was added in order to precipitate the nanocrystals and remove excess surfactants.

Cation Exchange Procedures

From ZnSe to CdSe: 0.1 M cadmium oleate stock solution was prepared by dissolving CdO (0.32 g, 2.5 mmol) into a mixture of oleic acid (6.94 mL) and octadecene (ODE 18 mL) at 220° C. Cleaned $1.34 \times 10^{-9}$ mol (containing $2.1 \times 10^{-5}$ mol $Zn^{2+}$) ZnSe nanorod couples were dissolved into anhydrous chloroform and then the solution was injected into 5 mL oleylamine solution in a three neck flask. The mixture was degassed at 110° C. for 10 minutes, and then it was heated up to 220° C. When the temperature was stabilized, 0.6 mL cadmium oleate stock solution (0.1 M) was swiftly injected into the flask while stirring. The solution in the flask was gradually changed from colorless to bright yellow and finally to yellow. After 25 minutes at this temperature the heating mantle was removed and the mixture was cooled down to room temperature.

From ZnSe to PbSe: 0.05 M lead oleate stock solution was prepared by dissolving lead acetate trihydrate (0.38 g, 1 mmol) in a mixture of oleic acid (0.88 mL) and ODE (19.12 mL) at 180° C. Purified $1.34 \times 10^{-9}$ mol (containing $2.1 \times 10^{-5}$ mol $Zn^{2+}$) of cleaned ZnSe nanorod couples was dissolved into anhydrous chloroform and then the solution was injected into 5 mL oleylamine in a 20 mL vial sealed with a septum. After purging argon through the vial for 5 minutes, 0.8 mL lead oleate stock (0.05 M) solution was injected into the vial at room temperature. The colorless solution changed to dark brown at about 120° C. in 10 minutes. The solution was cooled down to room temperature.

Zinc stock solution preparation: 0.067 M zinc stock solution was prepared by dissolving 2 mmol (59.5 mg) $Zn(NO_3)_2 \cdot 6H_2O$ in 30 mL oleylamine at 110° C.

Purification and re-adding monomer approach: This approach started with purified ZnSe long nanorods. The synthesis of ZnSe long nanorods is similar to that addressed in the Method in the main article (ZnSe nanorod couple synthesis). In a typical synthesis, $Zn(NO_3)_2 \cdot 6H_2O$ (0.2 mmol, 59.5 mg) and oleylamine (15 mL) were added to a three-neck flask (50 mL). The mixture was placed under vacuum and purged with argon three times and then heated to 110° C. under vacuum and kept at this temperature for 1 hr. At 160° C., 3 mL selenium solution (0.067 M) was swiftly injected into the flask. After the injection, temperature was set at 120° C. and the mixture was degassed for 10 minutes at this temperature. Then the solution was heated up to 230° C. in 7 minutes and stabilized at this temperature for 20 minutes. Then the reaction was quenched by removing the heating mantle. Then the long rods crude solution was purified, wherein it was diluted with chloroform and precipitated by methanol with the aid of centrifugation, in order to remove the unreacted monomers. Next, the purified ZnSe long nanorods ($\sim 3 \times 10^{-8}$ mol) were re-dissolved into 15 mL oleylamine solution into a three-neck flask. 1 mL 0.067 M zinc oleylamine and 1 mL 0.067 M selenium oleylamine stock solutions were added into the flask at room temperature. Then the reaction solution was gradually heated up to 280° C. in 15 minutes and stabilized at this temperature for 30 minutes. The reaction was quenched by removing the heating mantle.

ZnSe nanorod couples synthesis using other alkylamines: The synthetic conditions of ZnSe nanorod couples using other alkylamines, such as ODA and HDA, are exactly the same as those using oleylamine except that the ODA or HDA solvent is used, rather than oleylamine.

Reactions at Higher Temperatures above 280° C.

The synthesis was conducted at 300° C. and 320° C., below the boiling point of the oleylamine. TEM analysis (FIG. 19) showed that ZnSe nanorod couples were also produced at the temperatures above 280° C. including 300° C. and 320° C. However, their size distributions are not as good as those synthesized at 280° C. These results indicate that the growth direction indeed switches by ~90° from the main axis of the nanorods even when the temperature is increased above 280° C.

Nanorod Couples Formed by the Purification and Re-adding Monomer Approach

We performed two parallel comparative experiments starting with purified ZnSe long nanorods, one is conducted with adding the zinc and selenium monomers and the other is carried out without those monomers. In one of the experiment starting with purified ZnSe long nanorods (~3×

$10^{-8}$ mol) (FIG. 20A), 1 mL 0.067 M zinc oleylamine and 1 mL 0.067 M selenium oleylamine stock solutions were added into ZnSe long nanorods oleylamine solution at room temperature. Then the reaction solution was gradually heated up to 280° C. in 15 minutes ZnSe nanorod couples were obtained after 30 minutes at this temperature (FIG. 20B). The absorption onset (FIG. 20D) shows a significant red shift. Care should be taken in order to prevent the nucleation of ZnSe nanoparticles (NPs) from the zinc and selenium monomers, for which the heating rate was kept at ~15° C./minute from room temperature to 280° C. In another parallel comparative experiment, the synthetic conditions were exactly the same as the one above except that no zinc and selenium monomers were added in the reaction solution at the beginning of the synthesis. Interestingly, thick and short ZnSe nanorods were obtained after the reaction evolved for 30 minutes at 280° C. (FIG. 20C). Compared with the original ZnSe long nanorods, the absorption onset of the produced thick and short nanorods red-shifted from 345 nm to 405 nm (FIG. 20D).

These comparative experiments clearly demonstrate that the unreacted monomers play a crucial role in the stabilization of the ZnSe long nanorods and also act as material sources for the fusion of ZnSe rods into rod couples. These results provide strong additional evidence for the proposed mechanism of formation of the nanorod couples.

Energetic Considerations for Interactions between Two Nanorods

Three types of interactions were considered to drive this initial pairing, including dispersion interactions between the crystal-crystal (C-C) and the ligand-ligand (L-L), as well as the dipole-dipole interactions between two rods (D-D).

The rod-rod dispersion interactions were calculated numerically. The crystalline core is treated as a cylindrical rod with the appropriate length and diameter (90×2.8 nm), and is coated by a ~2 nm thick oleylamine shell. We use the expression:

$$W_{vdw}(r) = -\frac{A}{\pi^2} \int_{V_1} \int_{V_2} \frac{1}{r^6} d\vec{r}_1 \vec{r}_2 \quad (1)$$

where A is the appropriate Hamaker constant for the interaction being considered. The Hamaker value used for ZnSe is 1 $eV^3$. For oleylamine, we used 0.34 eV.

Using this methodology and the values quoted above, the energetic contributions for the crystal-crystal (C-C) and ligand-ligand (L-L) dispersion interactions were found to be 0.050 eV and 0.53 eV, respectively, or around 1.1 $k_BT$/11.2 $k_BT$ (@ 280° C.).

Figure 18G:
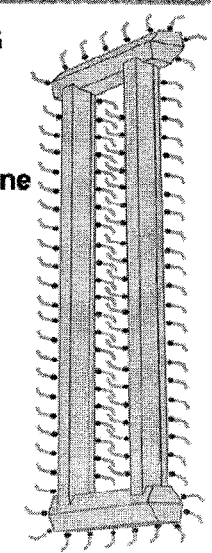

Regarding the D-D interaction, fairly large dipole moments are intrinsic to the wurtzite crystallographic lattices of CdSe and ZnSe due to the lack of inversion symmetry in these nanocrystals. The permanent dipole moment in nanorods has been shown to scale with the volume. We consider uniform distribution of point dipoles inside the nanorod. Dipole-dipole interactions for nanorods oriented antiparallel were calculated by numerically integrating the dipole distribution over the volumes $V_{1,2}$ of both nanorods using:

$$W_{dipole}(r) = -\rho^2 \int_{V_1} \int_{V_2} \frac{-3(\hat{\mu}_1 \cdot \hat{r})(\hat{\mu}_2 \cdot \hat{r}) + \hat{\mu}_1 \cdot \hat{\mu}_2}{4\pi\varepsilon_0 \varepsilon r^3} d\vec{r}_1 \cdot \vec{r}_2 \quad (2)$$

where $\hat{\mu}_{1,2}$ are unit vectors along the c axis of the nanorods, $\hat{r}_{1,2}$ are the positions of the point dipoles inside the nanorods, $\vec{r} = \vec{r}_1 - \vec{r}_2$, $\hat{r} = \vec{r}/r$ and $r = |\vec{r}|$. We use oleylamine[6] (dielectric constant of ~2) as both solvent and capping layer. Assuming a permanent dipole moment similar to that of CdSe ($\rho$=0.55 Debye/$nm^3$)[4,5,7] and a volume of 550 $nm^3$, we calculate a dipole moment of 305 Debye per ZnSe nanorod. Therefore, the energetic gain from pulling together two opposite dipole moments from infinity to $d_s$=2.1 nm (FIGS. 18G, 13E) (the final spacing between the two nanorods surfaces dictated by capping oleylamine ligands) is 0.042 eV, which is comparable to $1k_BT$, the thermal energy at 280° C.

Figure 22A:
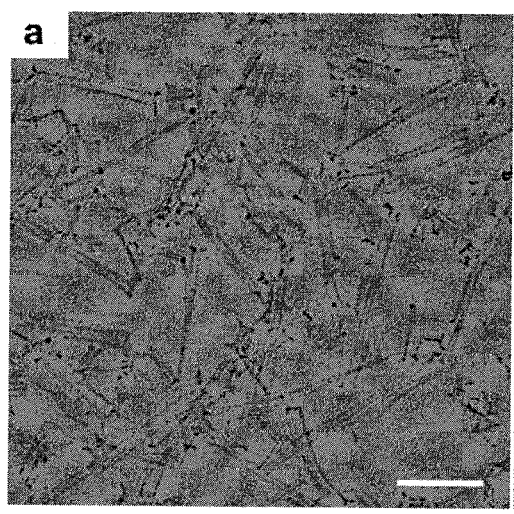
FIGS. 22A-B are ZnSe nanorod couples synthesized using other alkylamines
Figure 22B:
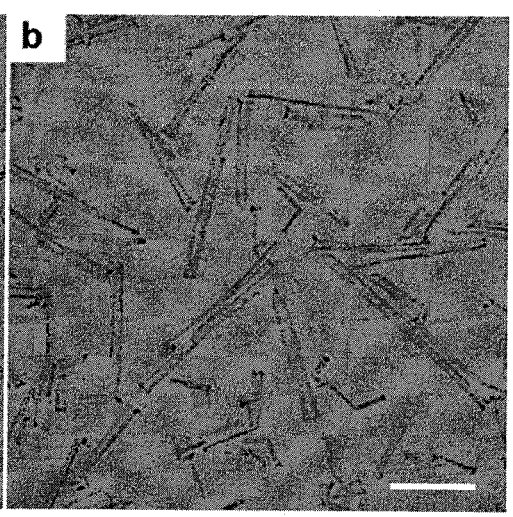

Znse Nanorod Couples Synthesis Using other Alkylamines—Control over Inter-rod Distance We have employed the ZnSe nanorod couples synthetic route with other alkylamines, including ODA and HDA, instead of oleylamine (FIG. 22). Considering ODA is a linear molecule whereas oleylamine has the cis-geometry with a double C=C bond, the length of an ODA molecule is slightly longer than that of an oleylamine molecule. Results show that ZnSe nanorod couples synthesized in ODA have a slightly larger spacing between two long arms compared with those obtained in oleylamine. This clearly demonstrates that the self-limited self-assembly mechanism, which is responsible for the formation of nanorod couples, is not limited to oleylamine only but is applicable to other long chain alkylamines, demonstrating the generality of this synthetic route. Furthermore, the modification of the ligand provides a degree of control over the distance between the two rod arms in the rod-couple structure.

Electronic Structure Calculation

In order to study the electronic structure of the ZnSe nanorod couples, and in particular to compare them to that of nanorods of similar length and diameter, we utilized a finite well effective mass approximation (EMA) approach. Within the EMA, the excited charge carrier confined to the particle is modeled as a particle in a box. Under this approximation, the Schrodinger equation for the electron (hole) envelope wave functions, $\varphi_a$, is defined as $$\left(-\frac{\hbar}{2m_a^*}\nabla^2 + V_a\right)\varphi_a = E_a\varphi_a, \quad a = e/h \quad (3)$$

where $\hbar$ is the reduced Planck constant, $m_a^*$ is the reduced mass and $V_a$ is the potential energy exerted on the charge carrier in the medium. The total exciton energy is approximated by $$E = E_{bg} + E_e E_h \quad (4)$$

where $E_{bg}$ is the bulk's band gap. The potential energy of the charge carriers within the particle is taken as zero. The potential energy outside the particle, which determines the height of the well's wall, was set to $V_{ligands} = [E_{LH}(\text{ligands}) - E_{bg}(\text{ZnSe})]/2$, where $E_{LH}$ (ligands) is the energy difference between the LUMO and HOMO energies of the ligand. For oleylamine, $E_{LH}$ (ligands)=4.430 eV. In our calculations we neglected the Coulomb interaction term which is not easily obtained for elongated systems, and may further shift the exciton's energy.

Due to the relatively complex geometric structure of the nanorod couples, the solution for Schrodinger equation cannot be obtained analytically, and thus the electron and hole wave functions, $\varphi_e$, and $\varphi_h$ respectively, were solved numerically in a finite element numerical approach using the COMSOL software. Only few theoretical calculations and experimental measurements were performed regarding wurtzite ZnSe, and as a result the values of both the band gap for wurtzite ZnSe and for the effective masses of electrons and holes in the literature are quite scattered. The hole states correspond to the heavy hole, which dominates the valence band-edge states in this system.

Comparison between the electronic structure of nanorod couples and single nanorods was obtained for systems of similar dimensions. For both systems, particle length was set to 90 nm and rod diameter (long edge) to 2.8 nm. The short edge diameter was set to 3.7 nm and the spacing between the two rods constructing the rod couples to 2.1 nm. All geometric parameters were set according to the dimensions extracted from TEM images. The particles were embedded in an environment of organic material, with wave functions set to zero at the boundaries. The environment dimensions were increased until the difference in eigenvalues was lower than $10^{-4}$ eV, omitting boundary artifacts on the solution.

The band-edge states for both valence and conduction bands states are predominantly confined to the corners of the rod couples. Higher states are related to the "long edge" of the particles, and are corresponding to the single nanorod states. Due to the proximity of the corners connected by the short edge, the strong overlap between the wave functions confined in these corners results in the formation of "bonding" and "antibonding" short edge states. While both "bonding" and "antibonding" are obtained as the lowest states of the valence band, in the conduction band the "antibonding" state has a much higher energy due to the low effective mass of the electrons.

It should be accentuated that the model described above yields only a first approximation for the accurate energy values. In order to provide a more detailed picture of the electronic structure, including hole state mixing, electronic fine structure, and dipole moment induced effects, a more complex modeling is required, which is beyond the scope of the calculation described above.

TABLE 1

Bulk band gap energy and effective masses for ZnSe

| | ZnSe | Environment |
|---|---|---|
| $m_e^*$ | 0.16 $m_e$ | 1 $m_e$ |
| $m_{hh}^*$ | 0.6 $m_e$ | 1 $m_e$ |
| $E_{bg}$ | 2.837 eV | 4.430 eV |
| $V_e$ | 0 | 0.7965 eV |
| $V_h$ | 0 | 0.7965 eV |

Structural Characterization of ZnCdSe/CdS Nanorod Couples and Nanorods, and their Optical Spectroscopy In order to increase the emission quantum yield of the systems and eliminate surface traps, ZnSe nanorod couples were reacted with Cd and S precursors at a high temperature using a seeded growth approach. TEM images provide evidence that after the reaction the dimensions of both the nanorod couples and nanorods were increased in comparison with their respective original counterparts. The spacing between each two nano-components of the nanorod couples is evident, indicating that the nanorod couple structural features are preserved upon the reaction.

The absorption spectra of the obtained nanorod couples and nanorods show a large red shift compared with the respective original ZnSe particles. This is attributed to a partial cation exchange, forming alloyed structure of ZnCdSe followed by the formation of a thin CdS shell. The nanoparticles have sharp absorption excitonic features, suggesting a relatively narrow size distribution, as was also confirmed by the TEM measurement. The obtained ZnCdSe/CdS nanorod couples and nanorods show sharp emission peaks associated with band gap transitions without significant trap state emissions.

HRTEM Images and XRD of ZnCdSe/CdS Nanorod Couples and Nanorods HRTEM images show that both ZnCdSe/CdS nanorod couples and nanorods preserve the respective distinct structural features upon reaction with Cd and S. The angles of the (002) and (110) peaks in the XRD patterns of the ZnCdSe/CdS nanorod couples and nanorods are slightly shifted to lower angle compared with the angles for CdS, which again indicates that a partial cation exchange process from ZnSe to CdSe takes place during the reaction with Cd and S, accompanied by thin CdS shell growth.

Control of the Nanorod Couples Features

I) Diameter control of the short arms of the nanorod couples: the diameters of the short arms of the rod couples can be tuned by the control of the amount of zinc and selenium precursors and the reaction time for short arm growth at 280° C. Nanorod couples were formed by ZnSe long nanorod purification and re-adding monomer approach. After initial fusing of the two nanorods at 280° C., additional monomers were added into the reaction solution and they grow onto the short arms of the nanorod couples, making the short arms much thicker than the long arms, as evidenced by the TEM images wherein better contrast of the short arms of the nanorod couples is observed.

II) Diameter control of the long arms of the nanorod couples is performed by the purification and re-adding monomer approach, as described in another parallel comparative experiment in the absence of zinc and selenium monomers. Nanorod couples formed by ZnSe long nanorod purification and re-adding monomer approach. ZnSe nanorods with desirable diameter were produced with the control of reaction time at 280° C. in the absence of zinc and selenium monomers. Starting with ZnSe nanorods with large diameters, the purification and re-adding monomer approach produced nanorod couples with large diameter of the long arms.

III) Length control of the long arms of the nanorod couples: This can be tuned by choosing ZnSe nanorod with different lengths, wherein the length control of the ZnSe nanorods is successfully achieved by tuning the reaction time for growth at 230° C. Starting with ZnSe nanorods with different lengths, the purification and re-adding monomer approach can produce ZnSe nanorod couples with controlled lengths.

The invention claimed is:

1. A process for the preparation of zinc chalcogenide nanostructures, the process comprising gradually annealing zinc chalcogenide nanowires at a rate of from 0.1° C./minute to 30° C./minute to transform said zinc chalcogenide nanowires into said zinc chalcogenide nanostructures, wherein said zinc chalcogenide nanostructures being selected from zinc chalcogenide nanorods and quadrilateral zinc chalcogenide nanostructures.

2. The process according to claim 1, wherein said zinc chalcogenide nanowires being prepared by reacting zinc chalcogenide monomers under conditions permitting formation of said nanowires.

3. The process according to claim 1, wherein the zinc chalcogenide nanowires being in the form of a solution of zinc chalcogenide nanowires further comprising zinc chalcogenide monomers.

4. The process according to claim 1, wherein the zinc chalcogenide nanowires being in the form of a solution of zinc chalcogenide nanowires being substantially free of zinc chalcogenide monomers.

5. The process according to claim 4, comprising a step of purifying the zinc chalcogenide nanowire solution to afford a solution free or substantially free of monomers.

6. The process according to claim 4, the process being for the preparation of zinc chalcogenide nanorods, the process comprising gradually annealing the solution comprising zinc chalcogenide nanowires under conditions allowing mass redistribution or mass diffusion to thereby form said zinc chalcogenide nanorods.

7. The process according to claim 6, comprising:
gradually annealing the solution of zinc chalcogenide nanowires in a medium at a minimum rate of 0.1° C./minute, said medium being free or substantially free of zinc chalcogenide monomers;
to thereby transform the nanowires in the medium into said nanorods.

8. The process according to claim 7, the process comprising a step of obtaining a solution of nanowires in a medium and purifying the solution prior to affecting gradual annealing.

9. The process according to claim 7, the process comprising:
obtaining nanowires in a medium,
purifying said medium to render said medium free of zinc chalcogenide monomers or to reduce the concentration of the monomers to below 10% of the original monomers concentration; and
gradually annealing said medium;
to thereby cause transformation of the nanowires in the medium into the nanorods.

10. The process according to claim 7, the process comprising:
obtaining a solution consisting zinc chalcogenide nanowires, and at least one amine compound in a liquid medium; and
gradually annealing said solution under conditions permitting material diffusion/mass redistribution in the nanowire solution;
to thereby cause transformation of the nanowires in the solution into the nanorods.

11. The process according to claim 3, the process comprising:
treating the medium comprising zinc chalcogenide nanowires with an amount of zinc chalcogenide monomers; said monomers being selected from single source monomers containing both zinc and a chalcogen; and a mixture of zinc precursors and chalcogen precursors; and
gradually annealing the medium comprising the nanowires and monomers;
to thereby transform the nanowires in the medium into quadrilateral zinc chalcogenide nanostructures.

12. The process according to claim 11, wherein said quadrilateral zinc chalcogenide nanostructure having a frame-like structure wherein each of the four sides are joined or fused at the corners so as to surround a metal free space.

13. The process according to claim 12, wherein the quadrilateral zinc chalcogenide nanostructure is selected amongst four-sided substantially 2D nanostructures.

14. The process according to claim 13, wherein the quadrilateral zinc chalcogenide nanostructure is selected from a square, a rhombus, a rectangle, a parallelogram, a trapezoid and a kite.

15. The process according to claim 13, wherein the quadrilateral zinc chalcogenide nanostructure is in the form of a rectangle wherein at least two opposite faces being parallel and/or have substantially the same length, width and/or aspect ratio.

* * * * *